(12) United States Patent
Wu et al.

(10) Patent No.: US 12,175,928 B2
(45) Date of Patent: Dec. 24, 2024

(54) DISPLAY DEVICE AND OPERATING METHOD THEREFOR

(71) Applicant: Samsung Electronics Co., Ltd., Suwon-si (KR)

(72) Inventors: Yilin Wu, Suwon-si (KR); Sungyoung Shin, Suwon-si (KR); Minsuk Uhm, Suwon-si (KR); Sungdae Choi, Suwon-si (KR); Seungyeop Choi, Suwon-si (KR); Hyunchang Shin, Suwon-si (KR); Byungduk Yang, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 18/146,686

(22) Filed: Dec. 27, 2022

(65) Prior Publication Data

US 2023/0126522 A1    Apr. 27, 2023

Related U.S. Application Data

(63) Continuation of application No. PCT/KR2021/006175, filed on May 18, 2021.

(30) Foreign Application Priority Data

Jul. 14, 2020  (KR) .......................... 10-2020-0087157
Sep. 8, 2020   (KR) .......................... 10-2020-0114858

(51) Int. Cl.
*G09G 3/3208*   (2016.01)
*H10K 59/35*    (2023.01)
*H10K 59/80*    (2023.01)

(52) U.S. Cl.
CPC ......... *G09G 3/3208* (2013.01); *H10K 59/352* (2023.02); *H10K 59/873* (2023.02);
(Continued)

(58) Field of Classification Search
None
See application file for complete search history.

(56) References Cited

U.S. PATENT DOCUMENTS 8,093,603 B2    1/2012   Jung et al.
8,368,727 B2 *  2/2013   Smith ...................... G09G 3/20
                                                          349/112
(Continued)

FOREIGN PATENT DOCUMENTS

CN          110137237 A      8/2019
KR      10-2015-0074826 A    7/2015
(Continued)

OTHER PUBLICATIONS

Extended European Search Report dated Jan. 24, 2024; European Appln. No. 21842298.8-1211 / 4156161 PCT/KR2021006175.
(Continued)

*Primary Examiner* — Brian M Butcher
(74) *Attorney, Agent, or Firm* — Jefferson IP Law, LLP

(57) ABSTRACT

A display device including a display that includes a plurality of pixels, wherein the plurality of pixels respectively include a plurality of sub-pixels is provided. The plurality of sub-pixels include first type sub-pixels observed at a first viewing angle, and second type sub-pixels observed at a second viewing angle that is narrower than the first viewing angle.

16 Claims, 41 Drawing Sheets

(52) U.S. Cl.
CPC . *H10K 59/8792* (2023.02); *G09G 2300/0452* (2013.01); *G09G 2320/0233* (2013.01); *G09G 2320/045* (2013.01); *G09G 2320/0613* (2013.01); *G09G 2320/0626* (2013.01); *G09G 2320/0666* (2013.01); *G09G 2320/068* (2013.01); *G09G 2358/00* (2013.01)

(56) References Cited

U.S. PATENT DOCUMENTS

| | | | |
|---|---|---|---|
| 9,859,528 | B2 | 1/2018 | Noda et al. |
| 10,192,475 | B2 | 1/2019 | Ju et al. |
| 10,388,913 | B2 | 8/2019 | Jung et al. |
| 10,553,812 | B2 | 2/2020 | Liang et al. |
| 10,616,564 | B2 | 4/2020 | Koerber et al. |
| 10,651,428 | B2 | 5/2020 | Jung et al. |
| 10,670,921 | B2 | 6/2020 | Yanai |
| 10,804,340 | B2 | 10/2020 | Lee et al. |
| 10,937,361 | B2 | 3/2021 | Hughes et al. |
| 10,983,256 | B2 | 4/2021 | Huang et al. |
| 11,011,724 | B2 | 5/2021 | Lim et al. |
| 11,113,997 | B2 | 9/2021 | Kim et al. |
| 11,183,553 | B2 | 11/2021 | Woo et al. |
| 11,341,903 | B2 | 5/2022 | Hughes et al. |
| 11,758,761 | B2 | 9/2023 | Jung et al. |
| 2010/0148192 | A1 | 6/2010 | Jung et al. |
| 2014/0346485 | A1 | 11/2014 | Noda et al. |
| 2015/0138059 | A1 | 5/2015 | Large et al. |
| 2015/0371573 | A1 | 12/2015 | Choi et al. |
| 2016/0379394 | A1 | 12/2016 | Kim et al. |
| 2017/0316736 | A1 | 11/2017 | Hughes et al. |
| 2018/0122292 | A1 | 5/2018 | Ju et al. |
| 2018/0359461 | A1 | 12/2018 | Koerber et al. |
| 2019/0074472 | A1 | 3/2019 | Liang et al. |
| 2019/0094626 | A1 | 3/2019 | Yanai |
| 2019/0214440 | A1 | 7/2019 | Lee et al. |
| 2019/0245026 | A1 | 8/2019 | Woo et al. |
| 2020/0006694 | A1* | 1/2020 | Lim .............. H10K 59/124 |
| 2020/0049864 | A1 | 2/2020 | Huang et al. |
| 2020/0161585 | A1* | 5/2020 | Palles-Dimmock ........... H10K 85/1135 |
| 2021/0110764 | A1 | 4/2021 | Hughes et al. |
| 2021/0208313 | A1 | 7/2021 | Huang et al. |
| 2021/0234134 | A1 | 7/2021 | Qi et al. |

FOREIGN PATENT DOCUMENTS

| | | |
|---|---|---|
| KR | 10-2016-0035685 A | 4/2016 |
| KR | 10-2018-0135342 A | 12/2018 |
| KR | 10-2019-0062678 A | 6/2019 |
| KR | 10-2019-0096470 A | 8/2019 |
| KR | 10-2020-0001694 A | 1/2020 |
| WO | 2017/208617 A1 | 12/2017 |

OTHER PUBLICATIONS

Indian Office Action dated Mar. 23, 2024; Indian Appln. No. 202317005962.

Korean Office Action with English translation dated Aug. 20, 2024; Korean Appln. No. 10-2020-0114858.

* cited by examiner

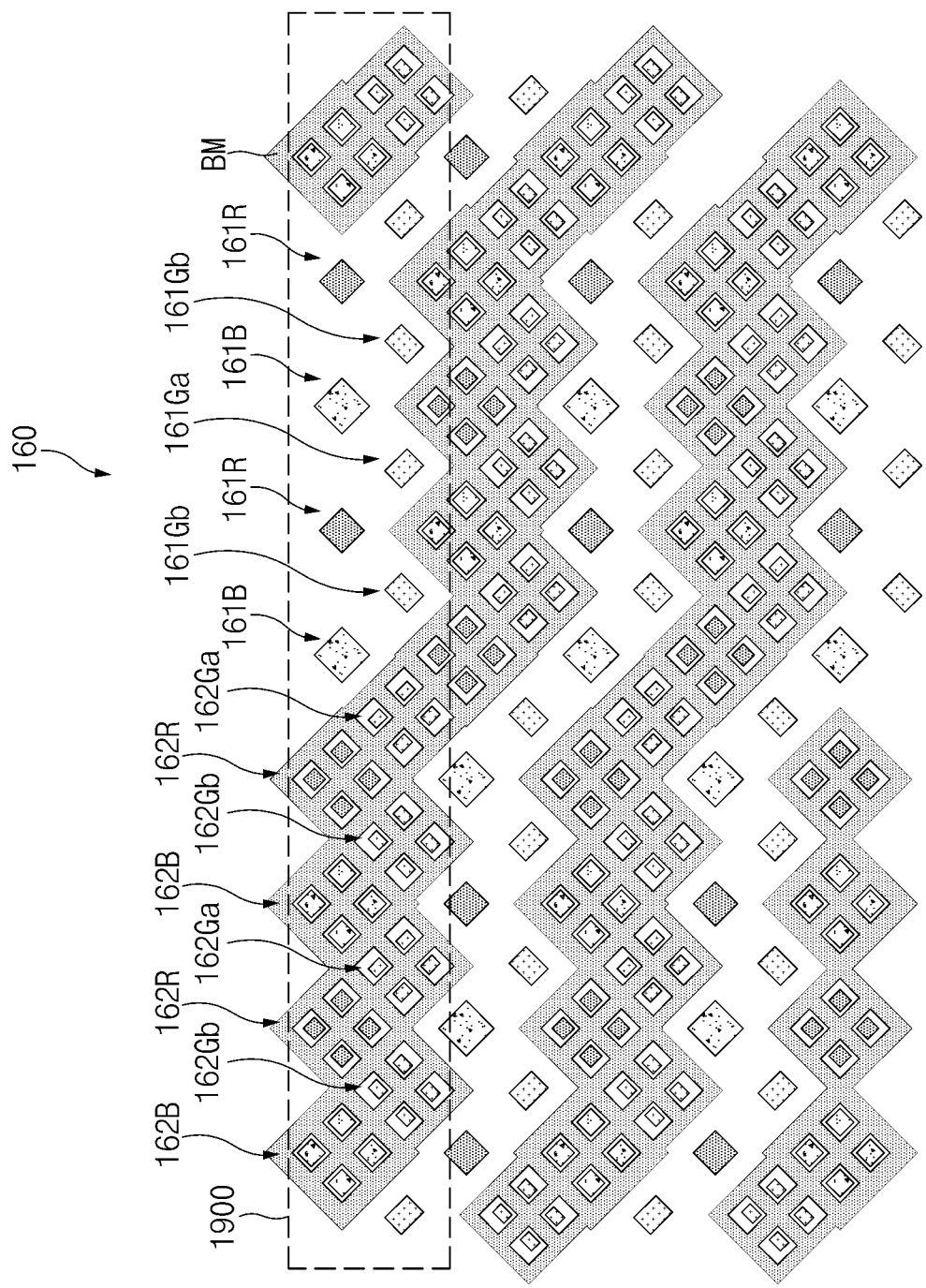

DISPLAY DEVICE AND OPERATING METHOD THEREFOR

CROSS-REFERENCE TO RELATED APPLICATION(S)

This application is a continuation application, claiming priority under § 365 (c), of an International application No. PCT/KR2021/006175, filed on May 18, 2021, which is based on and claims the benefit of a Korean patent application number 10-2020-0087157, filed on Jul. 14, 2020, in the Korean Intellectual Property Office, and of a Korean patent application number 10-2020-0114858, filed on Sep. 8, 2020, in the Korean Intellectual Property Office, the disclosure of each of which is incorporated by reference herein in its entirety.

BACKGROUND

1. Field

The disclosure relates to a display device and an operation thereof.

2. Description of Related Art

A portable electronic device may be used in various environments. For example, a user of a portable electronic device may use the electronic device in various public sites, such as department stores, buses, or subways. When an electronic device is used at the above-described public sites, for example, at sites, such as subways, at which the user is close to other persons, a screen of the electronic device of the user may be identified by a third person regardless of an intention of the user.

The above information is presented as background information only to assist with an understanding of the disclosure. No determination has been made, and no assertion is made, as to whether any of the above might be applicable as prior art with regard to the disclosure.

SUMMARY

As described above, an in-use environment of a conventional electronic device has a danger of exposing user information which a user does not open to a third person. To prevent this, a method for attaching a polarizer film on a front surface of a display of an electronic device has been suggested, but separate costs for attaching the polarizer film are necessary, and in an electronic device of a specific type, for example, in a foldable electronic device, a folding operation may become problematic when the polarizer film is attached.

Aspects of the disclosure are to address at least the above-mentioned problems and/or disadvantages and to provide at least the advantages described below. Accordingly, an aspect of the disclosure is to provide a display device that may provide various display driving schemes based on a display pixel structure, by which an observation viewing angle of a screen may be adjusted, and a method for operating the same.

Additional aspects will be set forth in part in the description which follows and, in part, will be apparent from the description, or may be learned by practice of the presented embodiments.

In accordance with an aspect of the disclosure, a display device including an organic light emitting display (OLED) panel is provided. The display device includes a pixel layer, in which OLED pixels corresponding to a plurality of pixels are disposed, and an encapsulation layer that encapsulates the pixel layer with no air gap, wherein the plurality of pixels including sub pixels of three colors of red (R), green (G), and blue (B), wherein the pixel layer includes a first pixel group and a second pixel group having a viewing angle that is smaller than a viewing angle of the first pixel group, a shield member disposed on at least one surface of the encapsulation layer may form a plurality of openings, wherein at least one sub pixel included in the second pixel group is divided by at least two openings, wherein the pixels of the first pixel group and the second pixel group may be driven in a general mode, and wherein the pixels of the second pixel group may be driven in a narrow viewing angle mode whereby a screen is displayed at a narrow viewing angle that is narrower than that in the general mode.

In accordance with another aspect of the disclosure, a display device is provided. The display device includes a display including a plurality of pixels, wherein each of the plurality of pixels includes a plurality of sub pixels, and wherein the plurality of sub pixels includes first type sub pixels observable at a first viewing angle, and second type sub pixels observable at a second viewing angle that is narrower than the first viewing angle.

In accordance with another aspect of the disclosure, a method for driving a display device including an organic light emitting display (OLED) is provided. The method includes an operation of identifying a turn-on state of a display, an operation of identifying a kind of an application that is to be executed when a turn-on of the display is requested, and an operation of simultaneously turning on a first type sub pixel that irradiates light at a first viewing angle to the display when a kind of an application is of a first kind and a second type sub pixel that irradiates light at a second viewing angle that is smaller than the first viewing angle to output a screen on the display.

According to various embodiments of the disclosure, exposure of information of display device may be controlled according to an intention of a user or setting.

Furthermore, according to an embodiment of the disclosure, distortion of a screen may be restrained by making physical characteristics of a pixel structure of a display uniform while the display is operated in a general mode and a narrow viewing angle mode.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which:

FIGS. 19A, 19B, 19C, 19D, 19E, 19F, 19G, 19H, 19I, 19J, 19K, 19L, and 19M exemplify pen tile structures according to various dispositions of a first type sub pixel and a second type sub pixel according to various embodiments of the disclosure;

Throughout the drawings, it should be noted that like reference numbers are used to depict the same or similar elements, features, and structures.

DETAILED DESCRIPTION

The following description with reference to the accompanying drawings is provided to assist in a comprehensive understanding of various embodiments of the disclosure as defined by the claims and their equivalents. It includes various specific details to assist in that understanding, but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but are merely used by the inventor to enable a clear and consistent understanding of the disclosure. Accordingly, it should be apparent to those skilled in the art that the following description of various embodiments of the disclosure is provided for illustration purposes only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
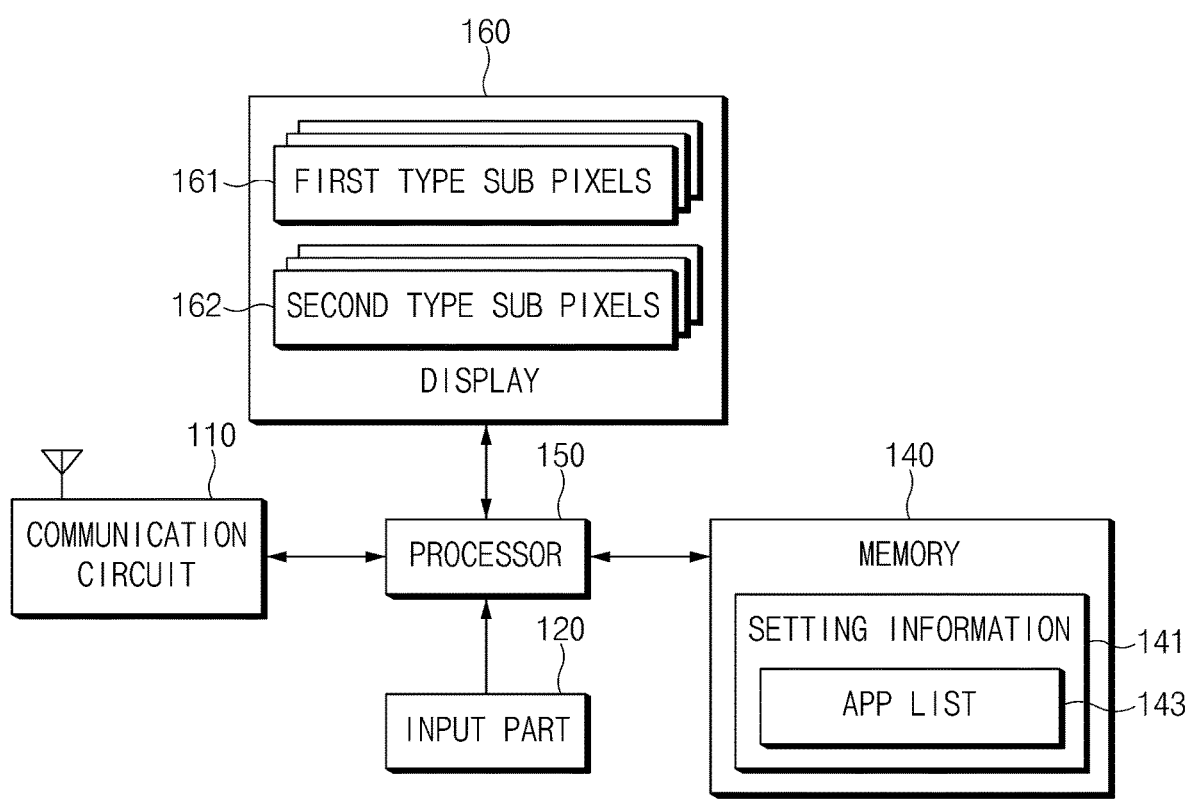
FIG. 1 is a view illustrating an example of a configuration of an electronic device according to an embodiment of the disclosure.

FIG. 1 is a view illustrating an example of a configuration of an electronic device according to an embodiment of the disclosure.

Referring to FIG. 1, an electronic device 100 (or a display device) may include a communication circuit 110, an input part 120, a memory 140, a display 160 (or a display panel), and a processor 150. In the following description, the display 160 may include a plurality of pixels, and each of the plurality of pixels may include Red, Green, Blue (RGB) or RGGB sub pixels. The plurality of pixels may be used to provide various display driving schemes (e.g., a scheme of selectively driving at least one of a first type sub pixel having light irradiation characteristics of a first viewing angle and a second type sub pixel having light irradiation characteristics of a second viewing angle). For example, the plurality of pixels may support a general mode operation of configuring a screen while operating the first type sub pixel and the second type sub pixel together, and a private mode (or narrow viewing angle) operation of configuring a screen by using only the second type sub pixel. The second type sub pixel may include micro pixels (e.g., micro pixels of the same color) that are driven by one electrode. The sub pixel, as mentioned above, may mean a light emitting means or a light emitting member that irradiates color, such as R, G, and B, and at least some of the light emitting means and the light emitting member may include a sub pixel structure having a plurality of configurations (e.g., configurations at least including an anode electrode, a cathode electrode, an organic light emitting layer, and a semiconductor layer). Accordingly, a meaning of the sub pixel may at least include a meaning of a sub pixel structure.

The communication circuit 110 may support communication functions of the electronic device 100. For example, the communication circuit 110 may support at least one of long-distance communication based on a base station of the electronic device 100 or short-distance communication. In this regard, the communication circuit 110 may include a plurality of communication modules (or circuitries) (e.g., a mobile communication module that uses a mobile communication network, such as third-generation (3G), fourth-generation (4G), and fifth-generation (5G) networks, and a short-distance communication module that supports a short-distance communication channel, such as Bluetooth or Wi-Fi). According to an embodiment, the communication circuit 110 may form a communication channel with a server according to a control of the processor 150, and may receive a webpage or information provided by a server. A driving scheme (e.g., a private mode or a general mode) of the display 160 according to a kind (e.g., a short-distance communication channel or a long-distance communication channel) of a communication channel formed based on the communication circuit 110. Furthermore, a scheme of driving the display 160 may be changed according to a kind of a server accessed through the communication circuit 110 or a kind of the information received through the communication circuit 110.

The input part 120 may support input functions of the electronic device 100. For example, the input part 120 may include at least one of at least one physical buttons, an electronic pen, a microphone that receives a voice input by a user, a touch means, or a sensor. When the display 160 includes a touch input function, the display 160 may be included in a configuration of the input part 120. The input part 120 may generate a set input signal related to the scheme of driving the display 160 according to a control of the user, and may deliver the signal to the processor 150. Furthermore, the input part 120 may generate an input signal that requests execution of at least one application installed in the electronic device 100 according to a control of the user, and may deliver the signal to the processor 150.

The memory 140 may store at least one of data, a program, or an application related to an operation of the electronic device 100. The memory 140 may store set information 141 related to the scheme of driving the display 160. The set information 141, may include information for selecting the scheme of driving the display 160 according to an operation environment (e.g., a kind of an application that is being executed or an operation state of the communication circuit 110) of the electronic device 100. The set information 141 may include an app list 143. The app list 143 may include at least one application and information for determining the scheme of driving the display 160 when the at least one application is executed. The scheme of driving the display may include a first driving scheme or a second driving scheme. The first driving scheme may include a scheme of turning on all of the first type sub pixels 161 (or a first pixel group or a first type pixel set) of the display 160 and second type sub pixels 162 (or a second pixel group or a second type pixel set) for driving. The second driving scheme may include a scheme of turning off the first type sub pixels 161 and turning on the second type sub pixels 162 for driving.

The display 160 may include at least one screen related to an operation of the electronic device 100. The display 160 may output a screen that displays the set information 141 related to the driving scheme or a screen related to change of the set information 141. For example, the display 160 may output an app list 143 display screen, a driving scheme display screen according to the app list 143, an app addition or deletion screen, or a driving scheme change screen according to an app. When the display 160 is operated according to the first driving scheme, a screen output through the display 160 may be observed within a first viewing angle. When the display 160 is operated according to the second driving scheme, a screen output through the display 160 may be observed within a second viewing angle that is smaller than the first viewing angle. In this regard, the display 160 may include the first type sub pixels 161 and the second type sub pixels 162. The first type sub pixels 161 may irradiate the light such that the screen may be observed at the first viewing angle. The second type sub pixels 162 may irradiate the light such that the screen may be observed at the second viewing angle that is smaller than the first viewing angle.

The processor 150 may perform delivery and signal processing of data related to an operation of the electronic device 100. The processor 150 may determine a scheme of driving the display 160 according to a kind of a communication channel formed through the communication circuit 110. For example, the processor 150 may drive the display 160 according to a first driving scheme when the display 160 is driven as a base station-based communication channel is formed, and may drive the display 160 according to a second driving scheme when the display 160 is driven as a short-range communication channel is formed.

The processor 150 may determine a scheme of driving the display 160 according to a kind of a sever accessed through the communication circuit 110. For example, the processor 150 may drive the display 160 according to the first driving scheme when the accessed server is a portal site, and may drive the display 160 according to the second driving scheme when the accessed server is a finance or stock site.

The processor 150 may determine a scheme of driving the display 160 according to a kind of information received through the communication circuit 110. For example, the processor 150 may drive the display 160 according to the first driving scheme when the information received through the communication circuit 110 is a general message or information, and may drive the display 160 according to the second driving scheme when the information received through the communication circuit 110 is security information (or an information transmission/reception channel through the communication circuit 110 is a security channel).

The processor 150 may determine the scheme of driving the display 160 according to a kind of an application that is being executed. For example, the processor 150 may drive the display 160 according to the first driving scheme when output of a screen according to execution of a web application is requested, and may drive the display 160 according to the second driving scheme when output of a screen according to execution of a gallery, mail, or messenger application.

The processor 150 may change the scheme of driving the display 160 according to a user input or a change in setting. For example, when a user input for changing the scheme of driving the display 160 is received from the input part 120, the display 160 having an input function, or a microphone, the scheme of driving the display 160 may be changed according to the corresponding input.

The processor 150 may change the scheme of driving the display 160 according to information of a sensor. In this regard, the electronic device 100 may further include a sensor (e.g., an illumination sensor). For example, the processor 150 may drive the display 160 according to the first driving scheme when an external intensity of light is a specific value or more (e.g., in the case of an exterior environment), and may drive the display 160 according to the second driving scheme when the external intensity of light is less than the specific value (e.g., in the case of an interior environment). As another example, the sensor may include at least one of a fingerprint sensor, an iris sensor, a gesture sensor, a gyro sensor, an atmosphere sensor, a magnetic sensor, an acceleration sensor, a grip sensor, a proximity sensor, a color sensor, an infrared (IR) sensor, a biometric sensor, a temperature sensor, or a humidity sensor, and the processor 150 may drive the display 160 in the first driving scheme or the second driving scheme based on the sensor information collected by the sensor.

In an operation in the second driving scheme (e.g., a narrow viewing angle mode), the processor 150 may perform a control to turn off the first type sub pixels 161 or display a color of a specific gradation value (e.g., a black color of a gradation value of a specific value or less (e.g., 10 or less). The processor 150 may adjust at least one of the values or the colors of the specific gradation values of the first type sub pixels 161 as the brightness of the display 160 is adjusted. For example, when an event related to adjustment of the brightness occurs according to a user input or according to an operation of a specific application, the processor 150 may adjust at least one of the values or colors of the specific gradation values of the first type sub pixels 161 according to the event. When the processor 150 is operated in the second driving scheme (e.g., the narrow viewing angle mode), shadow rates of the first type sub pixels 161 may be operated to be lower than the shadow rates of the first type sub pixels 161 in a general mode.

Figure 2A:
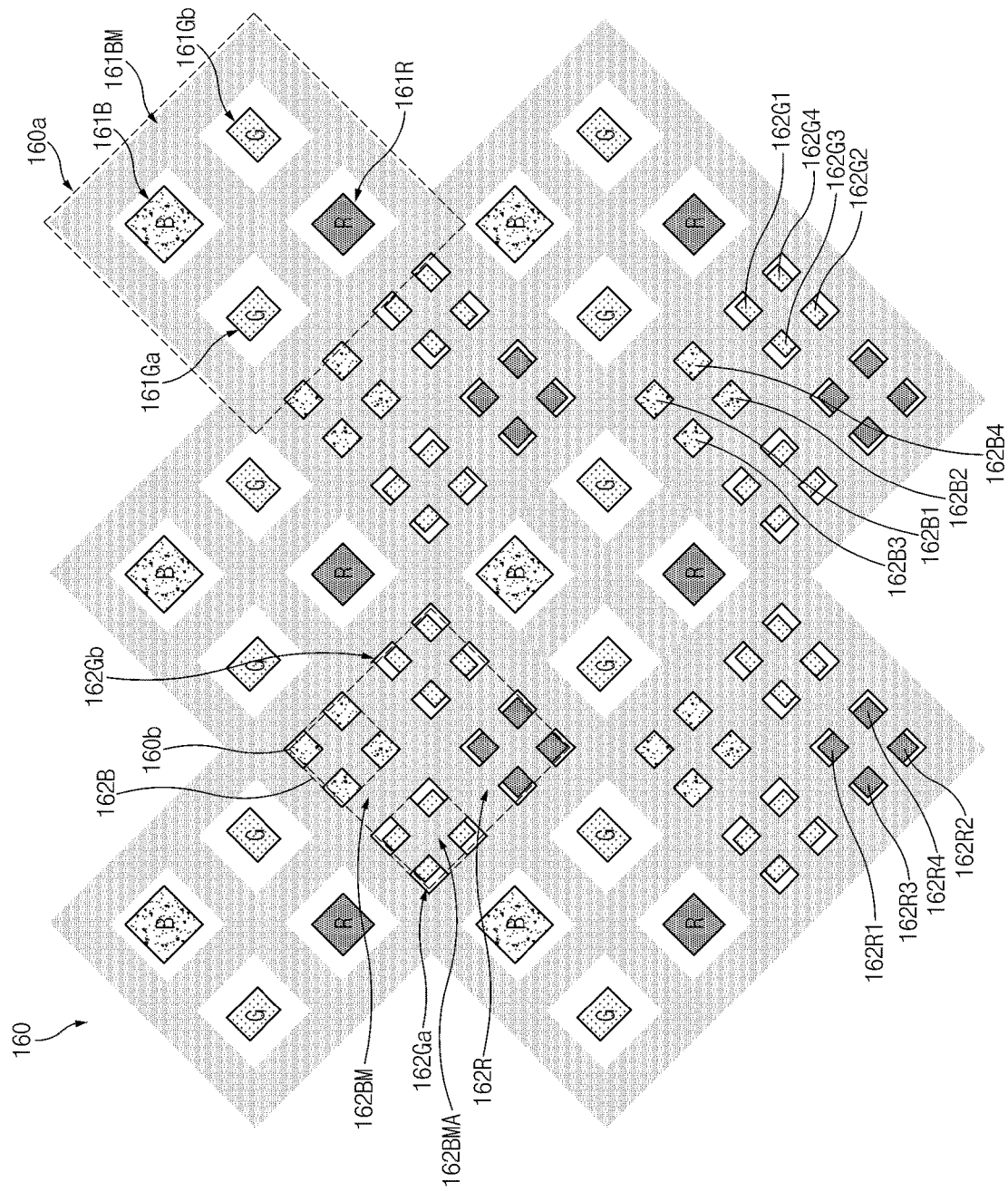
FIG. 2A is a view illustrating an example of some pixel structures of a display device according to an embodiment of the disclosure.

FIG. 2A is a view illustrating an example of some pixel structures of the display device according to an embodiment of the disclosure.

Figure 2B:
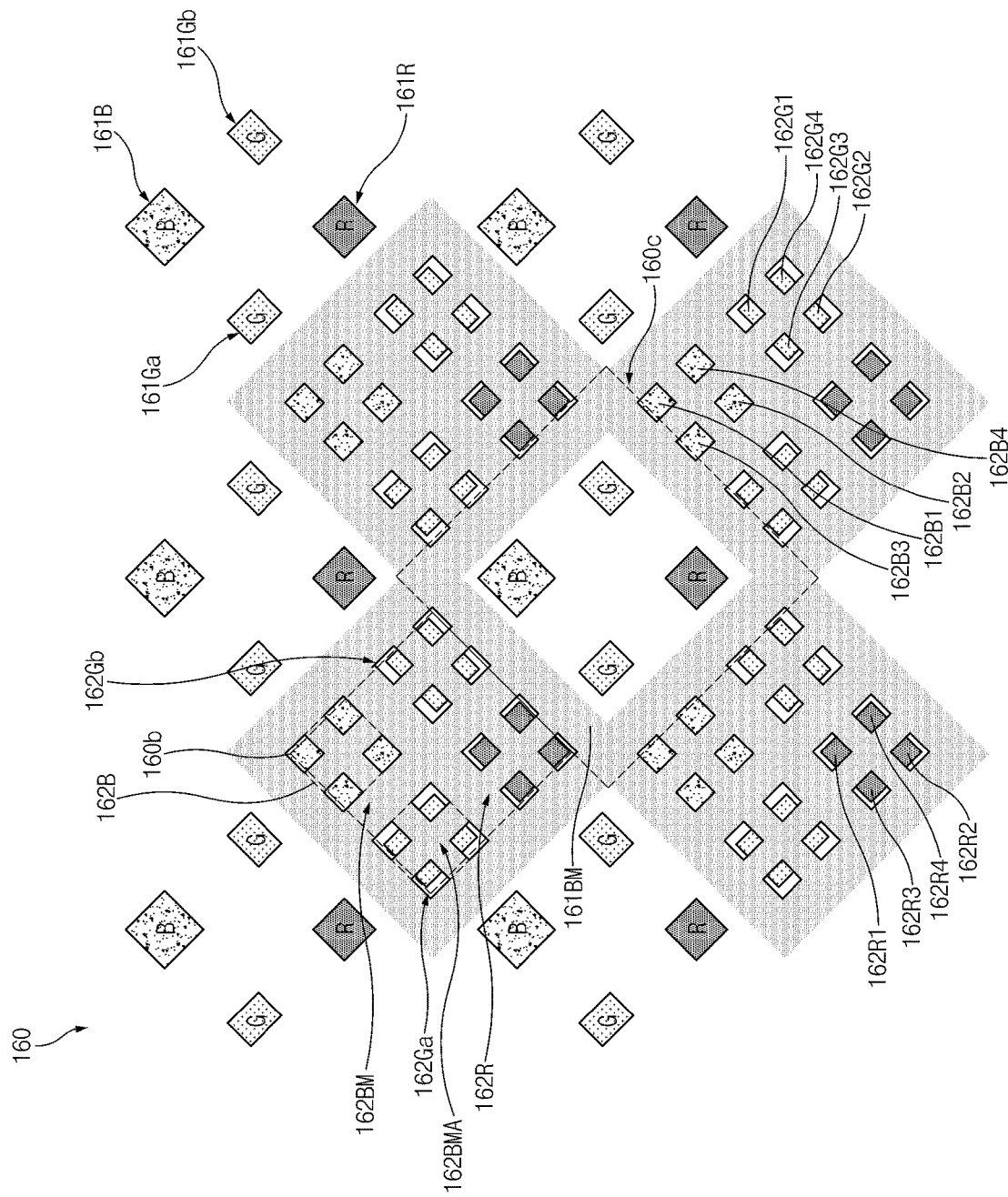
FIG. 2B is a view illustrating another example of some pixel structures of a display device according to an embodiment of the disclosure.

FIG. 2B is a view illustrating another example of some pixel structures of the display device according to an embodiment of the disclosure.

Referring to FIGS. 2A and 2B, in the display 160, the first type sub pixels 161 and the second type sub pixels 162 may be disposed alternately. In the embodiment illustrated in FIGS. 2A and 2B, the first type sub pixels 161 and the second type sub pixels 162 are alternately disposed, but the disclosure is not limited thereto. For example, a disposition ratio of the first type sub pixels 161 and the second type sub pixels 162 may be changed. For example, a structure for disposing pixels of the display 160 may include a structure, in which one first type sub pixel 161 is disposed while two second type sub pixels 162 are disposed or vice versa.

The display 160 may include first type pixels 160a and second type pixels 160b. Each of the first type pixels 160a may include first type sub pixels 161R, 161B, 161Ga, and 161Gb, at least two of which have different sizes. For example, a light emitting area of a first type blue sub pixel 161B may be larger a light emitting area of a first type red sub pixel 161R, and a light emitting area of the first type red sub pixel 161R may be larger than a light emitting area of first type green sub pixels 161Ga and 161Gb. According to an embodiment of the disclosure, the first type green sub pixels 161Ga and 161Gb may have the same size.

Referring to FIG. 2A, first shield members 161BM (e.g., a black matrix (BM)) may be disposed between a periphery of the first type pixel 160a and the first type sub pixels 161R, 161B, 161Ga, and 161Gb. The first shield members 161BM may have a specific thickness and a specific width, and may be disposed on the first type sub pixels 161R, 161B, 161Ga, and 161Gb. With respect to a direction that is perpendicular to a front surface of the display 160, the first shield member 161BM may be disposed at a location that is spaced apart from peripheries of the first type sub pixels 161R, 161B, 161Ga, and 161Gb. An opening formed by the shield members 161BM, 162BM, 162BMA of the first type pixel 160a and the second type pixel 160b may be filled with color filters for colors. In a pixel structure of the openings formed by the shield members of the first type sub pixels and the second type sub pixels (or micro pixels) and filled with the color filters, no polarizing plate (polarizing film) is present between an encapsulation layer (e.g., a TFE) and a window (e.g., a light transmission protecting layer) of the display 160 and the shield member may function to prevent visual recognition of areas, except for pixels, due to the exterior light.

Referring to FIG. 2B, the modified first type pixel 160c may include a first shield member 161BM that is disposed at a periphery of the pixel. The modified first type pixel 160c may include a structure, in which not separate shield member is disposed at a periphery of the pixel. Accordingly, in the modified first type pixel 160c, no first shield member 161BM may be disposed between the first type sub pixels 161R, 161B, 161Ga, and 161Gb. The modified first type pixel 160c may have a structure in which the second shield members 162BM disposed in relation to the second type pixel 16-b are disposed to surround a periphery of the pixel while being surrounded by the second type pixel 16-b. Accordingly, the first shield member 161BM of the modified first type pixel 160c may be substantially at least a portion of the second shield member 162BM of the second type pixel 160b or may be the same configuration as the second shield member.

Each of the second type pixels 160b may include first type sub pixels 162R, 162B, 162Ga, and 162Gb, at least two of which have different sizes. Among the second type sub pixels 162R, 162B, 162Ga, and 162Gb, a second type blue sub pixel 162B may include a first blue micro pixel 162B1, a second blue micro pixel 162B2, a third blue micro pixel 162B4, and a fourth blue micro pixel 162B4. The second type red sub pixel 162R may include a first red micro pixel 162R1, a second red micro pixel 162R2, a third red micro pixel 162R3, and a fourth red micro pixel 162R4. The second type green sub pixels 162Ga and 162Gb may include a first green micro pixel 162G1, a second green micro pixel 162G2, a third green micro pixel 162G3, and a fourth green micro pixel 162G4. According to an embodiment of the disclosure, the second type green sub pixels 162Ga and 162Gb may have the same size.

The second shield members 162BM (e.g., black matrices (BMs)) may be disposed between a periphery of the second type pixel 160b and peripheries of the second type sub pixels 162R, 162B, 162Ga, and 162Gb, and the third shield members 162BMA may be disposed to divide areas of the second type sub pixels 162R, 162B, 162Ga, and 162Gb. The second shield members 162BM may have a specific thickness and a specific width, and may be disposed around the second type sub pixels 162R, 162B, 162Ga, and 162Gb. With respect to a direction that is perpendicular to a front surface of the display 160, the second shield member 162BM may be disposed at a location that is spaced apart from peripheries of the second type sub pixels 162R, 162B, 162Ga, and 162Gb. The third shield member 162BMA may have a thickness and a width that are the same as or similar to those of the second shield member 162BM. Furthermore, the third shield member 162BMA may have a width that is smaller than that of the second shield member 162BM. According to an embodiment, the second shield member 162BM may shield the light that is input from an outside. The second shield member 162BM and the third shield member 162BMA may be formed of the same material. The second shield member 162BM and the third shield member 162BMA may be disposed on the same layer or may be integrally implemented.

The sizes of opening areas (e.g., areas opened by the shield members) of the first blue micro pixel 162B1, the red micro pixel 162R1, and the green micro pixel 162G1 may be the same or similar. In this condition, the light emitting area of the first blue micro pixel 162B1 may be larger than the light emitting area of the first red micro pixel 162R1, and the light emitting area of the first red micro pixel 162R1 may be larger than the light emitting area of the green micro pixel 162G1.

FIG. 2A illustrates a display of a pen tile structure, in which fourth sub pixels constitute one pixel, but the disclosure is not limited thereto. A disposition structure of the first type pixel 160a and the second type pixel 160b according to an embodiment of the disclosure also may be applied to the display 160 of a stripe structure. The second type sub pixels 162R, 162B, 162Ga, and 162Gb may include different numbers of micro pixels. For example, each of the second type blue sub pixel 162B and the second type red sub pixel 162R may include four micro pixels, and each of the second type green sub pixels 162Ga and 162Gb may include two micro pixels, but the disclosure is not limited thereto.

Figure 2C:
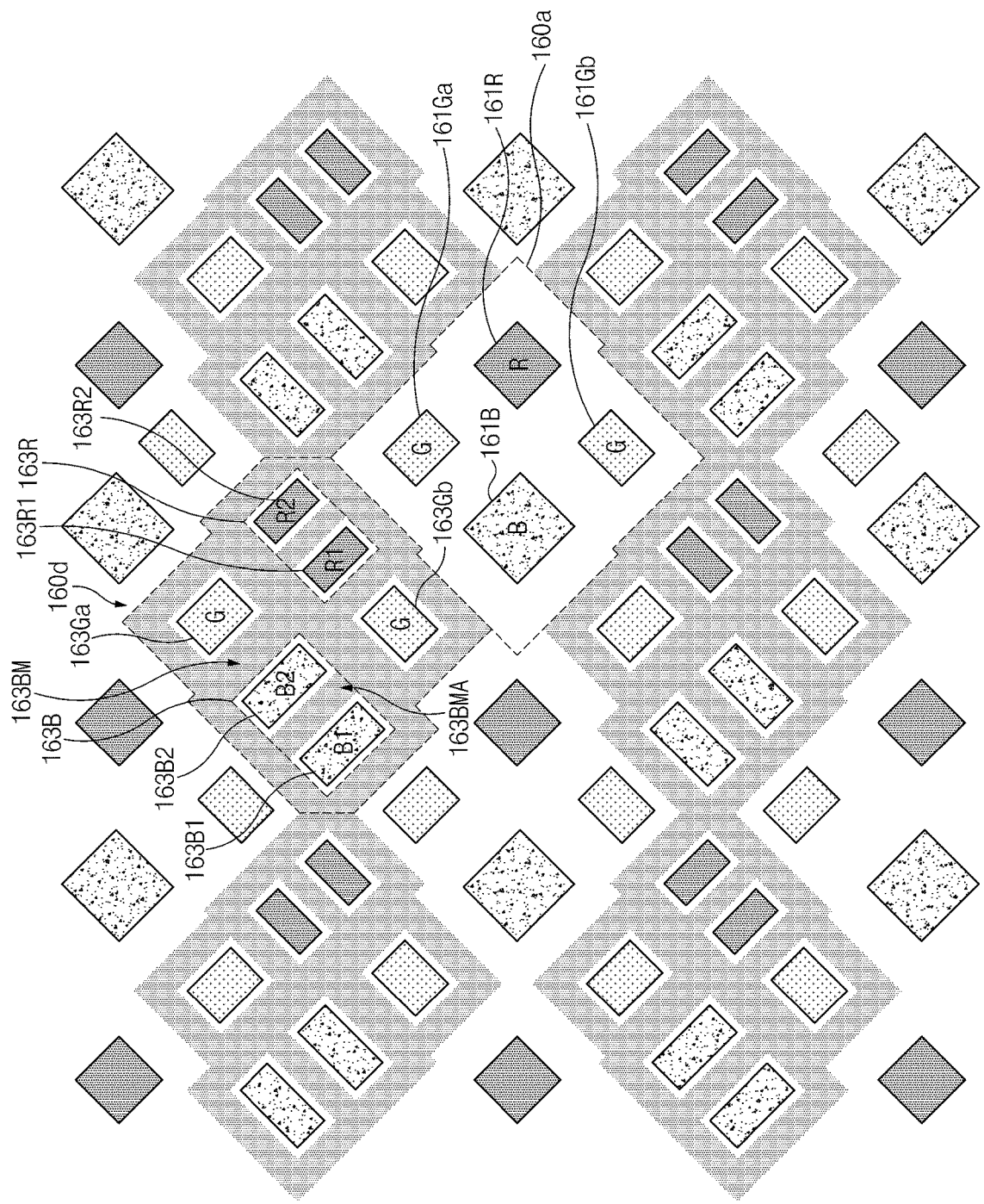
FIG. 2C is a view illustrating another example of some pixel structures of a display device according to an embodiment of the disclosure.

FIG. 2C is a view illustrating another example of some pixel structures of the display device according to an embodiment of the disclosure.

Referring to FIG. 2C, in the display 160, the modified first type pixels 160c and the third type pixels 160d may be alternately disposed. The embodiment illustrated in FIG. 2C shows a structure in which the first type pixels 160c and the third type pixels 160d are alternately disposed, but the disclosure is not limited thereto. For example, a disposition ratio of the first type pixels 160c and the third type pixels 160d may be changed. A structure for disposing pixels of the display 160 according to an embodiment of the disclosure may include a structure in which one first type pixel 160c is disposed while two third type pixels 160d are disposed or vice versa. In the display 160, pixels of the type that has been described above in FIGS. 2A and 2B may be configured together. For example, at least a partial area of the display 160 may include a structure, in which the first type pixels 160c, the second type pixels 160b (or 160c), and the third type pixels 160d are alternately disposed.

Each of the modified first type pixels 160c may include first type sub pixels 161R, 161B, 161Ga, and 161Gb, at least two of which have different sizes. For example, a light emitting area of a first type blue sub pixel 161B may be larger a light emitting area of a first type red sub pixel 161R, and a light emitting area of the first type red sub pixel 161R may be larger than a light emitting area of first type green sub pixels 161Ga and 161Gb. According to an embodiment of the disclosure, the first type green pixels 161Ga and 161Gb may have the same size.

According to an embodiment of the disclosure, a separate shield member may be excluded between a periphery of the modified first type pixels 160c and the first type sub pixels 161R, 161B, 161Ga, and 161Gb. According to another embodiment of the disclosure, a separate shield member may be excluded only between the first type sub pixels 161R, 161B, 161Ga, and 161Gb, and the shield member may be disposed at a periphery of the modified first type pixel 160c. Because one modified first type pixel 160c is disposed to be surrounded by fourth third type pixels 160d, at least two of the shield members disposed in the third type pixel 160d may be disposed at a periphery of the first type pixel 160c.

An opening formed by the shield members 163BM and 163BMA of the third type pixel 160d may be filled with color filters for colors. In a pixel structure of the openings formed by the shield members of the third type sub pixels 163B, 163R, 163Ga, and 163Gb (or intermediate type micro pixels) and filled with the color filters, no polarizing plate (polarizing film) is present between an encapsulation layer (e.g., a TFE) and a window (e.g., a light transmission protecting layer) of the display 160 and the shield member may function to prevent visual recognition of areas, except for pixels, due to the exterior light.

Each of the third type pixels 160d may include third type sub pixels 163R, 163B, 163Ga, and 163Gb, at least some of which have different sizes. The third type green pixels 163Ga and 163Gb may have the same size. The third type blue sub pixel 163B may include a fifth blue micro pixel 163B1 and a sixth blue micro pixel 163B2. A sum of sizes of the fifth blue micro pixel 163B1 and the sixth blue micro pixel 163B2 may be the same as a size of the blue sub pixel 161B of the modified first type pixel 160c or may be larger than that by a specific size. The third type red sub pixel 163R may include a fifth red micro pixel 163R1 and a sixth red micro pixel 163R2. A sum of sizes of a fifth red micro pixel 163R1 and a sixth red micro pixel 163R2 may be the same as a size of the red sub pixel 161R of the first type pixel 160c or may be larger than that by a specific size. The third type pixel 160d may include the green sub pixels 162Ga and 162Gb. The size of the green sub pixels may be the same as that of the green sub pixels included in the modified first type pixel 160c.

The shield members 163BM and 163BMA (e.g., black matrixes (BMs)) may be disposed between a periphery of the third type pixel 160d and peripheries of the third type sub pixels 163R, 163B, 163Ga, and 163Gb. The sizes of the openings (e.g., the openings filled with an insulation material and in an aspect that the light may pass therethrough) formed by the shield members 164BM and 163BMA may be larger than those of the micro pixels 163R1, 163R2, 163B1, and 163B2 and those of the green sub pixels 163Ga and 163Gb. The size of the first red micro pixel 162R1 of the above-described second type pixel 160b may be the same as or larger than a half of the size of the fifth red micro pixel 163R1 described in the third type pixel 160d. Similarly, the size of the first blue micro pixel 162B2 of the second type pixel 160b may be the same as or larger than a half of the size of the fifth blue micro pixel 163B1 described in the third type pixel 160d. As described above, in the display 160 including the third type pixel 160d, because a relatively large micro pixel may be applied as compared with the micro pixel described in FIGS. 2A and 2B, a design thereof may be easy and a lifespan performance of OLEDs may be improved. Furthermore, when the third type pixel 160d is applied to the entire display 160, a relatively excellent high resolution may be applied, and visibility and screen quality (e.g., color deviation) may be improved.

Figure 3A:
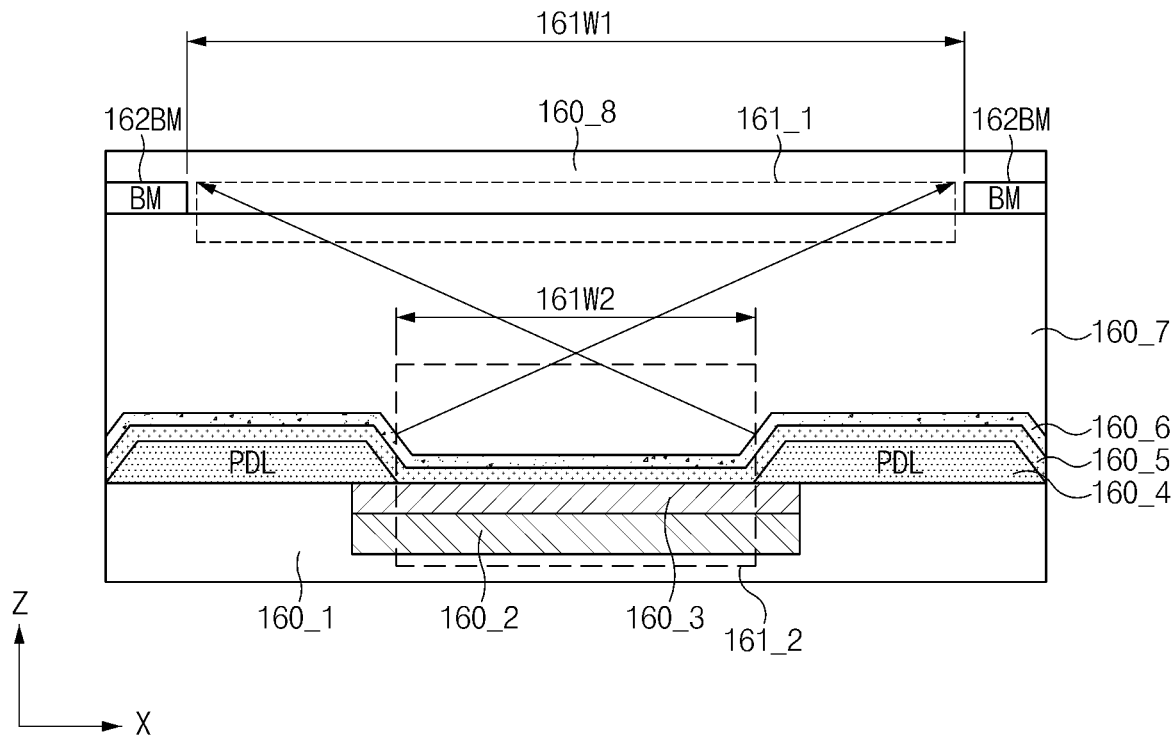
FIG. 3A is a view illustrating an example of a stack structure of sub pixels for types thereof according to an embodiment of the disclosure.
Figure 3A:
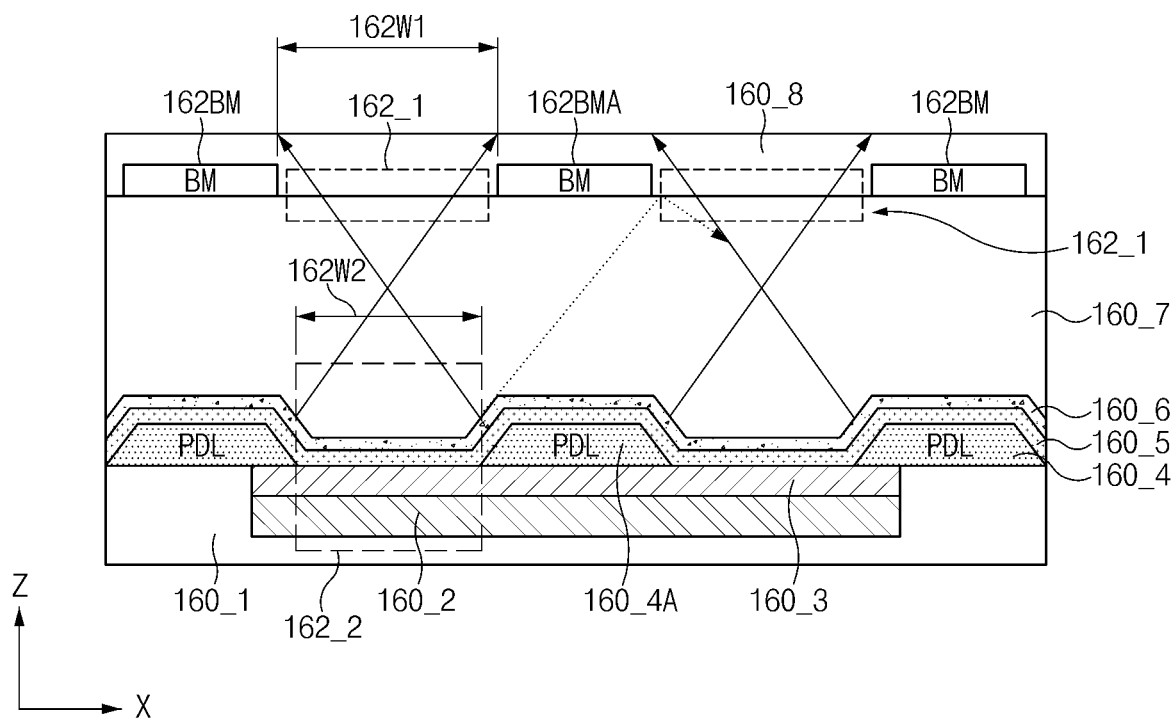

FIG. 3A is a view illustrating an example of a stack structure of sub pixels for types thereof according to an embodiment of the disclosure.

Figure 3B:
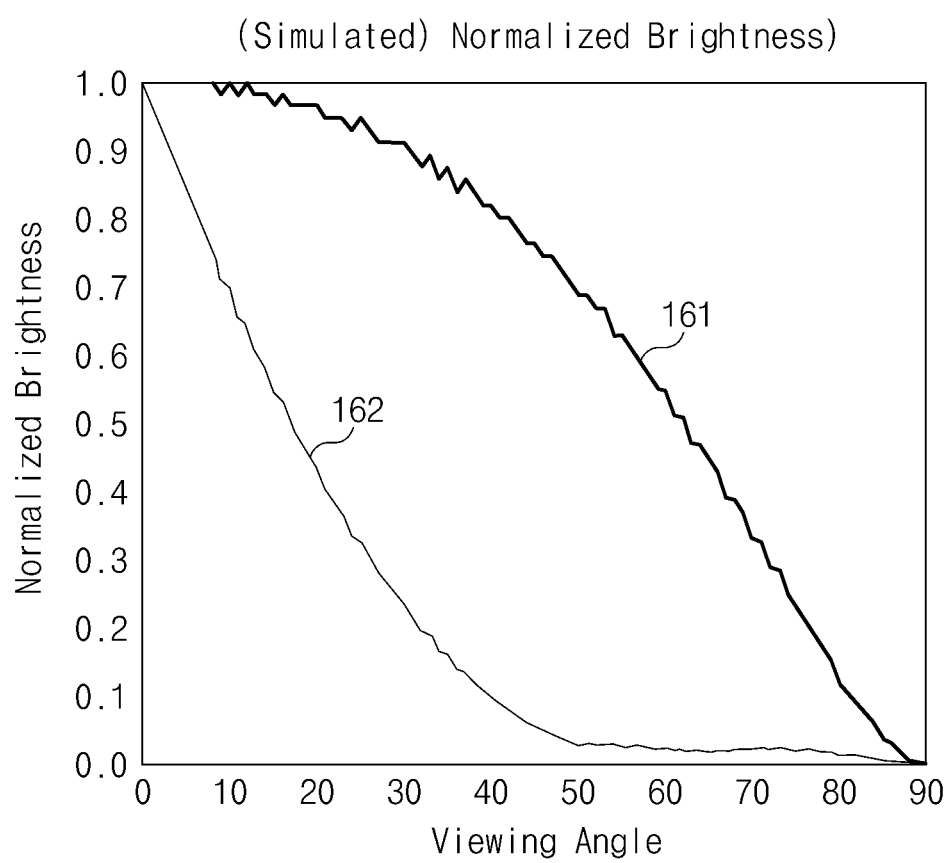
FIG. 3B is a view illustrating luminance characteristics according to angles of a first type sub pixel and a second type sub pixel according to an embodiment of the disclosure.

FIG. 3B is a view illustrating luminance characteristics according to angles of the first type sub pixel and the second type sub pixel according to an embodiment of the disclosure.

Figure 3C:
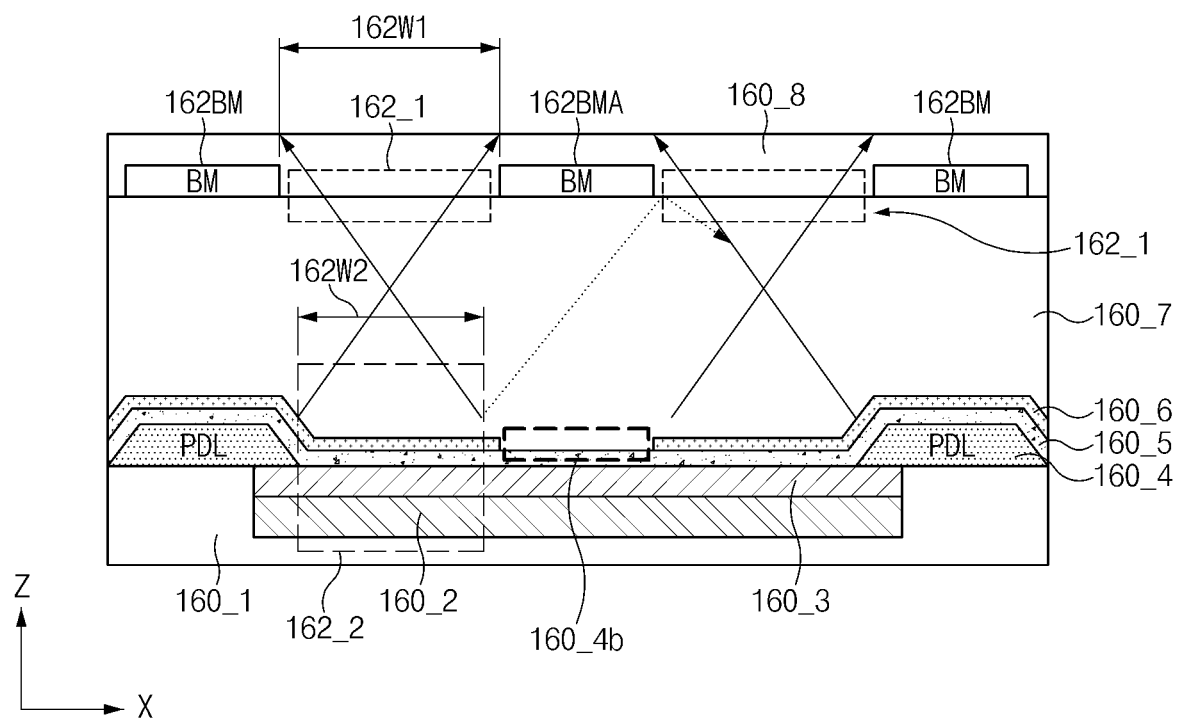
FIG. 3C is a view illustrating another example of a stack structure of a second type sub pixel according to an embodiment of the disclosure.

FIG. 3C is a view illustrating another example of a stack structure of the second type sub pixel according to an embodiment of the disclosure.

Referring to FIGS. 2A and 3A, a first type sub pixel structure 201 (e.g., a pixel structure corresponding to the first type blue sub pixel 161B of FIG. 2A or 2B, the first type red sub pixel 161R, and the first type green sub pixels 161Ga and 161Gb) corresponding to the first type sub pixel 161 may include a substrate part 160_1, a semiconductor layer 160_2, a first electrode 160_3 (e.g., an anode), a pixel definition member 160_4 (e.g., a pixel definition layer (PDL)), an organic light emitting layer 160_5, a second electrode 160_6 (e.g., a cathode), an encapsulation layer 160_7, a light transmission protecting layer 160_8, and a second shield member 162BM. The substrate part 160_1 may be formed of a deflectable material. For example, the substrate part 160_1 may be formed of a material, such as polyimide or acryl, which may be deflected. In various embodiments, the substrate part 160_1 may include at least one of polyethylene terephthalate, polymethyl methacrylate, polyamide, polyimide, polypropylene, or polyurethane. The substrate part 160_1 may include a plurality of layers.

The semiconductor layer 160_2 may be disposed on the substrate part 160_1. The semiconductor layer 160_2 may be based on low temperature polycrystalline silicon (LTPS). The semiconductor layer 160_2 may be deposited under the first electrode 160_3. The first electrode 160_3 may be disposed on the semiconductor layer 160_2, and may form an electric field together with the second electrode 160_6 as the semiconductor layer 160_2 is driven. The pixel definition member 160_4 may be disposed to surround at least a portion of a periphery of the first electrode 160_3. The organic light emitting layer 160_5 may be deposited to cover at least the pixel definition member 160_4 and the first electrode 160_3. The second electrode 160_6 may be deposited on the organic light emitting layer 160_5. The first electrode 160_3 and the second electrode 160_6 may receive electric power to form an electric field according to a control of the semiconductor layer 160_2. In this case, organic materials disposed in the organic light emitting layer 160_5 may irradiate light by emitting light according to an influence of the electric field. The organic light emitting layer 160_5 may be formed to irradiate any one of blue light, red light, and green light.

The encapsulation layer 160_7 may be disposed to cover an upper side of the second electrode 160_6. The encapsulation layer 160_7, for example, may be formed of a thin film encapsulation. As the encapsulation layer 160_7 is disposed, an air gap may be excluded between the light transmission protecting layer 160_8 and the second electrode 160_6. The display 160 may be a flexible display. The encapsulation layer 160_7 may further include a touch panel or a micro light control pattern (MLP) structure (or a material having a specific permittivity and a specific thickness between a panel and a pol, or an organic film or an inorganic film as a light path adjusting film). The encapsulation layer 160_7 may seal the second electrode 160_6 by covering the entire upper surface of the second electrode 160_6. The encapsulation layer 160_7 may prevent introduction of exterior moisture and oxygen by sealing the second electrode 160_6. The encapsulation layer 160_7 may include a plurality of layers, and may include a triple layer, in which an inorganic film, an organic film, and an inorganic film are sequentially located. The light transmission protecting layer 160_8 disposed on the encapsulation layer 160_7 may be formed of flexible polyimide, acryl, or thin tempered glass that may be bent, and may have a permittivity of a specific value or more. The light transmission protecting layer 160_8 may include at least one of polyimide (PI), polyethylene (PET), polyurethane (PU), cellulose triacetate (TAC), or ultra-thin glass (UTG)

The second shield member 162BM may be disposed between the encapsulation layer 160_7 and the light transmission protecting layer 160_8. At least a portion of the second shield member 162BM may be disposed to overlap the pixel definition member 160_4 in a first direction (the z axis direction) (or a direction that faces the front surface of the display 160 while being perpendicular thereto or a direction that faces from an upper surface to a lower surface of the display 160 while being perpendicular thereto) that is perpendicular to the front surface of the display. With respect to the first direction (the z axis direction), the second shield member 162BM may be disposed to cover a portion of a periphery (e.g., a periphery in an outward direction with respect to the first electrode 160_3) of the pixel definition member 160_4. The first type sub pixel structure 201 may include a first opening 161_1 of a first size 161W1 formed by the second shield member 162BM. The first opening 161_1 may be at least a portion of the light transmission protecting layer 160_8. The first opening 161_1 may be filled with a color filter. The first type sub pixel structure 201 may include an area in which the pixel definition member 160_4 is not applied, as a light irradiation area of the light emitting member including the light emitting area 161_2 (e.g., the semiconductor layer 160_2) of a second size 161W2, at least a portion of the first electrode 160_3, at least a portion of the organic light emitting layer 160_5, and at least a portion of the second electrode 160_6. The first opening 161_1 of the first size 161W1 may have a size that is larger than the light emitting area 161_2 of the second size 161W2. Accordingly, the first type sub pixel structure 201 may support a general mode, in which the screen of the display 160 may be watched at the first viewing angle.

A second type sub pixel structure 202 (e.g., a pixel structure corresponding to the second type blue sub pixel 162B of FIG. 2A or 2B, the second type red sub pixel 162R, and the second type green sub pixels 162Ga and 162Gb) corresponding to the second type sub pixel 162 may include a substrate part 160_1, a semiconductor layer 160_2, a first electrode 160_3 (e.g., an anode), a pixel definition member 160_4, an additional pixel definition member 160_4A (e.g., a photosensitive material or photoresist), an organic light emitting layer 160_5, a second electrode 160_6 (e.g., a cathode), an encapsulation layer 160_7, a light transmission protecting layer 160_8, a second shield member 162BM, and a third shield member 162BMA. Second openings 162_1 of a third size 162W1 may be formed between the second shield member 162BM and the third shield member 162BMA. The second opening 162_1 may be at least a portion of the light transmission protecting layer 160_8. The second opening 162_1 may be filled with a color filter.

The substrate part 160_1 may have the same configuration as that of the substrate part 160_1 described above in the first type sub pixel structure 201. Furthermore, the semiconductor layer 160_2 may be disposed on the substrate part 160_1 in a form of a matrix. The first electrode 160_3 may be disposed on the semiconductor layer 160_2. The first electrode 160_3 may be disposed on the semiconductor layer 160_2, and may form an electric field together with the second electrode 160_6 as the semiconductor layer 160_2 is driven. The pixel definition member 160_4 may be disposed to surround at least a portion of a periphery of the first electrode 160_3. The additional pixel definition member 160_4A may be disposed to divide the light emitting areas 162_2 of a fourth size 162W2 of the second type sub pixel structure 202. For example, the additional pixel definition member 160_4A may be disposed to cross a central portion of the first electrode 160_3. The pixel definition member 160_4 and the additional pixel definition member 160_4A may be formed of the same material and through the same process. As the additional pixel definition member 160_4A is disposed in the first electrode 160_3, the additional definition member 160_4A may prevent formation of an electric field between the first electrode 160_3 and the second electrode 160_6. Line widths of the pixel definition member 160_4 and the additional pixel definition member 160_4A may be different. The pixel definition member 160_4 and the additional pixel definition member 160_4A may be formed of different materials.

The organic light emitting layer 160_5 may be deposited to cover at least the pixel definition member 160_4, the additional pixel definition member 160_4A, and the first electrode 160_3. The second electrode 160_6 may be deposited on the organic light emitting layer 160_5. The first electrode 160_3 and the second electrode 160_6 may receive electric power to form an electric field according to a control of the semiconductor layer 160_2. In this case, organic materials disposed in the organic light emitting layer 160_5 may irradiate light by emitting light according to an influence of the electric field. According to an embodiment of the disclosure, light is not emitted in an area of the organic light emitting layer 16-_5, in which the additional pixel definition member 160_4A is disposed. The encapsulation layer 160_7 may be disposed to cover an upper side of the second electrode 160_6. A material of the encapsulation layer 160_7 may be the same as that of the encapsulation layer 160_7 mentioned in the above description of the first type sub pixel structure 201. As the encapsulation layer 160_7 is disposed, an air gap may be excluded between the light transmission protecting layer 160_8 and the second electrode 160_6. The second shield member 162BM and the third shield member 162BMA may be disposed between the encapsulation layer 160_7 and the light transmission protecting layer 160_8. At least a portion of the second shield member 162BM may be disposed to overlap the pixel definition member 160_4 in the first direction (the z axis direction of FIG. 3A) that is perpendicular to the front surface of the display 160.

With respect to the first direction, the second shield member 162BM may be disposed to cover a portion of a periphery (e.g., a periphery in an outward direction with respect to the first electrode 160_3) of the pixel definition member 160_4. The second shield member 162BM may have a configuration that is the same as or similar to that of the second shield member 162BM mentioned above in the first type sub pixel structure 201. The third shield member 162BMA may be disposed between the second shield members 162BM. Furthermore, the third shield member 162BMA may be disposed to overlap at least a portion of the additional pixel definition member 160_4A with respect to the first direction. A width of the pixel definition member disposed in the second type sub pixel structure 202 may be the same as or smaller than that of the pixel definition member disposed in the first type sub pixel structure 201.

With respect to the first direction, the pixel definition member 160_4 and the additional pixel definition member 160_4A in the second type sub pixel structure 202 may have the same width. Line widths of the pixel definition member 160_4 and the additional pixel definition member 160_4A may be different. Line widths of the pixel definition member 160_4 and the additional pixel definition member 160_4A may be different according to colors of the sub pixels. For example, a width of the pixel definition member 160_4 disposed in the pixel structure corresponding to the second type blue sub pixel 162B may be larger than a width of the pixel definition member 160_4 disposed in the pixel structure corresponding to the second type red sub pixel 162R, and a width of the pixel definition member 160_4 disposed in the pixel structure corresponding to the second type red sub pixel 162R may be larger than a width of the pixel definition member 160_4 disposed in the pixel structure corresponding to the second type green sub pixels 162Ga and 162Gb. A width of the additional pixel definition member 160_4A disposed in the pixel structure corresponding to the second type blue sub pixel 162B may be larger than a width of the additional pixel definition member 160_4A disposed in the pixel structure corresponding to the second type red sub pixel 162R, and a width of the additional pixel definition member 160_4A disposed in the pixel structure corresponding to the second type red sub pixel 162R may be larger than a width of the additional pixel definition member 160_4A disposed in the pixel structure corresponding to the second type green sub pixels 162Ga and 162Gb.

The second type sub pixel structure 202 may include second openings 162_1 of the third size 162W1 by the second shield member 162BM and the third shield member 162BMA. The second openings 162_1 may be disposed for micro pixels. The second openings 162_1 may have the same or similar sizes. The second openings 162_1 may have the same size (e.g., the third size 162_W1 regardless of the colors of the micro pixels. For example, the openings (or an interval between the second shield member 162BM and the third shield member 162BMA or an opening between the second shield member 162BM and the third shield member 162BMA) allocated in relation to the structures of the first blue micro pixel 162B1, the second blue micro pixel 162B2, the third blue micro pixel 162B3, the fourth blue micro pixel 162B4, the first red micro pixel 162R1, the second red micro pixel 162R2, the third red micro pixel 162R3, the fourth red micro pixel 162R4, the first green micro pixel 162G1), the second green micro pixel 162G2, the third green micro pixel 162G3, and/or the fourth green micro pixel 162G4, which have been described in FIG. 2A or 2B may have the same or similar sizes.

The sizes of the openings of the pixel structure corresponding to the blue micro pixels 162B1*a*, 162B1*b*, 162B1*c*, and 162B1*d* and sizes of the light emitting areas (an interval or an area between the pixel definition member and the additional pixel definition member) may be the same. The sizes of the openings of the pixel structure corresponding to the red micro pixels 162R1*a*, 162R1*b*, 162R1*c*, and 162R1*d* and sizes of the light emitting areas (an interval or an area between the pixel definition member and the additional pixel definition member) may be different. For example, the sizes of the openings of the pixel structure corresponding to the red micro pixels 162R1*a*, 162R1*b*, 162R1*c*, and 162R1*d* may be larger than the sizes of the light emitting areas (an interval or an area between the pixel definition member and the additional pixel definition member) by a first size. The sizes of the openings of the pixel structure corresponding to the green micro pixels 162G1a, 162G1b, 162G1c, and 162G1d may be larger than sizes of the light emitting areas (an interval or an area between the pixel definition member and the additional pixel definition member) by a second size (e.g., the second size that is larger than the first size).

In the above-described structure, the display 160 include the first type sub pixels 161 and the second type sub pixels 162, and may selectively include the screen, in which a viewing angle is adjusted. In this process, the display 160 of the disclosure may support an individual mode or a private mode (e.g., a mode for restricting a light emission angle such that a third person cannot easily observe at least a partial screen of the display 160) based on driving of light emission for a viewing angle (a small viewing angle or a small angle) that is relatively small in the second type sub pixel structure 202 while heights of the first type sub pixel structure 201 and the second type sub pixel structure 201 are made uniform. Additionally, the display 160 of the disclosure may include the second type sub pixel structure 202 that provides a narrow viewing angle based on a structure, in which no air gap is present between an organic light emitting layer and the encapsulation layer or an electrode layer and the encapsulation layer such that there is neither folded nor bending.

FIGS. 2A, 2B, and 3A illustrate that the second shield members 162BM that divide the sub pixels are disposed in the second type pixel 160b, but the disclosure is not limited thereto. For example, the second shield member 162BM may be disposed to surround at least a portion of a periphery of the second type pixel 160b, and no separate member may be disposed between the sub pixels 162R, 162Ga, 162Gb, and 162B. In the second type pixels 160b, partial areas of the sub pixels covered by the shield members may include partial areas of the sub pixels, which do not emit light due to the disposition of the pixel definition member. The pixel definition member disposed in the second type pixel 160b may be aligned with the shield member and a width of the pixel definition member may be larger than a width of the shield member between the two or more openings, and thus some of the sub pixels, which do not emit light, may be exposed through the plurality of openings. The plurality of openings by the shield members 162BM and 162BMA disposed in the second type pixel 160b may have substantially the same width. In the first type pixel 160a, the first shield member 161BM may be disposed in the area of the encapsulation layer. Accordingly, the sub pixels of the first type pixel 160a may be divided by the plurality of openings.

Referring to FIG. 3B, it may be seen that the first type sub pixel 161 has a rate of a luminance (with respect to a luminance measured in a direction that is perpendicular to the display 160) of about 10% or more even to a range of 80 to 85 degrees from the direction that is perpendicular to the front surface of the display 160. It may be seen that the second type sub pixel 162 has a rate of a luminance (with respect to a luminance measured in a direction that is perpendicular to the display 160) of about 10% or less in a range of 40 degrees from the direction that is perpendicular to the front surface of the display 160. Accordingly, the first viewing angle (or a viewing angle according to simultaneous operations of the first type sub pixel 161 and the second type sub pixel 162) according to an operation of the first type sub pixel 161, for example, is of a level of about 80 to 85 degrees in the upward/downward and/or leftward/rightward directions with respect to a line that is perpendicular to the front surface of the display 160, and the second viewing angle of the screen of the display 160, which is operated based on the second type sub pixel 162 is of a level of about 40 degrees in the upward/downward and/or leftward/rightward directions, and only light of 10% or less as compared with the front surface may be viewed outside the viewing angle range. Accordingly, when the screen is configured based on the second type sub pixel 162, luminance may be low on a side surface and thus, it may be difficult to recognize the screen of the display b160.

In various embodiments of the disclosure, an example, in which the light emitting areas of the sub pixels are divided by disposing the additional pixel definition member 160_4A between the pixel definition members 160_4, but in the regard, in various embodiments of the disclosure, a measure of removing a portion of the second electrode by replacing the additional pixel definition member 160_4A may be included. Referring to FIG. 3C, the light emitting areas of the corresponding sub pixels may be separated as in FIG. 3B by providing a removal area 160_4b, from which a portion of the second electrode corresponding to the area, in which the additional pixel definition member 160_4A illustrated in FIG. 3B is disposed, is removed. Accordingly, a disposition location and a form of the shield member described in the embodiments of the disclosure may be described as a structure, in which it is disposed to correspond to the area 160_4b, from which a portion of the second electrode is removed. In relation to separation of the light emitting area of the sub pixel for adjusting a viewing angle of the sub pixel, the organic light emitting layer 160_5 in addition to the second electrode 160_6 may be removed. For example, the removed area 160_4b may include an area, from which at least one of the second electrode 160_6 and the organic light emitting layer 16-_5 is removed.

Figure 4A:
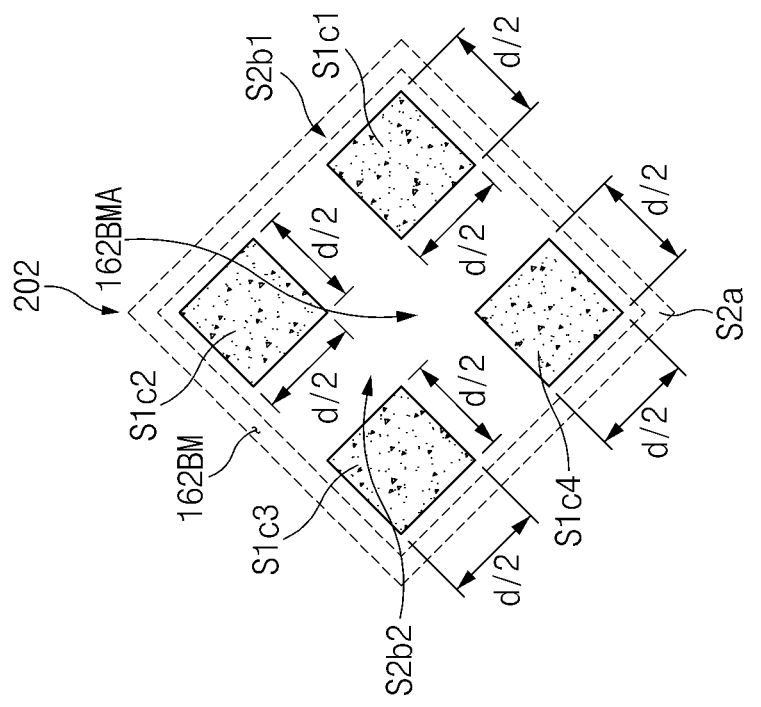
FIG. 4A is a view related to description of sizes of a first type sub pixel and a micro pixel according to an embodiment of the disclosure.
Figure 4A:
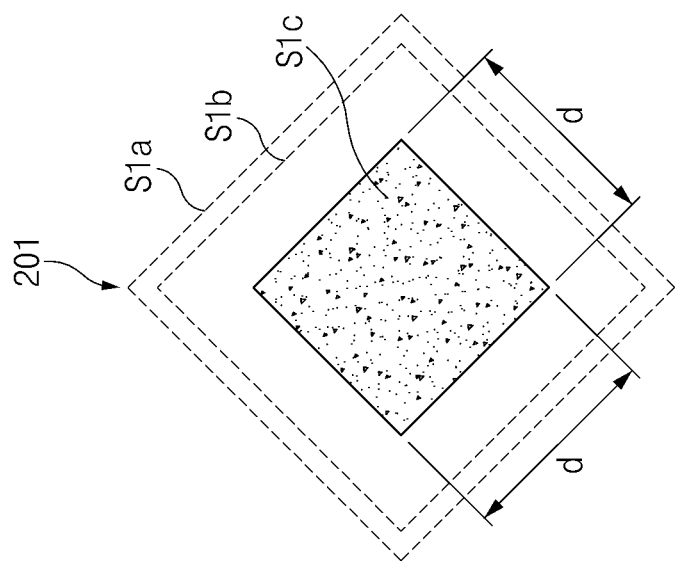

FIG. 4A is a view illustrating an example of comparison of sizes of the first type sub pixel and the micro pixel according to an embodiment of the disclosure.

Referring to FIGS. 2A to 4A, as denoted by 401, the pixel structure 201 corresponding to the first type sub pixel 161 may have an organic light emitting layer S1a, a first electrode of a size that is the same as or smaller than that of the organic light emitting layer S1a may be disposed under the organic light emitting layer S1a, and a second electrode of a size that is the same as or larger than that of the organic light emitting layer S1a may be disposed on the organic light emitting layer S1a. The above-described pixel definition member S1b may be disposed at a periphery of the organic light emitting layer S1a. Accordingly, a portion of the periphery of the organic light emitting layer S1a may overlap the pixel definition member S1b. The light emitting area S1c (e.g., the light emitting area 161_2 of FIG. 3A) may be exposed to an outside through the first opening (the first opening 161_1 of FIG. 3A) between the second shield members 162BM. The light emitting area S1c may be the remaining area of the organic light emitting layer S1a, which does not overlap the pixel definition member S1b in the upward/downward direction (e.g., the z axis direction of FIG. 3A). A width "d" of one side of the light emitting area S1c may be a width of a side of the light emitting area 161_2 described in FIG. 3A. It has been described that the light emitting area S1c has a square shape, of which the widths of the four sides are the same, but the disclosure is not limited thereto. For example, a transverse width and a longitudinal width of the light emitting area Sc may be different. As another example, the shape of the light emitting area S1c may include a circular or polygonal shape.

As denoted by 403, the pixel structure 202 corresponding to the second type sub pixel 162 may include the organic light emitting layer S2a. The organic light emitting layer S2a may have a size that is the same as that of the organic light emitting layer S1a of the pixel structure 201 corresponding to the above-described first type sub pixel 161. A first electrode, a size of which is the same as or smaller than that of the organic light emitting layer S2a, may be disposed under the organic light emitting layer S2a, and a second electrode, a size of which is the same as or larger than that of the organic light emitting layer S2a may be disposed on the organic light emitting layer S2a. The pixel definition member S2b1 (e.g., 160_4 of FIG. 3A) may be disposed at a periphery of the organic light emitting layer S2a, and the additional pixel definition member S2b2 (e.g., 160_4A of FIG. 3A) may be disposed at least a portion of the central portion of the organic light emitting layer S2a. A portion of a periphery of the organic light emitting layer S2a may at least partially overlap the pixel definition member S2b1, and a central portion of the organic light emitting layer S2a may at least partially overlap (e.g., may be arranged in parallel with respect to the upward/downward direction with reference to the z axis of FIG. 3A) the additional pixel definition member S2b2. The second shield member 162BM may be disposed at a location corresponding to a periphery of the pixel structure 202 corresponding to the second type sub pixel 162, and the third shield member 162BMA may be disposed at a location corresponding to a point between the micro pixels in the structure of the second type sub pixel 162. At least the light emitting areas S1c1, S1c2, S1c3, and S1c4 may be exposed through the opening areas (e.g., the second openings 162_1 of the third size 162W1 described in FIG. 3A) formed by the second shield member 162BM and the third shield member 162BMA. The size of one side d/2 of each of the light emitting areas S1c1, S1c2, S1c3, and S1c4 of the micro pixels may be the same as a size of one side of the light emitting area S1c of the pixel structure 202 of the second type sub pixel 162 of FIG. 3A. It has been described that the light emitting areas S1c1, S1c2, S1c3, and S1c4 of the micro pixels have a square shape, of which the widths of the four sides are the same, but the disclosure is not limited thereto. For example, a transverse width and a longitudinal width of the light emitting areas S1c1, S1c2, S1c3, and S1c4 may be different. As another example, the shapes of the light emitting areas S1c1, S1c2, S1c3, and S1c4 of the micro pixels may include a circular or polygonal shape, and substantially, the light emitting areas S1c1, S1c2, S1c3, and S1c4 may have the same shape or the same size.

The widths of the pixel definition member S2b1 and the additional pixel definition member S2b2 may be the same. For example, the size or the organic light emitting layer S1a of the pixel structure 201 corresponding to the first type sub pixel 161 and the size of the organic light emitting layer S2a of the pixel structure 202 corresponding to the second type sub pixel 62 may be the same or similar. The size of the opening area (e.g., the first opening 161_1 of the first size 161W1) between the second shield members 162BM included in the first type sub pixels 162 may be the same as or similar to a sum of the sizes of the opening areas (e.g., the second opening 162_1 of the third size 162W1) between the second shield member 162BM and the third shield member 162BMA included in the second type sub pixel 162. To make luminance uniform in a process of driving the display 160, a sum of the sizes of the light emitting areas S1c1, S1c2, S1c3, and S1c4 of the micro pixels may be the same as the size of the light emitting area S12 of the first type sub pixel 161.

Figure 4B:
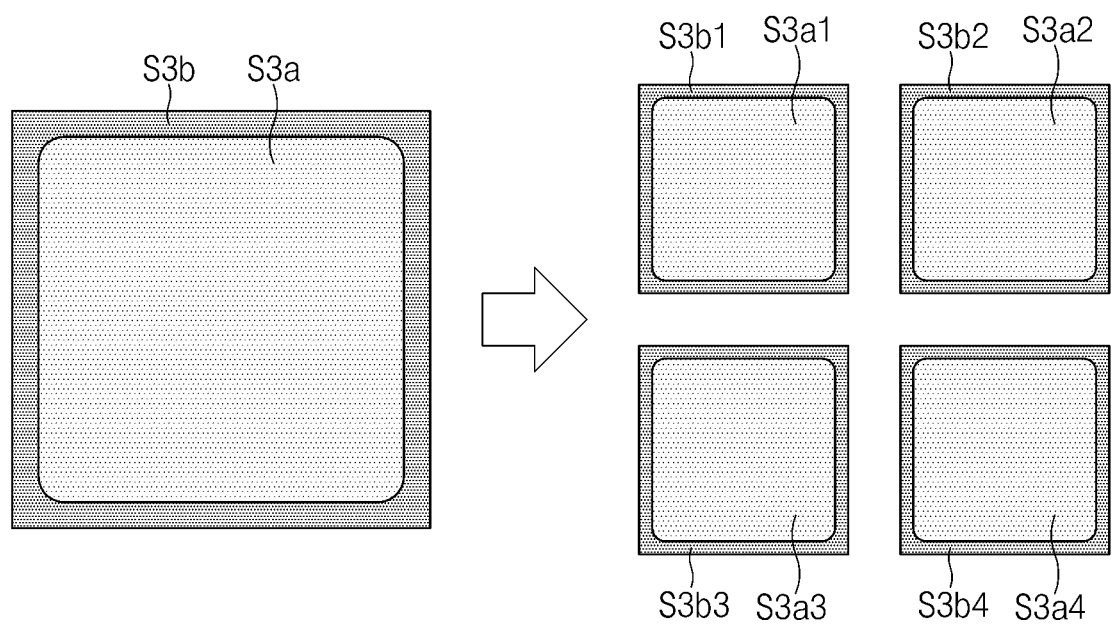
FIG. 4B is a view illustrating an example of comparison of sizes of a first type sub pixel and a micro pixel when they are actually applied according to an embodiment of the disclosure.

FIG. 4B is a view illustrating an example of comparison of sizes of the first type sub pixel and the micro pixel when they are actually applied according to an embodiment of the disclosure.

Referring to FIG. 4B, the first type sub pixel 161B, 161R, 161Ga, and 161Gb (e.g., the sub pixel included in the first type pixel 160a or the sub pixel included in the modified first type pixel 160a), as illustrated, may include a first light emitting area S3a (e.g., an organic light emitting layer and an area of an electrode layer, which overlap the organic light emitting layer in the upward/downward direction), and a pixel definition member area S3b that defines a periphery of the first light emitting area S3a. The pixel definition member area S3b may define the first light emitting area S3a while overlapping at least a portion of the first light emitting area S3a. An inside of the pixel definition member area S3b, which faces a corner area of the first light emitting area S3a, may be rounded. As described above, as the corner area of the first light emitting area S3a is rounded, a luminance of a corner area of the first light emitting area S3a, in which two peripheries thereof meet each other, may be measured to be relatively low as compared with the central portion of the first light emitting area S3a.

Due to various factors (e.g., changes in light emission characteristics of OLEDs due to steps of PDLs, a variation area according to a PDL patterning resolution, a narrow angular emission of OLED dipole emitters by the PDLs, deterioration of OLEDs due to the materials of PDLs) according to the characteristics of the OLEDs, a periphery of the first light emitting area S3a may show relatively low luminance characteristics as compared with the central portion thereof. Accordingly, when peripheral and corner areas of the first light emitting area S3a increase, relatively low luminance characteristics may be shown. The second type sub pixels 162B, 162R, 162Ga, and 162Gb may be provided by dividing the sizes of the first type sub pixels 161B, 161R, 161Ga, and 161Gb by using the pixel definition members, and corner areas of the divided second light emitting areas S3a1, S3a2, S3a3, and S3a4 of each of the second type sub pixels 162B, 162R, 162Ga, 162Gb may be rounded by the pixel definition members. The rounded portions may occupy higher ratios as the sizes of the sub pixels become smaller. Accordingly, even though a sum of the areas of the second light emitting areas S3a1, S3a2, S3a3, and S3a4 of the second type sub pixels 162B, 162R, 162Ga, 162Gb defined by the pixel definition member areas S3b1, S3b2, S3b3, and S3b4 corresponds to the first light emitting areas S3a of the first type sub pixels 161B, 161R, 161Ga, and 161Gb, relatively low luminance characteristics and low lifespan characteristics may be shown. Accordingly, a sum of the sizes of the second light emitting areas S3a1, S3a2, S3a3, and S3a4 of the second type sub pixels 162B, 162R, 162Ga, and 162Gb may be larger than those of the first light emitting areas S3a of the first type sub pixels 161B, 161R, 161Ga, and 161Gb. In this regard, based on Equation 1 as follows, a luminance equivalence condition of the first type sub pixels 161B, 161R, 161Ga, and 161Gb and the second type sub pixels 162B, 162R, 162Ga, and 162Gb may be calculated.

$$T\text{wide.uniform} + T\text{wide.edge} = 4(T\text{narrow.uniform} + T\text{narrow.edge}) \quad \text{Equation 1}$$

In Equation 1, Twide.uniform is Lwide.uniform×Awide.uniform, Twide.edge is Lwide.edge×Awide.edge, Tnarrow.uniform is Lnarrow.uniform×Anarrow.uniform, Tnarrow.edge is Lnarrow.edge×Anarrow.edge. Twide.uniform may mean a total amount of the light in an area, in which the light emission characteristics in the first type sub pixels 161B, 161R, 161Ga, and 161Gb are uniform. Lwide.uniform may be an amount of the light per specific unit area, and a total amount of the light may be obtained by multiplying it and Awide.uniform. In Equation 1, the pixels may be classified into the first type sub pixels 161B, 161R, 161Ga, and 161Gb (e.g., wide pixels) and the second type sub pixels 162B, 162R, 162Ga, and 162Gb (e.g., narrow pixels, narrow viewing angle pixels), areas according to the light emission characteristics may be classified into uniform and edge, the edge may be defined as an area, in which luminance is degraded due to various factors, such as a border deviation of a light emitting part due to a patterning deviation of the PDL, degradation of luminance characteristics of the light emitting part due to a PDL step, and the like, and a round shape corner may be included in the edge. According to an embodiment, when it is assumed that Lwide.edge/Lwide.uniform=Lnarrow.edge/Lwide.uniform is 1, losses of areas of the sub pixels by the round shape corner may decrease luminance by 92.13%, 85.99%, and 95.32% for the RGB sub pixels, respectively. Accordingly, as a measure for compensating for the above-described decrease of luminance, loss of the area of the round shape corner and the decrease of luminance may be compensated for when the sizes of the second type sub pixels are compensated for (e.g., when the areas of the RGB sub pixels are designed to be expanded by 109%, 116%, and 105%) such that a total amount of the light of the first type sub pixels and the second type sub pixels are the same (Twide.uniform+Twide.edge=Tnarrow.uniform+Tnarrow.edge).

The ratios for RGB may be changed by the sizes of the pixels of RGBs and other elements (e.g., RGB material characteristics). As described above, the display according to embodiments of the disclosure may improve luminance characteristics, color deviations, and lifespan characteristics of the second type sub pixels 162B, 162R, 162Ga, and 162Gb by forming such that a sum of the sizes of the second type sub pixels 162B, 162R, 162Ga, 162Gb may be larger than the sizes of the corresponding first type sub pixels by a specific size whereby a total amount of the light of the first type sub pixels and the second type sub pixels may be the same. Furthermore, the display of the disclosure may prevent problems, such as burn-in deviations, light stains, and the like.

Figure 5:
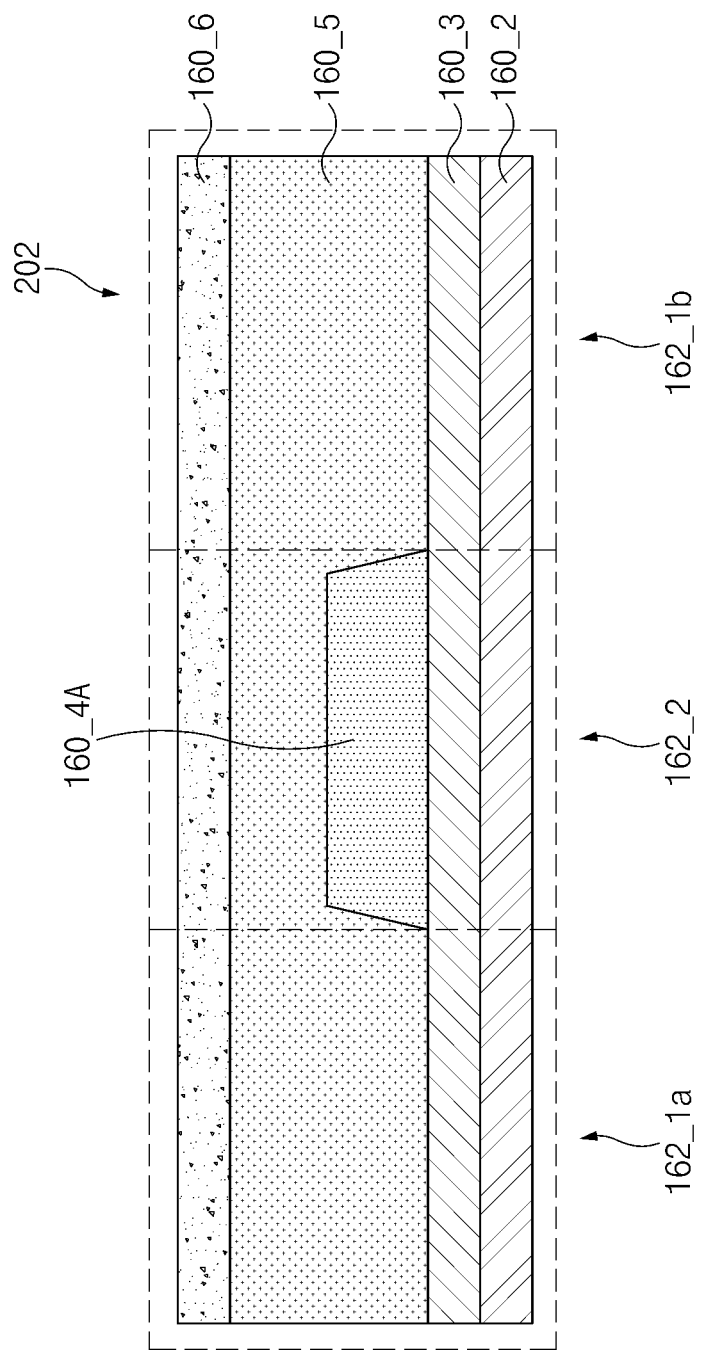
FIG. 5 is a view illustrating an example of a partial structure of a display related to a light emitting area of a second type sub pixel structure according to an embodiment of the disclosure.

FIG. 5 is a view illustrating an example of a partial structure of the display related to the light emitting area of the second type sub pixel structure according to an embodiment of the disclosure.

Referring to FIG. 5, at least a portion of the second type sub pixel structure 202 according to an embodiment, as illustrated, may include the semiconductor layer 160_2, the first electrode 160_3, the organic light emitting layer 160_5, and/or the second electrode 160_6, and the additional pixel definition member 160_4A may be disposed at a central portion of the organic light emitting layer 160_5 while contacting the first electrode 160_3. In the above-described second type sub pixel structure 202, because the additional pixel definition member 160_4A is disposed at least a portion of the central portion of the first electrode 160_3, the light emitting area of the organic light emitting layer 160_5, as illustrated, may be separated leftwards and rightwards with respect to the additional pixel definition member 160_4A. Accordingly, the second type sub pixel structure 202 may include the non-light emitting area 162_2 corresponding to an area, in which the additional pixel definition member 160_4A is disposed, and light emitting areas 162_1a and 162_1b disposed on the left and right sides of the non-light emitting area 162_2. Although it has been described in the illustrated drawings that the light emitting areas 162_1a and 162_1b are disposed on the left and right sides of the non-light emitting area 162_2 with respect to the 2-dimensional plane, but with respect to the first direction (e.g., the z axis direction) described above with reference to FIGS. 2A to 3C, the non-light emitting area 162_2 may include a rectangular periphery corresponding to the second sub pixel structure 202 and a cross-shaped area at a central portion of the rectangular shape, and the light emitting areas 162_1a and 162_1b may include areas disposed in four quadrants with respect to the cross area.

The display 160 of the disclosure may provide uniform screen characteristics at the first viewing angle in the general mode and at the second viewing angle (e.g., the narrow viewing angle) in the private mode by determining a ratio of a height between the light emitting layer and the shield member and a width between the light emitting members such that the ratio becomes a specific value. For example, when the thickness of the panel is 30 μm, a width of the light emitting area (or a light emitting member) of the first type sub pixel structure 201 may be about 25 μm and a width of the separated light emitting areas of the second type sub pixel structure 202 may be 12.5 μm whereby screen characteristics may become uniform by making a sum of the widths of the separated light emitting areas of the second type sub pixel structure 202 and the width of the light emitting area of the first type sub pixel structure 201 the same to make the ratios to the thickness of the panel similar.

Figure 6:
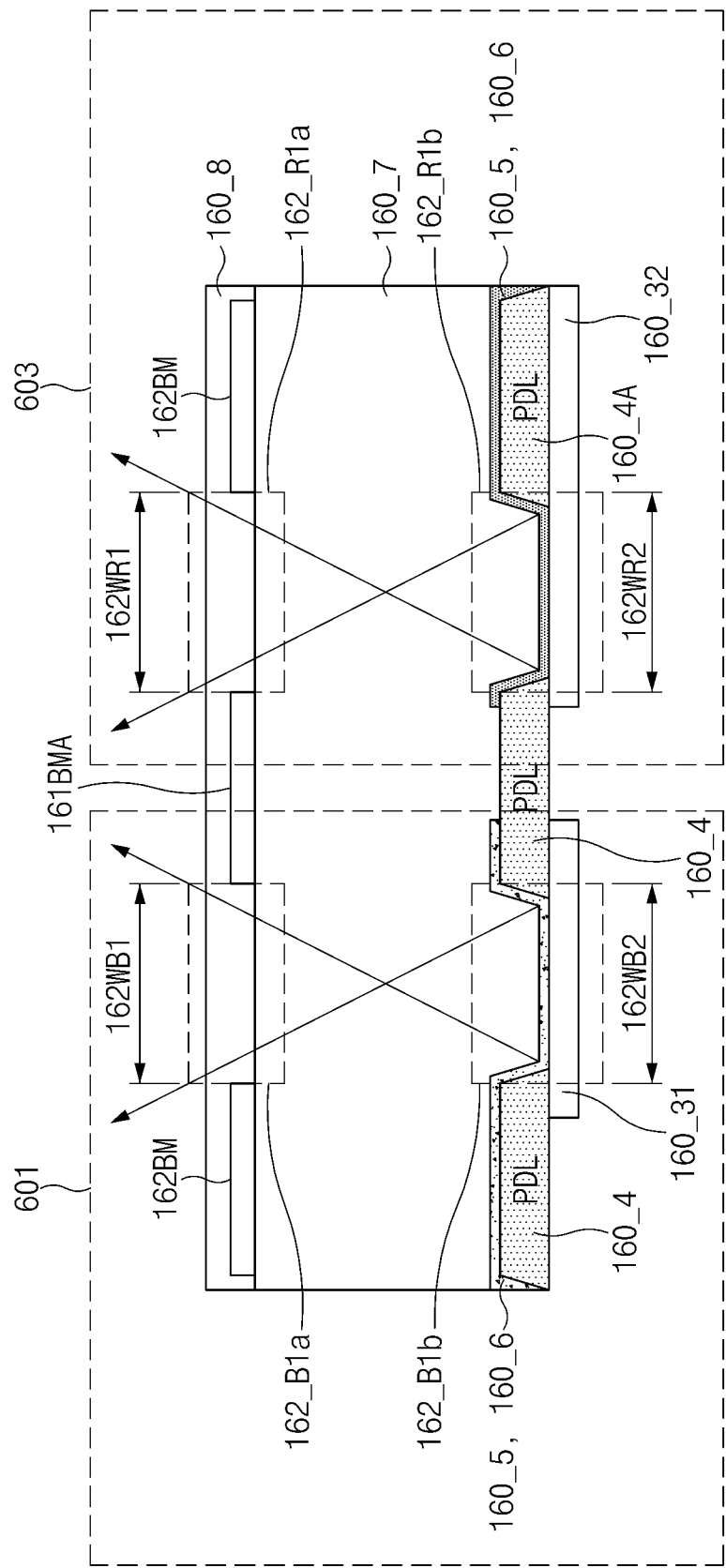
FIG. 6 is a view illustrating a partial structure of a display in relation to comparison of a structure for pixels of a second type sub pixel according to an embodiment of the disclosure.

FIG. 6 is a view illustrating a partial structure of the display in relation to comparison of a structure for the pixels of the second type sub pixel according to an embodiment of the disclosure.

Referring to FIGS. 2A and 6, the blue micro pixel structure 601 may include an organic light emitting layer and the second electrodes 160_5 and 160_6 that cover portions of the additional pixel definition member 160_4A and the pixel definition member 160_4 disposed on opposite peripheries of the first blue electrode 160_31, and exposed portions of a portion of the pixel definition member 160_4, the additional pixel definition member 160_4A, and the first blue electrode 160_31. Although not illustrated, an additional shield member may be disposed at an upper end of the pixel definition member 160_4. The additional shield member may be disposed between the pixel definition member 160_4, and the other shield members (e.g., 162BM and 161BMA).

In the structure 601 of the blue micro pixel, the encapsulation layer 160_7 that covers the organic light emitting layer and the second electrodes 160_5 and 160_6 are disposed on an upper side thereof, the light transmission protecting layer 160_8 may be disposed on an upper side of the encapsulation layer 160_7, and the side members (e.g., portions of the second shield member 162BM and the third shield member 162BMA) may be partially disposed between the encapsulation layer 160_7 and the light transmission protecting layer 160_8. In the above-described structure, the structure 601 of the blue micro pixel may include a first micro pixel opening 162_B1a of a fifth size 162WB1, which is formed by portions of the second shield member 162BM and the third shield member 162BMA. Furthermore, the structure 601 of the blue micro pixel may include a blue micro pixel light emitting area 162_B1b of a sixth size 162WB2. The first micro pixel opening 162_B1a of the fifth size 162WB1 and the blue micro pixel light emitting area 162_B1b of the sixth size 162WB2 may have the same size. For example, a length of one side of the first micro pixel opening 162_B1a of the fifth size 162WB1 (or the blue micro pixel light emitting area 162_B1b of the sixth size 162WB2) may be about 12.5 μm.

The red micro pixel structure 603 may include an organic light emitting layer and the second electrodes 160_5 and 160_6 that cover portions of the additional pixel definition member 160_4A and the pixel definition member 160_4 disposed on opposite peripheries of the first red electrode 160_32, and exposed portions of a portion of the additional pixel definition member 160_4A, the pixel definition member 160_4, and the second electrodes 160_5 and 160_6. In the structure 603 of the red micro pixel, the encapsulation layer 160_7 that covers the organic light emitting layer and the second electrodes 160_5 and 160_6 are disposed on an upper side thereof, the light transmission protecting layer 160_8 may be disposed on an upper side of the encapsulation layer 160_7, and the side members (e.g., a portion of the third shield member 162BMA and the second shield member 162BM) may be partially disposed between the encapsulation layer 160_7 and the light transmission protecting layer 160_8. In the above-described structure, the structure 603 of the red micro pixel may include a seventh micro pixel opening 162_R1a of a seventh size 162WR1, which is formed by a portion of the third shield member 162BMA and the second shield member 162BM. Furthermore, the structure 603 of the red micro pixel may include a red micro pixel light emitting area 162_R1b of an eighth size 162WR2. The second micro pixel opening 162_R1a of the seventh size 162WR1 and the red micro pixel light emitting area 162_R1b of the eighth size 162WR2 may have the same size. For example, a length of one side of the second micro pixel opening 162_R1a of the seventh size 162WR1 (or the red micro pixel light emitting area 162_R1b of the eighth size 162WR2) may be about 10 μm.

As described above, the opening of the blue micro pixel and the size of the light emitting area thereof may be larger than the opening of the red micro pixel and the size of the light emitting area thereof. Similarly, the opening of the reed micro pixel and the size of the light emitting area thereof may be larger than the opening of the green micro pixel and the size of the light emitting area thereof.

Figure 7:
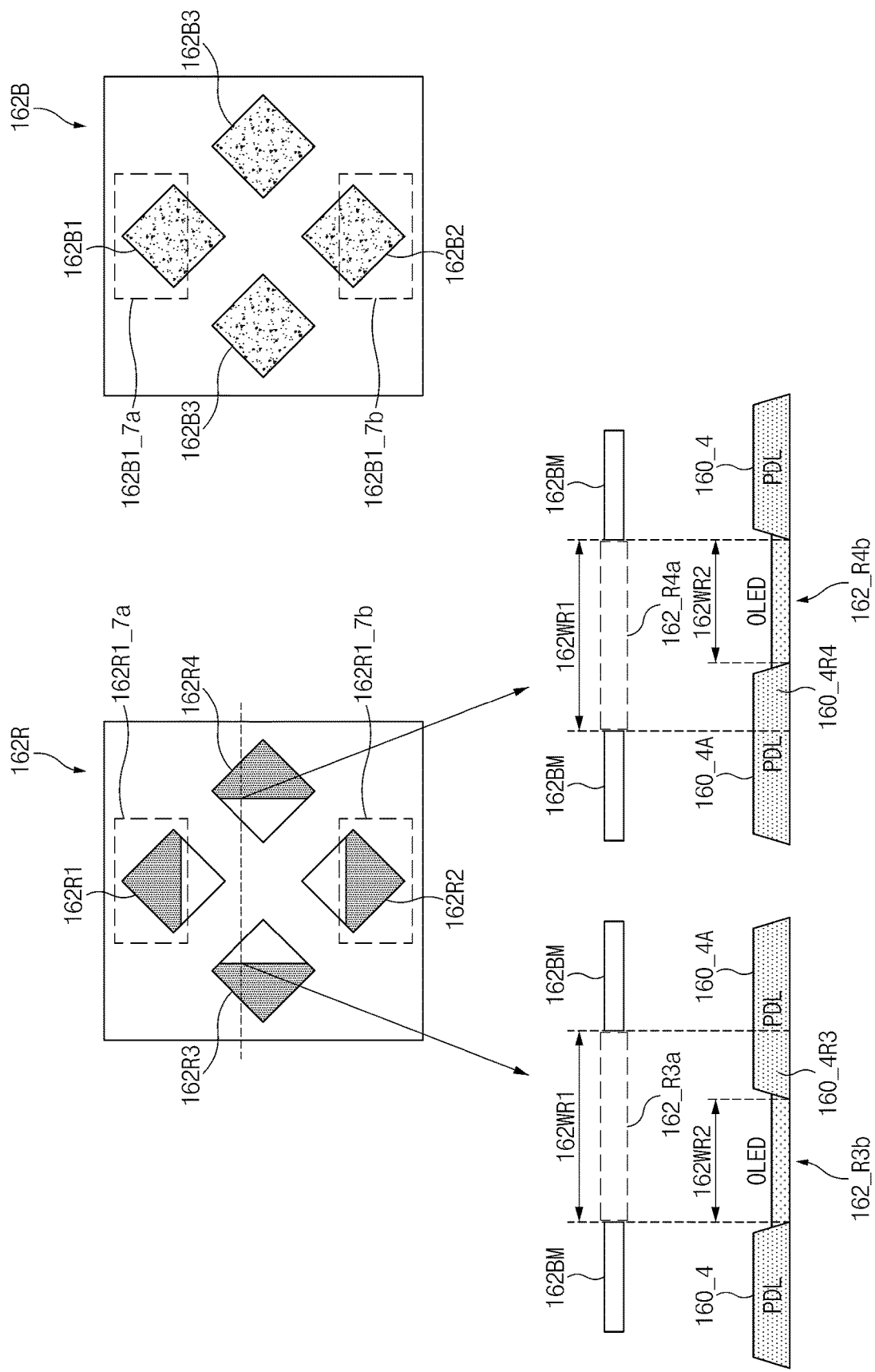
FIG. 7 is a view illustrating another example of a second type sub pixel according to an embodiment of the disclosure.

FIG. 7 is a view illustrating another example of the second type sub pixel according to an embodiment of the disclosure.

Figure 8:
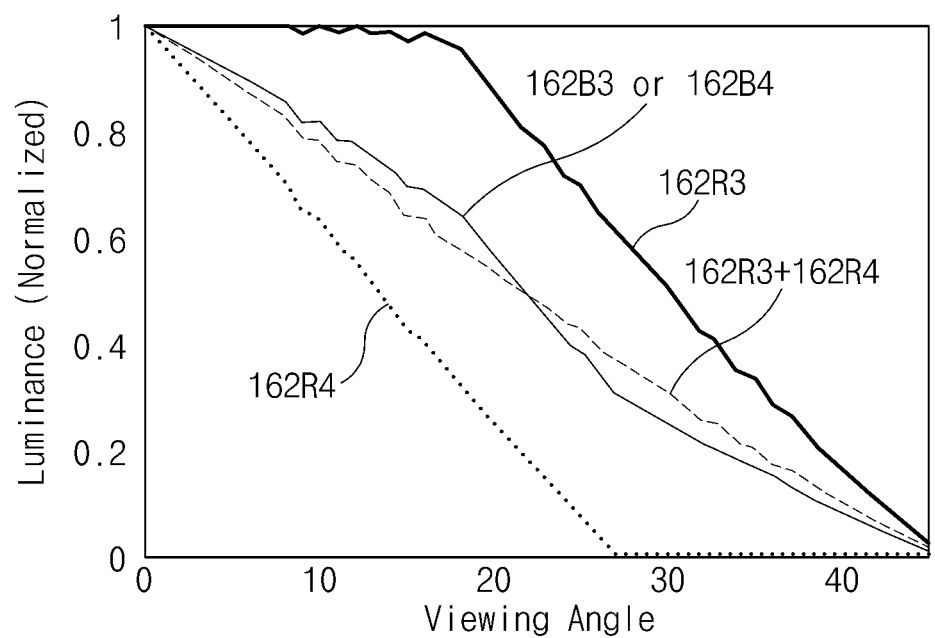
FIG. 8 is a view illustrating an example of detection of luminance of structures of second type sub pixels of FIG. 7 according to an embodiment of the disclosure.

FIG. 8 is a view illustrating an example of detection of luminance of structures of the second type sub pixels of FIG. 7 according to an embodiment of the disclosure.

Referring to FIG. 7, the second type red sub pixel 162R, as illustrated, may be disposed such that the four red micro pixels 162R1, 162R2, 162R3, and 162R4 are adjacent to each other. Because the four red micro pixels 162R1, 162R2, 162R3, and 162R4 are disposed on one first electrode, they may be driven as if they were one red sub pixel. In the four red micro pixels 162R1, 162R2, 162R3, and 162R4, as illustrated, red organic light emitting layers that cover the additional pixel definition member 160_4A may be disposed differently. For example, in the third red micro pixel 162R3, with respect to the first direction (the z axis direction of FIG. 3A), the second shield member 162BM of a first width and the third shield member 162BMA of a second width may be disposed on an upper side thereof, and the third red micro pixel opening 162_3a may be disposed between the second shield member 162BM and the third shield member 162BMA. A width of the second shield member 162BM and a width of the third shield member 162BMA may be the same. According to various embodiments, the width of the second shield member 162BM may be larger than the width of the third shield member 162BMA.

The third red micro pixel 162R3, may include a light emitting area 162_R3b (or a light emitting member). The pixel definition member 160_4 may be disposed on a left side of the light emitting area 162_3a with reference to the illustrated drawing, and the additional pixel definition member 160_4A may be disposed on a right side thereof. A width of the pixel definition member 160_4 and a width of the second shield member 162BM may be the same, and may overlap each other in the upward/downward direction with respect to the first direction (e.g., the direction that is perpendicular to the front surface of the display 160). For example, a periphery of the pixel definition member 160_4 and a periphery of the second shield member 162BM may be arranged to coincide with each other with respect to the first direction. The width of the additional pixel definition member 160_4A may be larger than the width of the third shield member 162BMA, and a portion of the third shield member 162BMA may overlap the additional pixel definition member 160_4A with respect to the first direction (e.g., the direction that is perpendicular to the front surface of the display 160). For example, one periphery (e.g., a left periphery) 160_4R3 of the additional pixel definition member 160_4A may be exposed through an opening 162_R3a. In the above-described structure, the size 162WR2 of the light emitting area 162_R3b may be smaller than the size 162WR1 of the opening 162_R3a.

The fourth red micro pixel 162R4, as in the third red micro pixel 162R3, also may include the light emitting area 162_R4b. The additional definition member 160_4A may be disposed on the left side of the light emitting area 162_R4b with reference to the illustrated drawing, and the pixel definition member 160_4 may be disposed on the right side thereof. A width of the pixel definition member 160_4 and a width of the second shield member 162BM may be the same, and may overlap each other in the upward/downward direction with respect to the first direction (e.g., the direction that is perpendicular to the front surface of the display 160). For example, with reference to the illustrated drawing, a left periphery of the pixel definition member 160_4 and a left periphery of the second shield member 162BM may be arranged to coincide with each other with respect to the first direction. The width of the additional pixel definition member 160_4A may be larger than the width of the third shield member 162BMA, and a portion of the third shield member 162BMA may overlap the additional pixel definition member 160_4A with respect to the first direction (e.g., the direction that is perpendicular to the front surface of the display 160). For example, one periphery (e.g., a right periphery) 160_4R4 of the additional pixel definition member 160_4A may be exposed through an opening 162_R4a. In the above-described structure, the size 162WR2 of the light emitting area 162_R4b may be smaller than the size 162WR1 of the opening 162_R4a.

In the above description, as the third red micro pixel 162R3 and the fourth red micro pixel 162R4 have been exemplified and it has been described that a location of the exposed portion of the additional pixel definition member 160_4A is on the left side or right side of the additional pixel definition member 160_4A, but the disclosure is not limited thereto. For example, according to a modification of a disposition location or a shape of the red micro pixel, at least a portion of a periphery (e.g., a left periphery, a right periphery, an upper periphery, or a lower periphery) of the additional pixel definition member 160_4A may be exposed through at least a portion of the opening corresponding to the location, at which the micro pixel is disposed.

As illustrated, the second type red sub pixel 162R may be disposed to be adjacent to the second type blue sub pixel 162*b* including four blue micro pixels 162B1, 162B2, 162B3, and 162B4. The openings (or intervals) between the shield members disposed in the four blue micro pixels 162B1, 162B2, 162B3, 162B4 may be the same as the areas (or intervals) between the pixel definition members. Accordingly, no pixel definition member (or no additional pixel definition member) may be observed in the four blue micro pixels 162B1, 162B2, 162B3, 162B4. Partial areas (e.g., a partial area 162R1_7*a* of the first red micro pixel or a partial area 162R1_7*b* of the second red micro pixel) of the red micro pixels may have a shape that is the same as or similar to partial areas (e.g., a partial area 162B1_7*a* of the first blue micro pixel or a partial area 162B1_7*b* of the second blue micro pixel) of the blue micro pixels.

Referring to FIG. 8, in relation to a change of detection of luminance for angles of the third red micro pixel 162R3, it may be seen that luminance is changed within a relatively small angle change (e.g., about 0 to 25 degrees) in a central direction (e.g., a direction that faces the front surface of the display 160 perpendicularly). In relation to a change of detection of luminance for angles of the fourth red micro pixel 162R4, it may be seen that luminance is changed within a relatively large angle change (e.g., about 20 to 45 degrees) in a central direction (e.g., a direction that faces the front surface of the display 160 perpendicularly). Accordingly, because a partial area of the additional pixel definition member of the third red micro pixel 162R3 and a partial area of the additional pixel definition member of the fourth red micro pixel 162R4 are disposed to be adjacent to each other, a sum (160R3_160R4) of a change in the luminance of the third red micro pixel 162R3 and a change in the luminance of the fourth red micro pixel 162R4 may be matched to be similar to a change in the luminance of the blue micro pixels (e.g., 162B3 and 162B4) whereby a distortion of the screen of the display 160 may be prevented.

Figure 9:
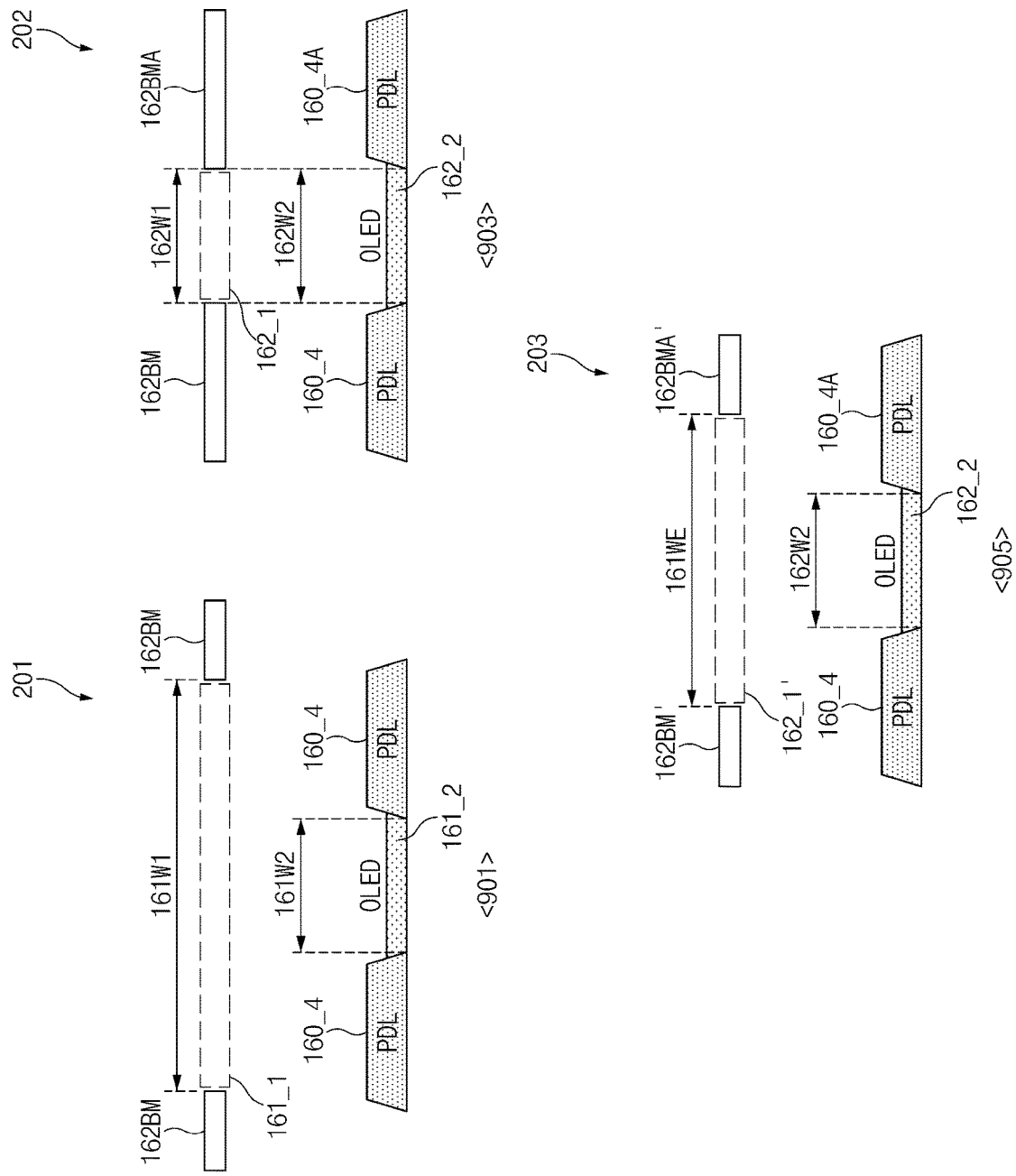
FIG. 9 is a view illustrating some configurations related to a viewing angle of a first type sub pixel, some configurations related to a viewing angle of a micro pixel, and some configurations related to a viewing angle of a micro pixel that is changed according to an embodiment of the disclosure.

FIG. 9 is a view illustrating configurations related to a viewing angle of the first type sub pixel, configurations related to a viewing angle of the micro pixel, and configurations related to a viewing angle of the micro pixel that is modified according to an embodiment of the disclosure.

Figure 10:
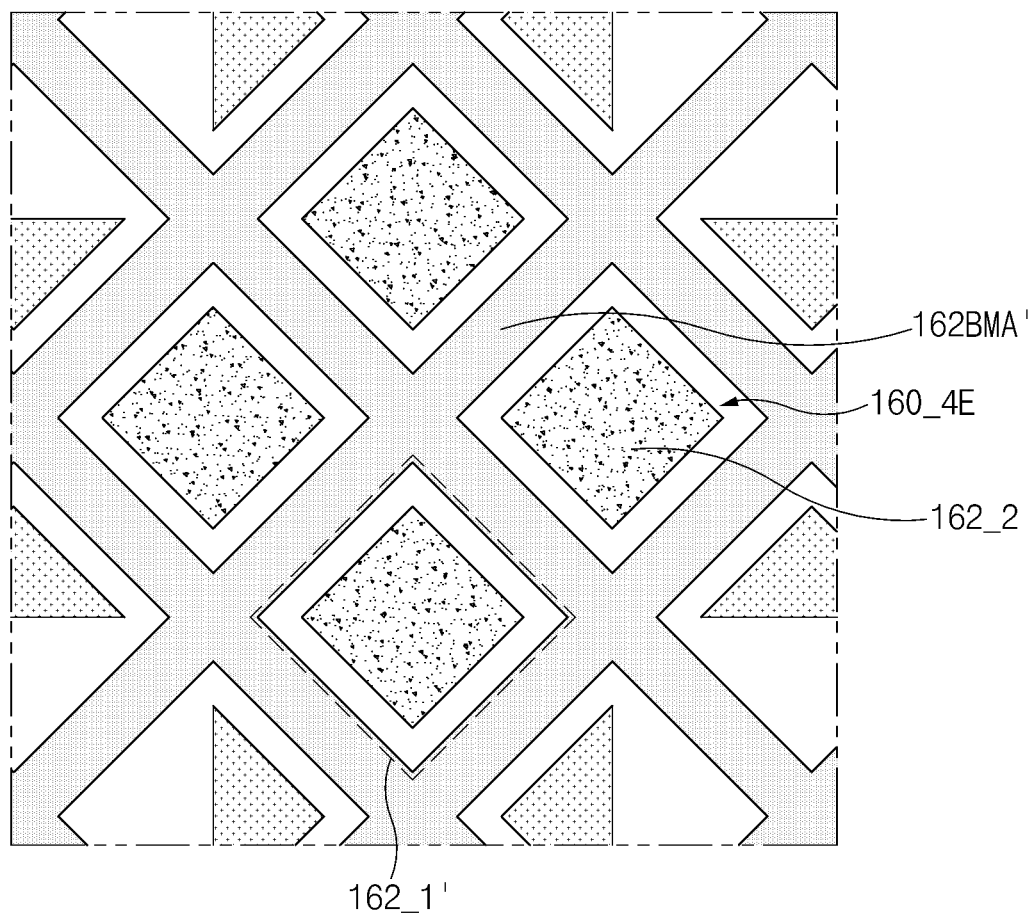
FIG. 10 illustrates an example of applying a micro pixel according to an embodiment of the disclosure.

FIG. 10 illustrates an example of applying the micro pixel according to an embodiment of the disclosure.

Figure 11:
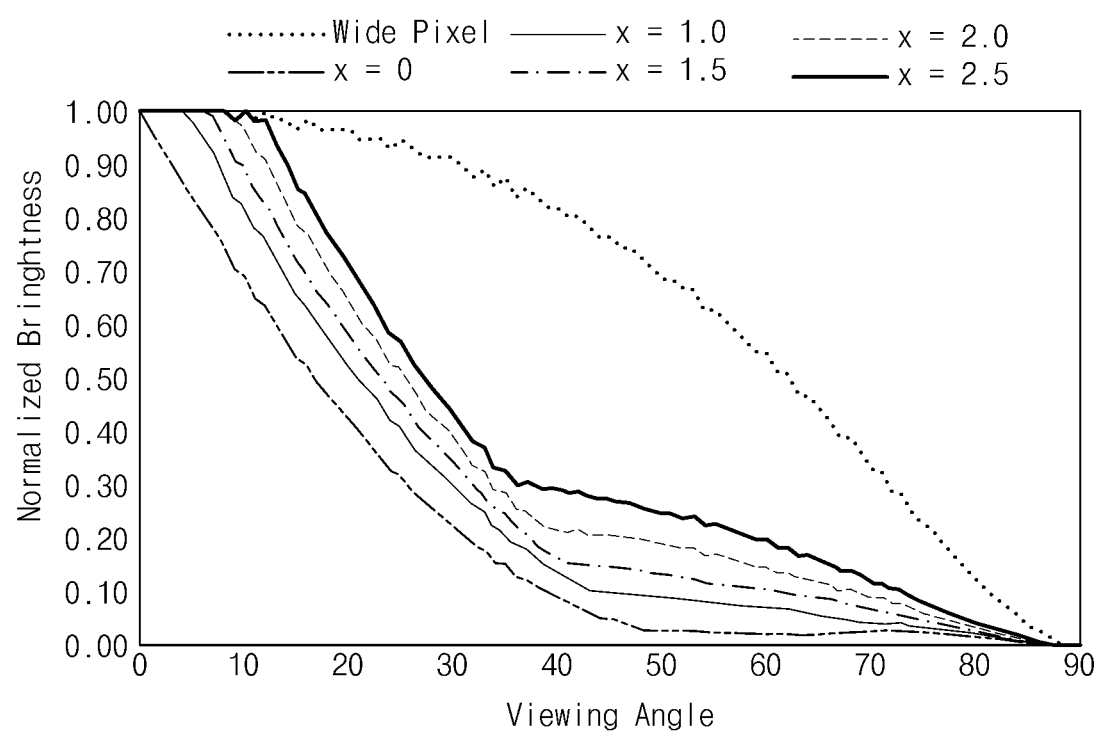
FIG. 11 is a view illustrating a change in detection of luminance of a micro pixel modified according to an embodiment of the disclosure.

FIG. 11 is a view illustrating a change in detection of the luminance of the micro pixel modified according to an embodiment of the disclosure.

Referring to FIG. 9, as shown in 901, the first type sub pixel structure 201 may include at least the first light emitting member 161_2, the pixel definition members 160_4, and the second shield members 162BM. The second shield members 162BM may be spaced apart from each other by a specific interval to form one opening 161W1 (or a first width). The first light emitting member 161_2, may include at least a portion of the semiconductor layer 160_2 described in FIG. 3A, at least a portion of the first electrode 160_3, at least a portion of the organic light emitting layer 160_5, and at least one of the second electrode 160_6. A light emission range of the first light emitting member 161_2 may be determined by the pixel definition members 160_4. For example, the first light emitting member 161_2 may have a light emission range of the first area 161W2 (or the first width). In the first type sub pixel structure 201, the first size 161W1 of the first openings 161_1 between the first shield members 161BM may be larger than the first area 161W2 such that an observation viewing angle of the screen is relatively large. Furthermore, the first type sub pixel structure 201 may be located within a range, the first area 161W2 may be located within a range of the first opening 161_1 with respect to the first direction (e.g., a direction that is perpendicular between the first shield members 161BM and the pixel definition member 160_4).

As shown in 903, the micro pixel structure may include a structure of micro pixels corresponding to a portion of the second type sub pixel structure 202 described above in FIG. 3A. The micro pixel structure may include at least the second light emitting member 162_2, the pixel definition member 160_4, the additional pixel definition member 160_4A, the second shield member 162BM, and the third shield member 162BMA. The second shield member 162BM and the third shield member 162BMA may be spaced apart from each other by a specific interval to form the second opening 162_1 of the second size 162W1 (or the second width). The second light emitting member 162_2, for example, may include at least a portion of the semiconductor layer 160_2 described in FIG. 3A, at least a portion of the first electrode 160_3, at least a portion of the organic light emitting layer 160_5, and at least one of the second electrode 160_6. A light emission range of the second light emitting member 162_2 may be determined by the pixel definition member 160_4 and the additional pixel definition member 160_4A. For example, the second light emitting member 162_2 may have a light emission range of the second area 162W2 (or the second width).

In the micro pixel structure, the size 162W2 of the second opening 162_1 between the second shield member 162BM and the third shield member 162BMA may be similar to or the same as the size of the second area 162W2 such that an observation viewing angle of the screen is relatively small as compared with the first type sub pixel structure 201. Furthermore, with respect to the first direction (e.g., the direction that is perpendicular between the first shield members 161BM and the pixel definition member 160_4), the second area 162W2 of the micro pixel structure may be arranged with the second opening 162_1 (e.g., a location of at least one side of the second area and a location of at least one of the peripheral shield member that defines the second opening 162W1 are disposed to coincide with each other vertically with respect to the first direction.

As shown in 905, the modified micro pixel structure 203 may include at least the second light emitting member 162_2, the pixel definition member 160_4, the additional pixel definition member 160_4A, the modified second shield member 162BM', and the modified third shield member 162BMA'. The modified second shield member 162BM' and the modified third shield member 162BMA' may be spaced apart from each other by a specific interval to form the third opening 162_1' of the third size 162WE (or the third width). The sizes of the change second shield member 162BM' and the modified third shield member 162BMA' may be smaller than the size of the pixel definition member 160_4 and the size of the additional pixel definition member 160_4A. The sizes of the modified second shield member 162BM' and the modified third shield member 162BMA' may be smaller than the sizes of the second shield member 162BM and the third shield member 162BMA described in the micro pixel structure. The second light emitting member 162_1 may be the same light emitting member as the second light emitting member 162_2 of the micro pixel structure described above. Accordingly, the second light emitting member 162_2 of the modified micro pixel structure 203 may have a light emission range of the second area 162W2 (or the second width). In the modified micro pixel structure 203, the size 162WE of the third opening 162_1' between the modified second shield member 162BM' and the modified third shield member 162BMA' is smaller than the size 161W1 of the opening 161_1 and the second size 162W1 of the opening 162_1 such that a relative high luminance performance may be exhibited as compared with the micro pixel structure while the observation viewing angle of the screen is similar to that of the micro pixel structure.

Referring to FIG. 10, the modified micro pixel structure 203, may include the light emitting area 162_2, the modified third shield member 162BMA' (or the modified second shield member 162BM'), and an expanded pixel definition member 160_4E. A size of the light emitting area 162_2, may be the same as or similar to a quarter of (a half in the case of one side) an area of the size 161W2 of the light emitting area 161_2 of the first type sub pixel structure 201. When a width of the changed third shield member 162BMA' is smaller than a width of the third shield member 162MBA of the micro pixel structure, at least a portion of the additional pixel definition member 160_4A (or the pixel definition member 160_4) may be exposed through the third opening 162_1' according to the third shield member 162BMA. The additional pixel definition member 160_4A (or the pixel definition member 160_4) disposed in the expanded pixel definition member 160_4E may have a width and a size that are the same as those of the additional pixel definition member 160_4A described in the micro pixel structure.

Referring to FIG. 11, it may be seen that a change in detection of luminance according to a change of an angle is later as a size of difference "x" between sides of the second opening 162_1 and the third opening 162_1' becomes gradually larger. For example, it may be seen that the value of x of 0 corresponds to the second opening 162_1 of the micro pixel structure 202 and a change in detection of luminance of 0 degrees (e.g., the direction that is perpendicular to the display 160) wherein a change in detection of luminance occurs from an angle of about 10 degrees or more when x is 2.5 (e.g., when one side of the third opening 162_1' is larger than one side of the second opening 162_1 by 2.5 μm).

Figure 12A:
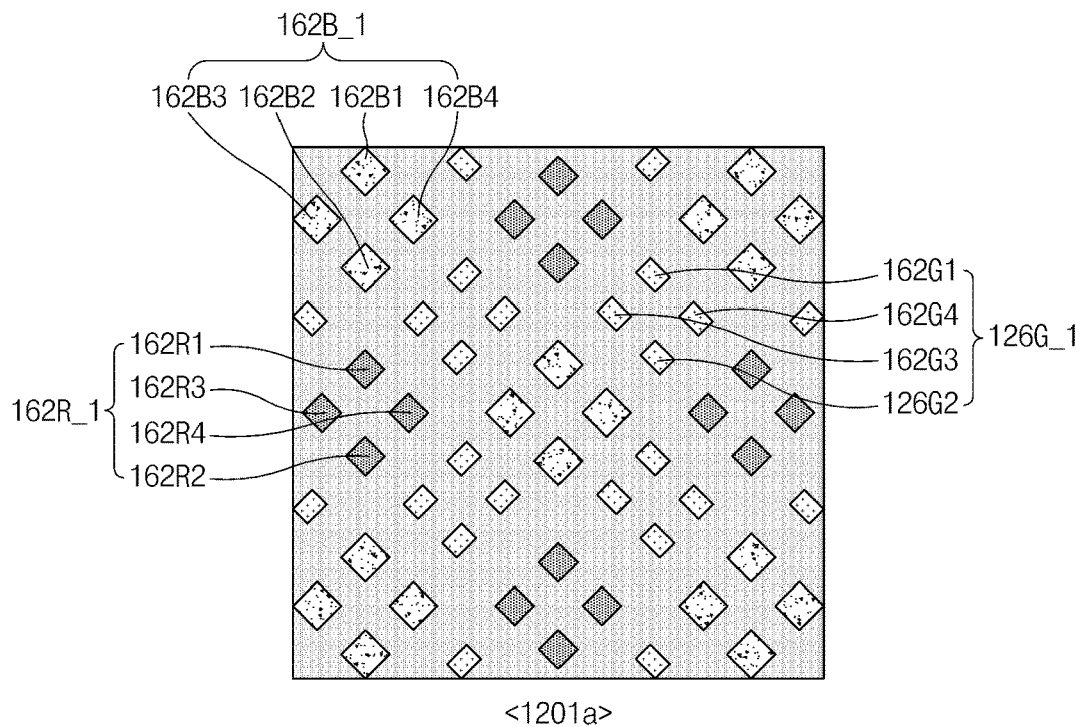
FIG. 12A is a view illustrating a first structure of a second type sub pixel and a viewing angle according thereto according to an embodiment of the disclosure.
Figure 12A:
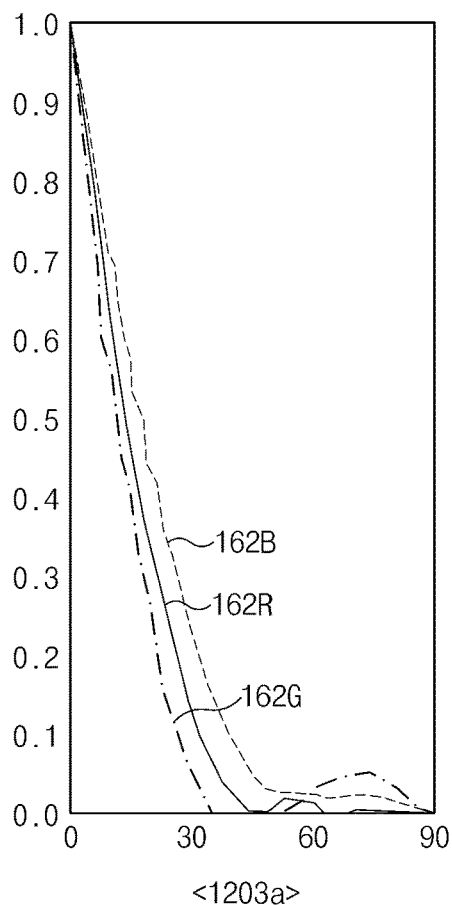
Figure 12A:
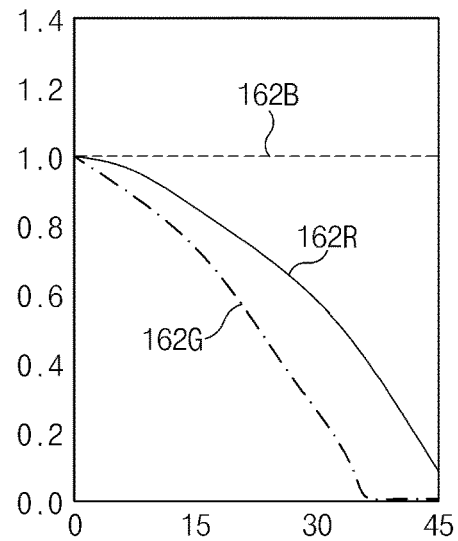

FIG. 12A is a view illustrating the first structure of the second type sub pixel and a viewing angle according thereto according to an embodiment of the disclosure.

Figure 12B:
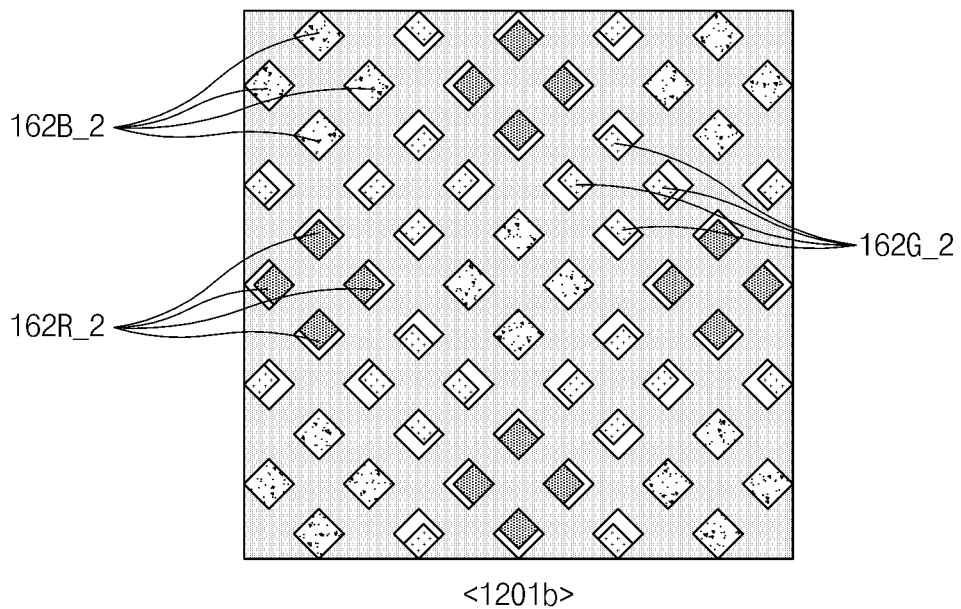
FIG. 12B is a view illustrating a second structure of a second type sub pixel and a viewing angle according thereto according to an embodiment of the disclosure.
Figure 12B:
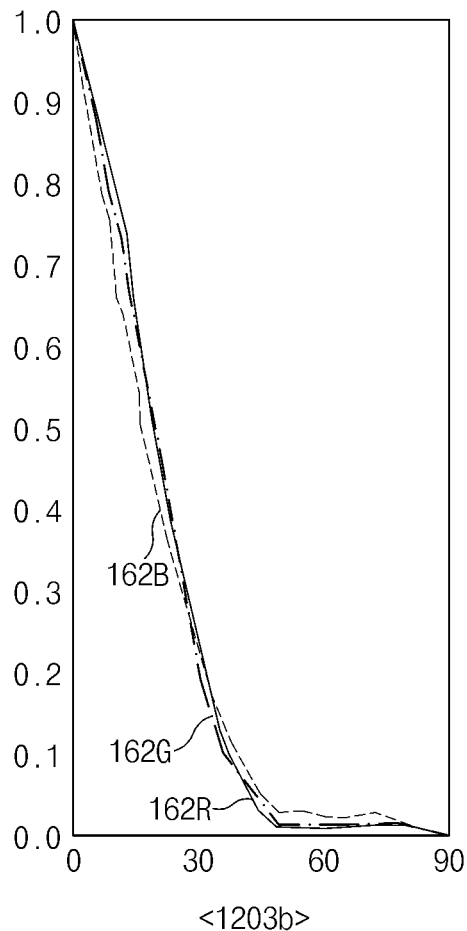
Figure 12B:
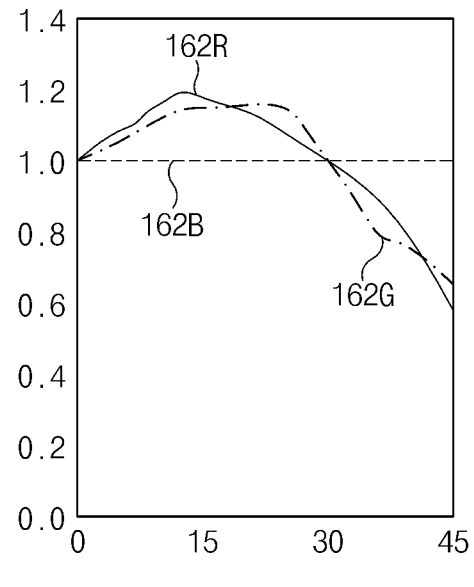

FIG. 12B is a view illustrating the second structure of the second type sub pixel and a viewing angle according thereto according to an embodiment of the disclosure.

Figure 12C:
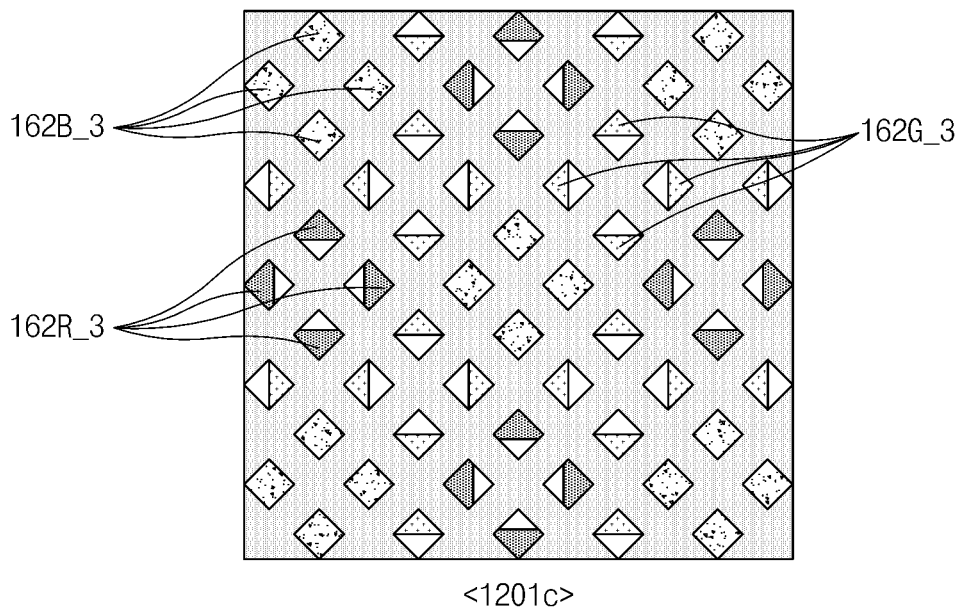
FIG. 12C is a view illustrating a third structure of a second type sub pixel and a viewing angle according thereto according to an embodiment of the disclosure.
Figure 12C:
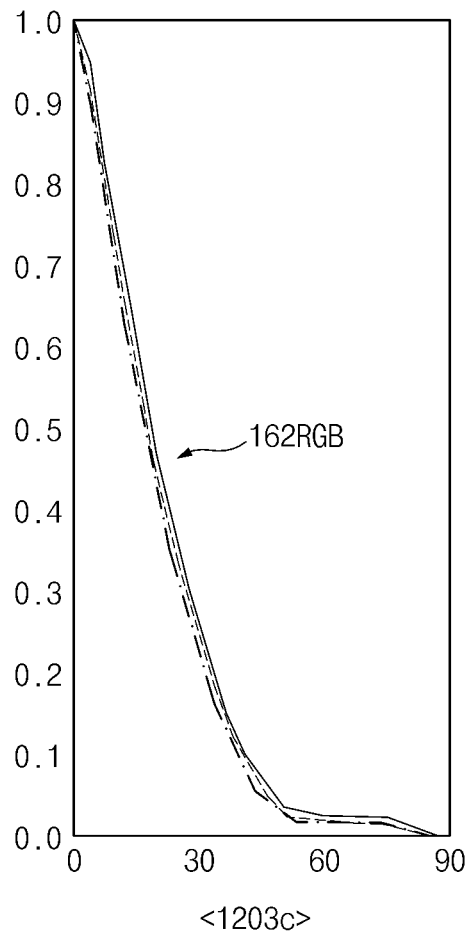
Figure 12C:
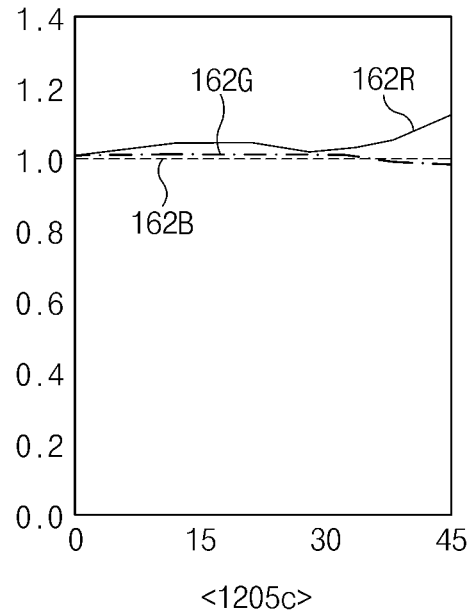

FIG. 12C is a view illustrating the third structure of the second type sub pixel and a viewing angle according thereto according to an embodiment of the disclosure.

Figure 12D:
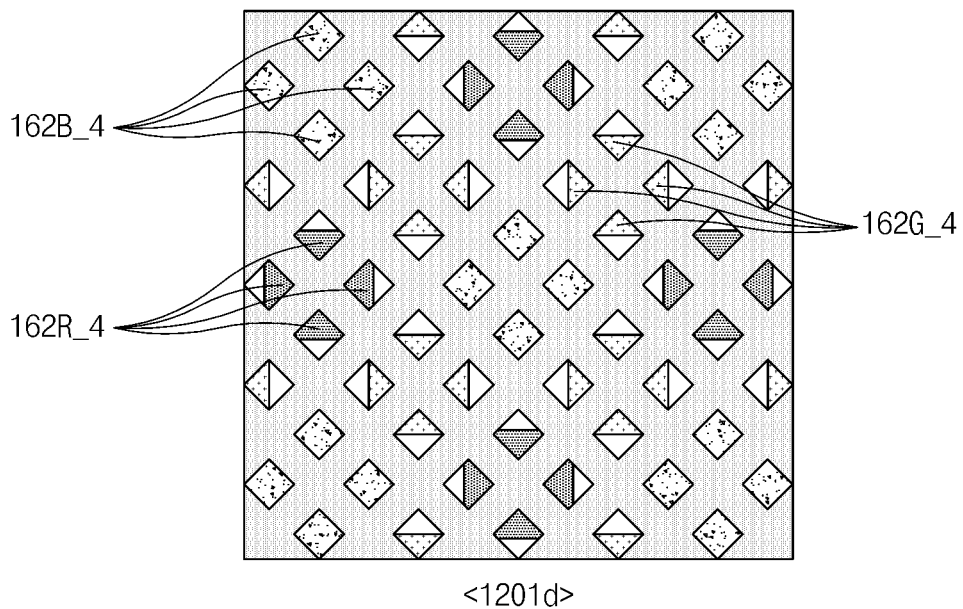
FIG. 12D is a view illustrating a first structure of a second type sub pixel and a viewing angle according thereto according to an embodiment of the disclosure.
Figure 12D:
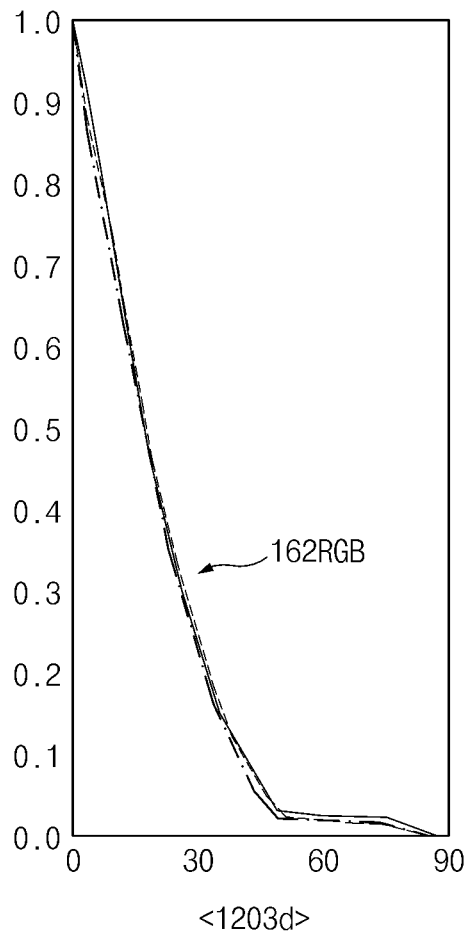
Figure 12D:
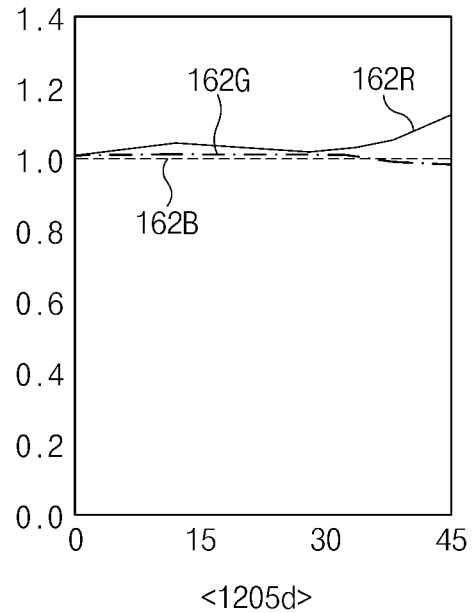

FIG. 12D is a view illustrating the first structure of the second type sub pixel and a viewing angle according thereto according to an embodiment of the disclosure.

Referring to FIG. 12A, as illustrated in the second type sub pixel structure 1201a of the first structure, when viewed in the first direction (e.g., a direction that is perpendicular to the front surface of the display 160), an opening area by the shield member and the light emitting area may coincide with each other, and separate pixel definition member may not be exposed to an outside. The second type sub pixel structure 1201a of the first structure may include the first blue sub pixel 162B_1, the second red sub pixel 162R_1, and the first green sub pixel 162G_1. The first blue sub pixel 162B_1 may include the first blue micro pixel 162B1, the second blue micro pixel 162B2, the third blue micro pixel 162B3, and/or the fourth blue micro pixel 162B4. The first type red sub pixel 162R_1 may include the first red micro pixel 162R1, the second red micro pixel 162R2, the third red micro pixel 162R3, and/or the fourth red micro pixel 162R4.

The first type green sub pixel 162G_1 may include the first green micro pixel 162G1, the second green micro pixel 162G2, the third green micro pixel 162G3, and/or the fourth green micro pixel 162G4. The light emitting areas of the above-described micro pixels may be aligned with the openings of the shield members.

It may be seen that in the second type sub pixel structure 1201a of the first structure, as denoted by 1203a, a change in the viewing angle of the first blue sub pixel 162B1 is gentler than a change in the viewing angle of the first red sub pixel 162R_1 and a change in the viewing angle of the first red sub pixel 162R_1 is gentler than a change in the viewing angle of the first green sub pixel 162G_1. Furthermore, it may be seen that, in the second type sub pixel structure of the first structure, as denoted by 1205a, a dependency of a radiation angle of the first blue sub pixel 162B_1 and radiation dependencies of the first red sub pixel 162R_1 and the first green sub pixel 162G_1 do not coincide with each other. Accordingly, when the second type sub pixel structure of the first structure is used, a change of color may appear differently according to an angle, at which the display 160 is viewed, and a screen defect accordingly may be recognized.

Referring to FIG. 12B, the structure of the second type sub pixel structure 1201b of the second structure may not coincide with an opening area by the shield member in the red sub pixel and the green sub pixel of the light emitting area when viewed in the first direction (e.g., the direction that is perpendicular to the front surface of the display 160) and may coincide with the opening area in the blue sub pixel. In the second type sub pixel structure 1201b of the second structure, the sizes of all of the opening areas by the shield members of the micro pixels may be the same or similar. The opening areas by the shield members of the blue micro pixels included in the second blue sub pixel 162B_2 and the light emitting area may be arranged with reference to the first direction, whereby the pixel definition members disposed in the blue micro pixels included in the second blue sub pixel 162B_2 may have a structure that is not exposed to an opening area. The opening areas by the shield members of the red micro pixels included in the second red sub pixel 162R_2 and the light emitting areas and the pixel definition members of the red micro pixels are arranged with reference to the first direction whereby partial areas of the pixel definition members of the first sizes of the red micro pixels may be exposed by the opening areas. The opening areas by the shield members of the green micro pixels included in the second green sub pixel 162G_1 and the light emitting areas and the pixel definition members of the green micro pixels may be arranged with reference to the first direction (a direction, in which the display is viewed from the front surface of the display), and partial areas of the pixel definition members of the second size (a size that is larger than the first size) of the green micro pixels may be exposed by the opening areas. With reference to the second red sub pixels 162R_2 and the green sub pixels 162G_2, the exposed pixel definition members may surround at least portions of peripheries of the sub pixels.

It may be seen that in the second type sub pixel structure 1201b of the second structure, as denoted by 1203b, a change in the viewing angles of the second blue sub pixels 162B_2, a change in the viewing angles of the second red sub pixels 162R_2, and a change in the viewing angles of the second green sub pixels 162B_2 show similar curves. Furthermore, it may be seen that in the second type sub pixel structure of the second structure, as denoted by 1205b, dependencies of the radiation angles of the second red sub pixels 162R_2 and the second green sub pixels 162G_2 substantially coincide with each other but dependencies of the radiation angles of the second blue sub pixels 162B_2 and dependencies of the radiation angles of the second red sub pixels 162R_2 and the second green sub pixels 162G_2 do not coincide with each other.

Referring to FIG. 12C, in the second type sub pixel structure 1201c of the third structure, when viewed in the first direction (e.g., a direction that is perpendicular to the front surface of the display 160), the third blue sub pixels 162B_3 may have a structure that is the same as or similar to that of the blue sub pixels described in FIG. 12A or 12B.

In the second type sub pixel structure 1201c of the third structure, the third green sub pixels 162G_3 may be disposed such that some light emitting areas and some pixel definition members are exposed through the opening areas by the shield members. For example, the green micro pixels included in the third green sub pixels 162G_3 may be disposed such that the light emitting area and the pixel definition members occupy half areas of the light emitting areas, respectively. The pixel definition members of the green micro pixels in the third green sub pixels 162G_3 may be disposed to be adjacent to each other at central portions of the green sub pixels.

The third red sub pixels 162R_3 may be disposed such that some light emitting areas and some pixel definition members may be exposed through the opening areas by the shield members. For example, the red micro pixels included in the third red sub pixels 162R_3 may be disposed such that the light emitting areas occupy areas that are larger than the pixel definition members. The pixel definition members of the green micro pixels in the third red sub pixels 162R_3 may be disposed to be adjacent to each other at central portions of the red sub pixels.

It may be seen that in the second type sub pixel structure 1201c of the third structure, as denoted by 1203c, a change in the viewing angles of the third blue sub pixels 162B_3, a change in the viewing angles of the third red sub pixels 162R_3, and a change in the viewing angles of the third green sub pixels 162G_2 show a very high similarity, as indicated by 162RGB. Furthermore, it may be seen that, in the second type sub pixel structure of the third structure, as denoted by 1205c, dependencies of radiation angles of the third blue sub pixel 162B, the third red sub pixel 162R, and the third green sub pixel 162G substantially coincide with each other.

Referring to FIG. 12D, in the second type sub pixel structure 1201d of the fourth structure, when viewed in the first direction (e.g., a direction that is perpendicular to the front surface of the display 160), the fourth blue sub pixels 162B_4 may have a structure that is the same as or similar to that of the blue sub pixels described in FIG. 12A or 12B.

The fourth green sub pixels 162G_4 may be disposed such that some light emitting areas and some pixel definition members may be exposed through the opening areas by the shield members. For example, the green micro pixels included in the fourth green sub pixels 162G_4 may be disposed such that the light emitting area and the pixel definition members occupy half areas of the light emitting areas, respectively. The light emitting areas of the green micro pixels in the fourth green sub pixels 162G_4 may be disposed to be adjacent to each other at central portions of the green sub pixels.

The fourth red sub pixels 162R_4 may be disposed such that some light emitting areas and some pixel definition members may be exposed through the opening areas by the shield members. For example, the red micro pixels included in the fourth red sub pixels 162R_4 may be disposed such that the light emitting areas occupy areas that are larger than the pixel definition members. The light emitting areas of the green micro pixels in the fourth red sub pixels 162R_4 may be disposed to be adjacent to each other at central portions of the red sub pixels.

It may be seen that in the second type sub pixel structure 1201d of the fourth structure, as denoted by 1203d, a change in the viewing angles of the fourth blue sub pixels 162B_4, a change in the viewing angles of the fourth red sub pixels 162R_4, and a change in the viewing angles of the fourth green sub pixels 162G_4 show a very high similarity, similarly to 1203c, as indicated by 162RGB. Furthermore, it may be seen that, in the second type sub pixel structure of the fourth structure, as denoted by 1205d, dependencies of radiation angles of the fourth blue sub pixel 162B, the fourth red sub pixel 162R, and the fourth green sub pixel 162G substantially coincide with each other, similarly to 1205c.

Figure 13:
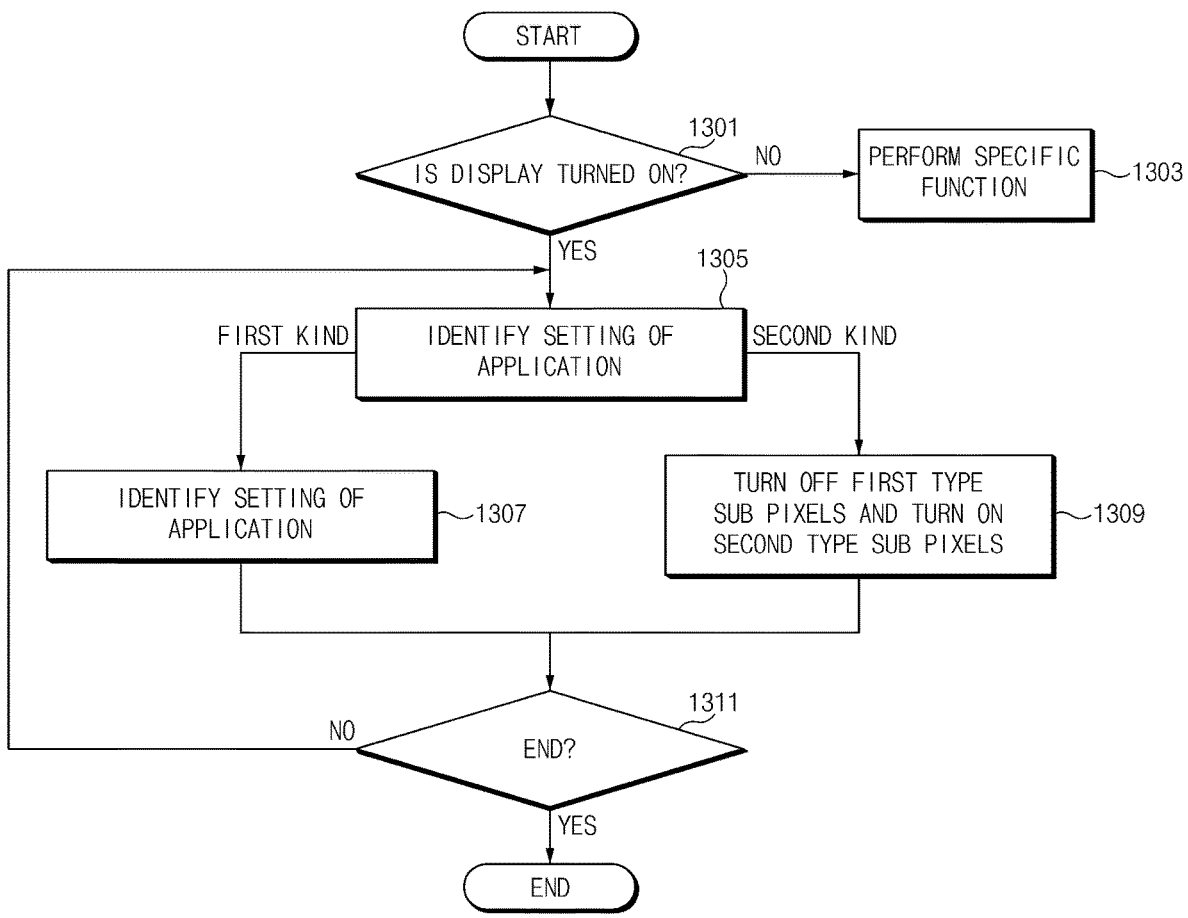
FIG. 13 is a view illustrating an example of a method for operating an electronic device according to an embodiment of the disclosure.

FIG. 13 is a view illustrating an example of a method for operating an electronic device according to an embodiment of the disclosure.

Referring to FIG. 13, the processor 150 of the electronic device 100 may identify whether the display 160 is turned on (or whether a turn-off state is changed to a turn-on state) in operation 1301.

In operation 1301, when the display 160 is not turned on (or is in a turn-off state), the processor 150 may control such that a specific function is performed in operation 1303. For example, the processor 150 may output an audio signal through background processing or support a voice communication function while maintaining the turn-off state of the display 160. Furthermore, the processor 150 may control such that sensor information is collected at a specific period or in real time by activating a sensor in the turn-off state.

When the display 1670 is in the turn-on state, then in operation 1305, the processor 150 may identify an application or setting (or setting information 141). For example, the processor 150 may identify a kind of an application that is requested to be executed. Furthermore, the processor 150 may identify which kind of setting is made, by identifying setting information related to the turn-on state of the display 160.

When a first kind is set (or execution of an application of a first kind is requested), then in operation 1307, the processor 140 may perform a control such that the first type sub pixels (161 of FIG. 1) (or a first type sub pixel set or a first type sub pixel group) and the second type sub pixels (162 of FIG. 1) (or a second type sub pixel set or a second type sub pixel group) are turned on. The first kind of application, may refer to a kind of application that may be operated regardless of an observation viewing angle by turning on the entire display 160. For example, the first kind of application may include an application that supports access to a portal webserver.

When a second kind is set (or execution of a second kind of application is requested) in operation 1305, then in operation 1309, the processor 150 may perform a control such that the first type sub pixels are turned off and the second type sub pixels are turned on. The second kind of application, for example, may mean a kind of application for making it difficult for a third person to observe the screen of the display 160 from a lateral side or preventing a third person from observing the screen of the display 160 according to an intention of a user by turning one some pixels (e.g., the second type sub pixels) that provide a relatively small observation viewing angle of the display 160. For example, the second kind of application may include applications that support execution of functions, such as access to a security channel, execution of a gallery, and writing of a message.

In operation 1311, the processor 150 may identify whether an event related to ending of an operation of the display 160 occurs. When there no event related to ending of an operation of the display 160, the processor 150 branches to an operation before operation 1305 to perform the following operations again or to maintain the previous state (e.g., operation 1307 or operation 1309).

The above-described embodiments of the disclosure help to selectively operate a private mode and a general mode. Furthermore, the embodiments of the disclosure may provide narrow viewing angle OLED pixels (or sub pixels or micro pixels) in relation to an operation of the private mode, and help watch the display without reduction of luminance by preventing the luminance (or brightness) at a general viewing angle and the brightness of at a narrow viewing angle from being influenced in a direction that is perpendicular the front surface of the display. The embodiments of the disclosure may provide narrow viewing angle functions of four directions in the operation of the private mode, and thus may provide an effective viewing angle shutting function in a landscape mode or a portrait mode. Because the embodiments of the disclosure are compatible with an AMOLED Y-OCTA technology, an optical block layer (e.g., a BM or a metal) is compatible with an AMLED application technology, and a panel may be generated without an additional increase of a thickness of the panel. Furthermore, when a micro pixel structure of any one of FIG. 12B to 12D described above is applied, the screen may be watched without causing a problem, such as color shifting, and brightness or luminance may be maintained at a specific value or more.

As described above, a display device including an organic light emitting display (OLED) panel according to an embodiment of the disclosure may include a pixel layer, in which OLED pixels corresponding to a plurality of pixels are disposed, and an encapsulation layer that encapsulates the pixel layer with no air gap, in the pixel layer, the plurality of pixels including sub pixels of three colors of red (R), green (G), and blue (B) may include a first pixel group, and a second pixel group having a viewing angle that is smaller than a viewing angle of the first pixel group, a shield member disposed on at least one surface of the encapsulation layer may form a plurality of openings, at least one sub pixel included in the second pixel group may be divided by, among the plurality of openings, at least two openings, and the pixels of the first pixel group and the second pixel group may be driven in a general mode, and the pixels of the second pixel group may be driven in a narrow viewing angle mode whereby a screen is displayed at a narrow viewing angle that is narrower than that in the general mode.

The plurality of openings of the shield member may have substantially the same width.

Partial areas of the sub pixels of the second pixel group, which are covered by the shield member between two or more openings may include an area, in which some of the sub pixels do not emit light due to disposition of a pixel definition member.

The pixel definition member may be aligned with the shield member (e.g., arranged perpendicularly to the first direction, in which the display is viewed from the front surface of the display), and a width of the pixel definition member may be formed to be larger than a width of the shield member between the two or more openings whereby some of the sub pixels that do not emit light are included in the plurality of openings The display may further include at least one processor related to driving of the pixel layer, and the processor may perform a control such that the pixels of the first pixel group is turned off or is displayed with a color of a specific gradation value in the narrow viewing angle mode.

The processor may perform a control to adjust the specific gradation value according to adjustment of brightness.

The processor may set a shadow rate of the first pixel group in the narrow viewing angle mode to a shadow rate of the first pixel group in the general mode.

As described above, a display device according to an embodiment of the disclosure may include a display including a plurality of pixels, each of a plurality of pixels may include a plurality of sub pixels, and the plurality of sub pixels may include first type sub pixels observed at a first viewing angle, and second type sub pixels observed at a second viewing angle that is narrower than the first viewing angle.

The first type sub pixels may include pixel definition members surrounding at least portions of peripheries of the sub pixels, and the second type sub pixels may include additional definition members dividing areas of the sub pixels into a plurality of micro pixels.

The display device may further include an encapsulation layer covering the plurality of micro pixels, a light transmission protecting layer covering at least a portion of the encapsulation layer, and a shield member disposed between the encapsulation layer and the light transmission protecting layer, and the shield member may include a first shield member arranged in correspondence to the pixel definition members of the first type sub pixels, a second shield member arranged in correspondence to peripheries of the second type sub pixels, and a third shield member arranged in correspondence to the additional pixel definition members.

The display device may include a plurality of openings formed by the second shield member and the third shield member, and the plurality of openings may have the same size.

The sizes of the light emission areas of the micro pixels observed through the plurality of openings may be different for colors (e.g., red, green, blue).

The sizes of light emission areas of, among the micro pixels observed through the plurality of openings, blue micro pixels may be larger than sizes of light emission areas of red micro pixels, and the sizes of the light emission areas of the red micro pixels are larger than sizes of light emission areas of green micro pixels, and A sum of the sizes of the light emission areas of the micro pixels observed through the plurality of openings may be the same as or similar to sizes of light emission areas for colors of the first type sub pixels.

The sizes of the additional pixel definition members observed through the plurality of openings may be different for colors.

The sizes of the additional pixel definition members observed through the openings corresponding to the green micro pixels may be larger than the sizes of the pixel definition members observed through the openings corresponding to the red micro pixels.

The additional pixel definition members observed through the plurality of openings may have a stripe shape.

A size of the pixel definition member that is adjacent to the second type sub pixels and a size of the additional pixel definition member may be different.

The micro pixels for colors may be driven by one anode electrode.

The display device may further include a third type sub pixel having an observation viewing angle that is narrower than that of the first type sub pixels and is wider than that of the second type sub pixels.

A width of the shield member disposed around the third type sub pixels may be smaller than a width of the shield member disposed around the second type sub pixels.

A sum of sizes of the micro pixels of the second type sub pixels for colors may be larger than the sizes of the sub pixels of the first type sub pixels for colors, and The number of the micro pixels included in the second type sub pixels may be two or four.

As described above, a method for driving a display device including an organic light emitting display (OLED) according to an embodiment of the disclosure may include identifying a turn-on state of a display, identifying a kind of an application that is to be executed when a turn-on of the display is requested, and simultaneously turning on a first type sub pixel that irradiates light at a first viewing angle to the display when a kind of an application is of a first kind and a second type sub pixel that irradiates light at a second viewing angle that is smaller than the first viewing angle to output a screen on the display.

The method may further turning off the first type sub pixels or display a specific gradation value when the kind of the application is of the second type, and outputting the screen on the display by turning on the second type sub pixels.

Figure 14:
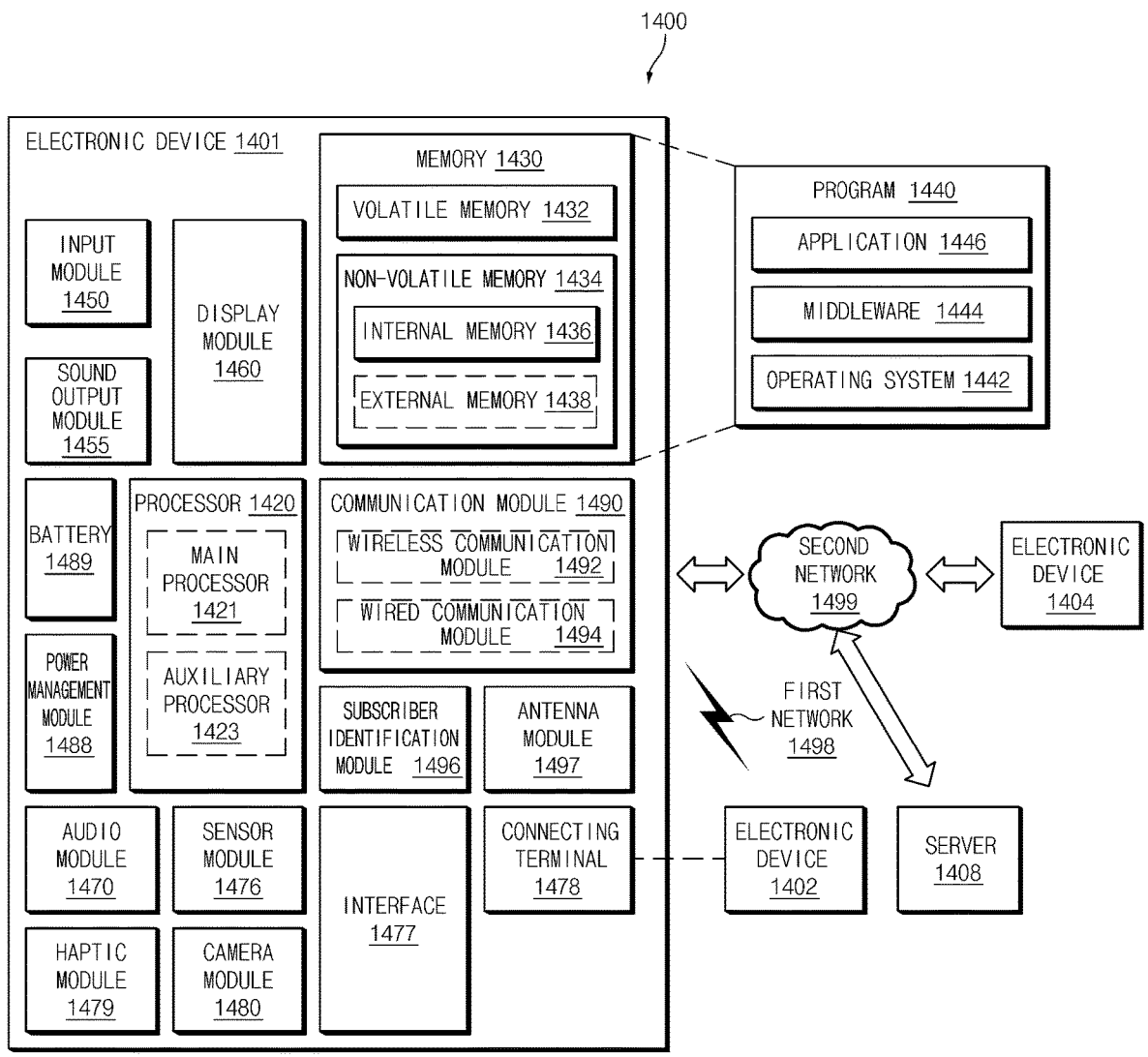
FIG. 14 is a block diagram of an electronic device 1401 in a network environment 1400 according to an embodiment of the disclosure.

FIG. 14 is a block diagram illustrating an electronic device 1401 in a network environment 1400 according to an embodiment of the disclosure.

Referring to FIG. 14, the electronic device 1401 in the network environment 1400 may communicate with an electronic device 1402 via a first network 1498 (e.g., a short-range wireless communication network), or at least one of an electronic device 1404 or a server 1408 via a second network 1499 (e.g., a long-range wireless communication network). According to an embodiment, the electronic device 1401 may communicate with the electronic device 1404 via the server 1408. According to an embodiment, the electronic device 1401 may include a processor 1420, memory 1430, an input module 1450, a sound output module 1455, a display module 1460, an audio module 1470, a sensor module 1476, an interface 1477, a connecting terminal 1478, a haptic module 1479, a camera module 1480, a power management module 1488, a battery 1489, a communication module 1490, a subscriber identification module (SIM) 1496, or an antenna module 1497. In some embodiments, at least one of the components (e.g., the connecting terminal 1478) may be omitted from the electronic device 1401, or one or more other components may be added in the electronic device 1401. In some embodiments, some of the components (e.g., the sensor module 1476, the camera module 1480, or the antenna module 1497) may be implemented as a single component (e.g., the display module 1460).

The processor 1420 may execute, for example, software (e.g., a program 1440) to control at least one other component (e.g., a hardware or software component) of the electronic device 1401 coupled with the processor 1420, and may perform various data processing or computation. According to one embodiment, as at least part of the data processing or computation, the processor 1420 may store a command or data received from another component (e.g., the sensor module 1476 or the communication module 1490) in volatile memory 1432, process the command or the data stored in the volatile memory 1432, and store resulting data in non-volatile memory 1434. According to an embodiment, the processor 1420 may include a main processor 1421 (e.g., a central processing unit (CPU) or an application processor (AP)), or an auxiliary processor 1423 (e.g., a graphics processing unit (GPU), a neural processing unit (NPU), an image signal processor (ISP), a sensor hub processor, or a communication processor (CP)) that is operable independently from, or in conjunction with, the main processor 1421. For example, when the electronic device 1401 includes the main processor 1421 and the auxiliary processor 1423, the auxiliary processor 1423 may be adapted to consume less power than the main processor 1421, or to be specific to a specified function. The auxiliary processor 1423 may be implemented as separate from, or as part of the main processor 1421.

The auxiliary processor 1423 may control at least some of functions or states related to at least one component (e.g., the display module 1460, the sensor module 1476, or the communication module 1490) among the components of the electronic device 1401, instead of the main processor 1421 while the main processor 1421 is in an inactive (e.g., sleep) state, or together with the main processor 1421 while the main processor 1421 is in an active state (e.g., executing an application). According to an embodiment, the auxiliary processor 1423 (e.g., an image signal processor or a communication processor) may be implemented as part of another component (e.g., the camera module 1480 or the communication module 1490) functionally related to the auxiliary processor 1423. According to an embodiment, the auxiliary processor 1423 (e.g., the neural processing unit) may include a hardware structure specified for artificial intelligence model processing. An artificial intelligence model may be generated by machine learning. Such learning may be performed, e.g., by the electronic device 1401 where the artificial intelligence is performed or via a separate server (e.g., the server 1408). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 1430 may store various data used by at least one component (e.g., the processor 1420 or the sensor module 1476) of the electronic device 1401. The various data may include, for example, software (e.g., the program 1440) and input data or output data for a command related thereto. The memory 1430 may include the volatile memory 1432 or the non-volatile memory 1434.

The program 1440 may be stored in the memory 1430 as software, and may include, for example, an operating system (OS) 1442, middleware 1444, or an application 1446.

The input module 1450 may receive a command or data to be used by another component (e.g., the processor 1420) of the electronic device 1401, from the outside (e.g., a user) of the electronic device 1401. The input module 1450 may include, for example, a microphone, a mouse, a keyboard, a key (e.g., a button), or a digital pen (e.g., a stylus pen).

The sound output module 1455 may output sound signals to the outside of the electronic device 1401. The sound output module 1455 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 1460 may visually provide information to the outside (e.g., a user) of the electronic device 1401. The display module 1460 may include, for example, a display, a hologram device, or a projector and control circuitry to control a corresponding one of the display, hologram device, and projector. According to an embodiment, the display module 1460 may include a touch sensor adapted to detect a touch, or a pressure sensor adapted to measure the intensity of force incurred by the touch.

The audio module 1470 may convert a sound into an electrical signal and vice versa. According to an embodiment, the audio module 1470 may obtain the sound via the input module 1450, or output the sound via the sound output module 1455 or a headphone of an external electronic device (e.g., an electronic device 1402) directly (e.g., wiredly) or wirelessly coupled with the electronic device 1401.

The sensor module 1476 may detect an operational state (e.g., power or temperature) of the electronic device 1401 or an environmental state (e.g., a state of a user) external to the electronic device 1401, and then generate an electrical signal or data value corresponding to the detected state. According to an embodiment, the sensor module 1476 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 1477 may support one or more specified protocols to be used for the electronic device 1401 to be coupled with the external electronic device (e.g., the electronic device 1402) directly (e.g., wiredly) or wirelessly. According to an embodiment, the interface 1477 may include, for example, a high definition multimedia interface (HDMI), a universal serial bus (USB) interface, a secure digital (SD) card interface, or an audio interface.

A connecting terminal 1478 may include a connector via which the electronic device 1401 may be physically connected with the external electronic device (e.g., the electronic device 1402). According to an embodiment, the connecting terminal 1478 may include, for example, a HDMI connector, a USB connector, a SD card connector, or an audio connector (e.g., a headphone connector).

The haptic module 1479 may convert an electrical signal into a mechanical stimulus (e.g., a vibration or a movement) or electrical stimulus which may be recognized by a user via his tactile sensation or kinesthetic sensation. According to an embodiment, the haptic module 1479 may include, for example, a motor, a piezoelectric element, or an electric stimulator.

The camera module 1480 may capture a still image or moving images. According to an embodiment, the camera module 1480 may include one or more lenses, image sensors, image signal processors, or flashes.

The power management module 1488 may manage power supplied to the electronic device 1401. According to one embodiment, the power management module 1488 may be implemented as at least part of, for example, a power management integrated circuit (PMIC).

The battery 1489 may supply power to at least one component of the electronic device 1401. According to an embodiment, the battery 1489 may include, for example, a primary cell which is not rechargeable, a secondary cell which is rechargeable, or a fuel cell.

The communication module 1490 may support establishing a direct (e.g., wired) communication channel or a wireless communication channel between the electronic device 1401 and the external electronic device (e.g., the electronic device 1402, the electronic device 1404, or the server 1408) and performing communication via the established communication channel. The communication module 1490 may include one or more communication processors that are operable independently from the processor 1420 (e.g., the application processor (AP)) and supports a direct (e.g., wired) communication or a wireless communication. According to an embodiment, the communication module 1490 may include a wireless communication module 1492 (e.g., a cellular communication module, a short-range wireless communication module, or a global navigation satellite system (GNSS) communication module) or a wired communication module 1494 (e.g., a local area network (LAN) communication module or a power line communication (PLC) module). A corresponding one of these communication modules may communicate with the external electronic device via the first network 1498 (e.g., a short-range communication network, such as Bluetooth™, wireless-fidelity (Wi-Fi) direct, or infrared data association (IrDA)) or the second network 1499 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 1492 may identify and authenticate the electronic device 1401 in a communication network, such as the first network 1498 or the second network 1499, using subscriber information (e.g., international mobile subscriber identity (IMSI)) stored in the subscriber identification module 1496.

The wireless communication module 1492 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 1492 may support a high-frequency band (e.g., the mmWave band) to achieve, e.g., a high data transmission rate. The wireless communication module 1492 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 1492 may support various requirements specified in the electronic device 1401, an external electronic device (e.g., the electronic device 1404), or a network system (e.g., the second network 1499). According to an embodiment, the wireless communication module 1492 may support a peak data rate (e.g., 20 Gbps or more) for implementing eMBB, loss coverage (e.g., 1464 dB or less) for implementing mMTC, or U-plane latency (e.g., 0.5 ms or less for each of downlink (DL) and uplink (UL), or a round trip of 14 ms or less) for implementing URLLC.

The antenna module 1497 may transmit or receive a signal or power to or from the outside (e.g., the external electronic device) of the electronic device 1401. According to an embodiment, the antenna module 1497 may include an antenna including a radiating element composed of a conductive material or a conductive pattern formed in or on a substrate (e.g., a printed circuit board (PCB)). According to an embodiment, the antenna module 1497 may include a plurality of antennas (e.g., array antennas). In such a case, at least one antenna appropriate for a communication scheme used in the communication network, such as the first network 1498 or the second network 1499, may be selected, for example, by the communication module 1490 (e.g., the wireless communication module 1492) from the plurality of antennas. The signal or the power may then be transmitted or received between the communication module 1490 and the external electronic device via the selected at least one antenna. According to an embodiment, another component (e.g., a radio frequency integrated circuit (RFIC)) other than the radiating element may be additionally formed as part of the antenna module 1497.

According to various embodiments, the antenna module 1497 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 1401 and the external electronic device 1404 via the server 1408 coupled with the second network 1499. Each of the electronic devices 1402 or 1404 may be a device of a same type as, or a different type, from the electronic device 1401. According to an embodiment, all or some of operations to be executed at the electronic device 1401 may be executed at one or more of the external electronic devices 1402, 1404, or 1408. For example, if the electronic device 1401 should perform a function or a service automatically, or in response to a request from a user or another device, the electronic device 1401, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 1401. The electronic device 1401 may provide the outcome, with or without further processing of the outcome, as at least part of a reply to the request. To that end, a cloud computing, distributed computing, mobile edge computing (MEC), or client-server computing technology may be used, for example. The electronic device 1401 may provide ultra low-latency services using, e.g., distributed computing or mobile edge computing. In another embodiment, the external electronic device 1404 may include an internet-of-things (IoT) device. The server 1408 may be an intelligent server using machine learning and/or a neural network. According to an embodiment, the external electronic device 1404 or the server 1408 may be included in the second network 1499. The electronic device 1401 may be applied to intelligent services (e.g., smart home, smart city, smart car, or healthcare) based on 5G communication technology or IoT-related technology.

Figure 15A:
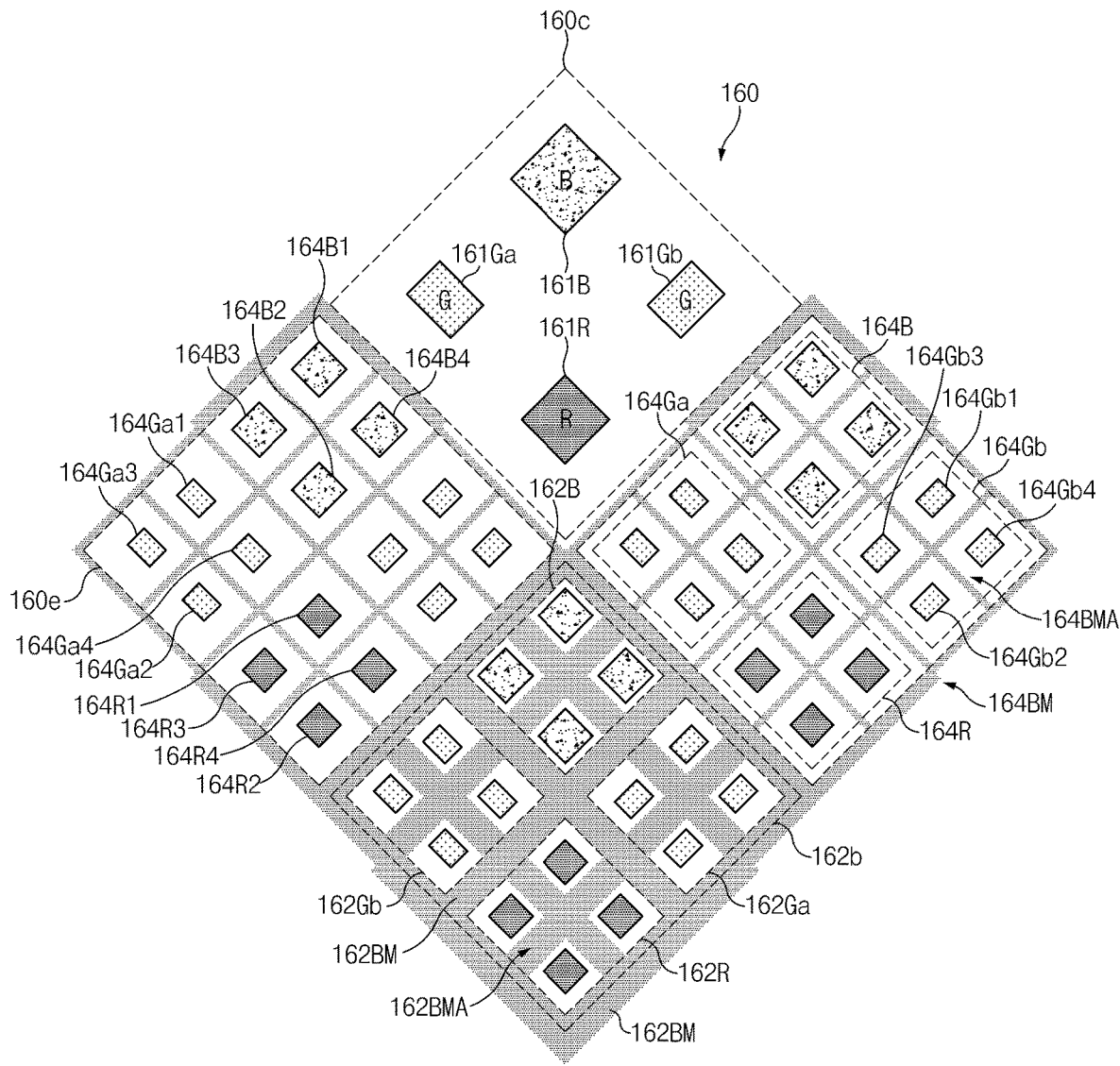
FIG. 15A is a view illustrating an example of a display, in which a plurality of types of sub pixels are disposed, according to an embodiment of the disclosure.

FIG. 15A is a view illustrating an example of the display, in which a plurality of types of sub pixels are disposed, according to an embodiment of the disclosure.

Figure 15B:
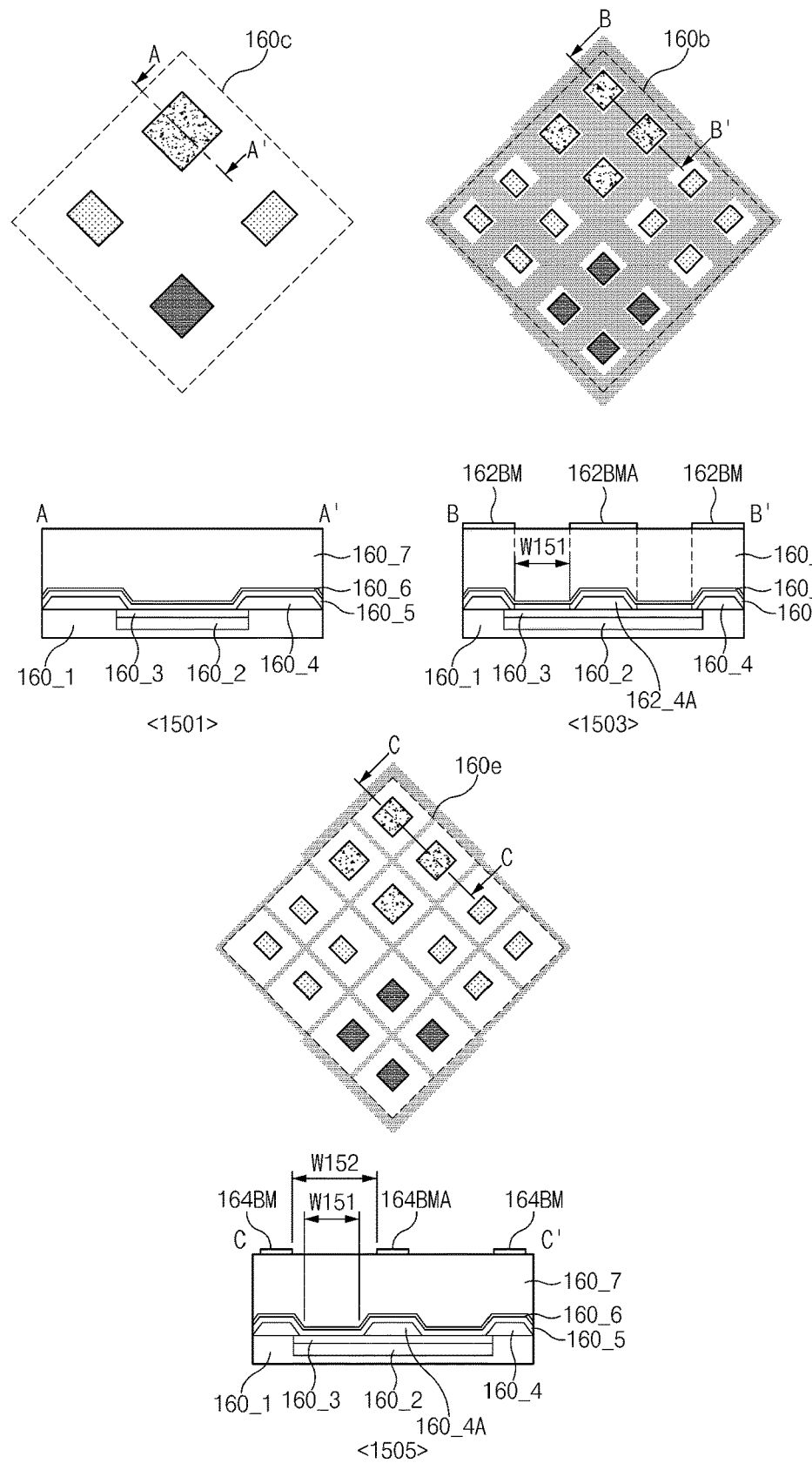
FIG. 15B is a view illustrating an example of structures of pixels for types described in FIG. 15A according to an embodiment of the disclosure.

FIG. 15B is a view illustrating an example of structures of pixels for types described in FIG. 15A according to an embodiment of the disclosure.

Referring to FIGS. 2A, 2B, and 15A, in the display 160, the modified first type pixel 160c, the second type pixel 160b, and the fourth type pixel 160e may be alternately disposed. According to an embodiment, a disposition ratio of the modified first type pixel 160c, the second type pixel 160b, and the fourth type pixel 160e may be the same (e.g., 1:1:1) or be different (e.g., 1:2:2, 1:2:2, or 2:1:2). The modified first type pixel 160c may include the same pixel as the modified first type pixel 160c described above in FIG. 2A or 2B. For example, the modified first type pixel 160c may include a structure, in which the first type sub pixels 161B, 161R, 161Ga, 161Gb are disposed in an area, in which no shield member is disposed. According to various embodiments, in replacement of the modified first type pixel 160c, the first type pixel 160a described above in FIG. 2A may be applied. Electrodes (e.g., anode electrodes) of all the pixels disposed in the display 160 may have the same area or size, and a viewing angle thereof may be adjusted by the shield members. For example, the pixel electrodes (e.g., the anode electrodes) may have the same size, and are repeatedly divided each by four, and through adjustment of the width of the shield members, the modified first type pixel 160c (or the first type pixel), the second type pixel 160b, and the fourth type pixel 160e may be made.

The second type pixel 160b may be the same pixel as the second type pixel 160b described above in FIG. 2B. For example, the second type pixel 160b may include the second type sub pixels 162B, 162R, 162Ga, and 162Gb, and the second type sub pixels 162B, 162R, 162Ga, and 162Gb may include the second type red sub pixel 162R corresponding to the first to fourth red micro pixels 162R1, 162R2, 162R3, and 162R4, the second type blue sub pixel 162B corresponding to the first to fourth red micro pixels 162B1, 162B2, 162B3, and 162B4, and the second type green sub pixels 162R corresponding to the first to fourth green micro pixels 162G1, 162G2, 162G3, and 162G4. The second type pixel 160b may further include the shield members 162BM positioned between the second type sub pixels 162B, 162R, 162Ga, and 162Gb, and the shield members 162BMA positioned between the micro pixels, and the shield members 162BM positioned at peripheries of the second type sub pixels 162B, 162R, 162Ga, and 162Gb.

The fourth type pixel 160e may structurally have the same pixel structure as the second type pixel 160b, except for the shield members. For example, the fourth type sub pixels 164B, 164R, 164Ga, and 164Gb may include the fourth type red sub pixels 164R corresponding to the first to fourth red micro pixels 164R1, 164R2, 164R3, and 164R4, the fourth type blue sub pixels 164R corresponding to the first to fourth blue micro pixels 164B1, 164B2, 164B3, and 164B4, and the fourth type green sub pixels 164Ga and 164Gb corresponding to the first to fourth green micro pixels 164Ga1, 164Ga2, 164Ga3, 164Ga4 and 164Gb1, 164Gb2, 164Gb3, and 164Gb4. The fourth type red sub pixel 164R may have the same structure as the second type red sub pixel 162R, the fourth type blue sub pixel 164B may have the same structure as the second type blue sub pixel 162B, and the fourth type green sub pixels 164Ga and 164Gb may have the same structure as the second type green sub pixel 162Ga and 162Gb. Unlike the second type pixel 160b, in the fourth type pixel 160e, the sizes of the shield members positioned between the fourth type sub pixels 164B, 164R, 164Ga, and 164Gb may be different. The areas (or widths) of the shield members positioned between the fourth type sub pixels 164B, 164R, 164Ga, and 164Gb may be smaller than the areas (or widths) of the shield members positioned between the second type pixels 162B, 162R, 162Ga, and 162Gb.

Referring to FIGS. 3A and 15B, as shown in 1501, the first type sub pixels (e.g., 161B, 161R, 161Ga, and 161Gb) included in the modified first type pixel 160c may include the substrate part 160_1, the semiconductor layer 160_2, the first electrode 160_3 (e.g., an anode), the pixel definition member 160_4, the organic light emitting layer 160_5, the second electrode 160_6 (e.g., a cathode), and the encapsulation layer 160_7. Additionally or alternatively, the light transmission protecting layer may be disposed on the encapsulation layer 160_7 of the first type sub pixel.

Referring to FIGS. 3B and 15B, as shown in 1503, the second type sub pixels (e.g., 162B, 162R, 162Ga, and 162Gb) included in the second type pixel 160b may include the substrate part 162_1, the semiconductor layer 162_2, the first electrode 160_3 (e.g., an anode), the pixel definition member 162_4, the organic light emitting layer 160_5, the second electrode 160_6 (e.g., a cathode), the encapsulation layer 160_7, the second shield member 162BM, and the third shield member 162BMA. Although not illustrated, an additional shield member may be disposed at an upper end of the pixel definition member 160_4. The additional shield member may be disposed between the pixel definition member 160_4 and the different shield members 162BM and 162BMA or 164BM and 164BMA. In this regard, the encapsulation layer 160_7 may include a plurality of layers, and the additional shield member may be disposed in a layer of at least one of the plurality of layers of the encapsulation layer 160_7 and may be at least partially aligned with the pixel definition member 160_4 (or 162_4A and 160_4A) in the upward/downward direction (e.g., a direction, in which the light of the display is irradiated or the direction that is perpendicular to the illustrated drawing). The additional shield member may be spaced apart from the pixel definition member 160_4, 16-_4A, and 162_4 in the vertical direction, and may be disposed to be spaced apart from another shield member (e.g., 162BM and 162BMA or 164BM and 164BMA) by a specific distance in the upward/downward direction. Additionally or alternatively, the light transmission protecting layer may be disposed on the encapsulation layer 160_7 of the second type sub pixel. Accordingly, the second shield member 162BM and the third shield member 162BMA may be disposed between the encapsulation layer 160_7 and the light transmission protecting layer. An interval between the second shield member 162BM and the third shield member 162BMA, for example, may be a first length W151. The second type sub pixel may irradiate the light through a rectangular opening (an opening, through which the light passes, and the opening may be filled with an insulation material or may be filled with at least a portion of the color filter), one length of which is a first length W151). The first length W151 may correspond to lengths of sides of the light emitting areas of the second type sub pixels.

Referring to FIG. 15B, as shown in 1505, the fourth type sub pixels (e.g., 164B, 164R, 164Ga, and 164Gb) included in the fourth type pixel 160e may include the substrate part 160_1, the semiconductor layer 160_2, the first electrode 160_3 (e.g., an anode), the pixel definition member 160_4, the additional pixel definition member 160_4A, the organic light emitting layer 160_5, the second electrode 160_6 (e.g., a cathode), the encapsulation layer 160_7, the fourth shield member 164BM, and the fifth shield member 164BMA. Although not illustrated, an additional shield member may be disposed between an upper end of the pixel definition member 160_4 and the shield members (e.g., 164BM and 164BMA). Additionally or alternatively, the light transmission protecting layer may be further disposed on the encapsulation layer 160_7 of the fourth type sub pixels (e.g., 164B, 164R, 164Ga, and 164Gb). Accordingly, the fourth shield member 164BM and the fifth shield member 164BMA may be disposed between the encapsulation layer 160_7 and the light transmission protecting layer. The fourth shield member 164BM may have a width that is smaller than that of the second shield member 162BM described above. The fifth shield member 164BMA may have a width that is smaller than that of the third shield member 162BMA. An interval between the fourth shield member 164BM and the fifth shield member 164BMA, for example, may be a second length W152. The fourth type sub pixel (e.g., 164B, 164R, 164Ga, and 164Gb) may irradiate the light through a rectangular opening (e.g., an opening, through which the light passes, and the opening may be filled with an insulation material), one length of which is a second length W152. Sides of the light emitting areas of the fourth type sub pixels (e.g., 164B, 164R, 164Ga, and 164Gb) may be a first length W151. As described above, the fourth type sub pixels (e.g., 164B, 164R, 164Ga, and 164Gb) may irradiate the light through a relatively large opening as compared with those of the second type sub pixels (e.g., 162B, 162R, 162Ga, and 162Gb). Accordingly, the fourth type sub pixels (e.g., 164B, 164R, 164Ga, and 164Gb) may show a relatively high luminance at a specific angle (e.g., when an angle, at which the display is viewed at an angle that is perpendicular to the front surface thereof, is 90 degrees and an angle, at which the display is viewed from a side surface of the display at an angle that is parallel to the display, is 0 degrees, between an angle that is larger than 0 degrees and smaller than 90 degrees) viewed from a lateral side as compared with the second type sub pixels 162B, 162R, 162Ga, and 162Gb. The second shield member 162BM and the third shield member 162BM may have sizes that are the same as or similar to those of the pixel definition member 160_4a and the additional pixel definition member 162_4A. According to various embodiments, the fourth shield member 164BM and the fifth shield member 164BMA may have widths that are larger than the pixel definition member 160_4 and the additional pixel definition member 160_4A.

In the display 160, in which the modified first type pixel 160c, the second type pixel 160b, and the fourth type pixel 160e are distributed at a specific ratio, all of the modified first type pixel 160c, the second type pixel 160b, and the fourth type pixel 160e may be turned on to be driven in the general mode, and some of the modified first type pixel 160c, the second type pixel 160b, and the fourth type pixel 160e may be turned on in the private mode (or the narrow viewing angle mode). For example, the electronic device 100 may support the private mode by turning on, among the modified first type pixel 160c, the second type pixel 160b, and the fourth type pixel 160e, the remaining pixels, except for the modified first type pixel 160c. The electronic device 100 may support the private mode by turning off, among the pixels disposed in the display 160, some of the first type pixels 160c and the fourth type pixels 160e and turning on the remaining fourth type pixels 160e and the second type pixels 160b. The electronic device 100 may change turn-on and turn-off of some areas of the fourth type pixels according to a specific time period or a kind of an application that is executed. For example, when the private mode is supported, the electronic device 100 may perform a control such that the first area of the fourth type pixel 160e is turned on and the second area of the fourth type pixel 160e is turned off while the turn-of state of the second type pixel 160b is maintained. The electronic device 100 may control such that only the fourth type pixel 160e is turned on and the modified first type pixel 160c and the second type pixel 160b are turned off according to setting by the user or a kind of an application. Alternatively, the electronic device 100 may control such that only the second type pixel 160b is turned on and the modified first type pixel 160c and the fourth type pixel 160e are turned off according to setting by the user or a kind of an application. Through the above-described control, the electronic device 100 of the disclosure may help improve a relatively high luminance performance and a life span as compared with the private mode using only the second type pixel 160b. Furthermore, the electronic device 100 of the disclosure may improve a visibility of content by increasing luminance performance if necessary while increasing an viewing angle control performance for contents, of which a security is relatively high or which the user does not desire to show a third person, by adaptively adjusting the viewing angle and the luminance according to a kind of an application or setting by the user. The electronic device 100 may support improvement of control of a viewing angle and a visibility by making the kinds of the pixels that are turned on and turned off adaptively different according to setting of time (e.g., the day or the night) or setting of an intensity of illumination.

Figure 16:
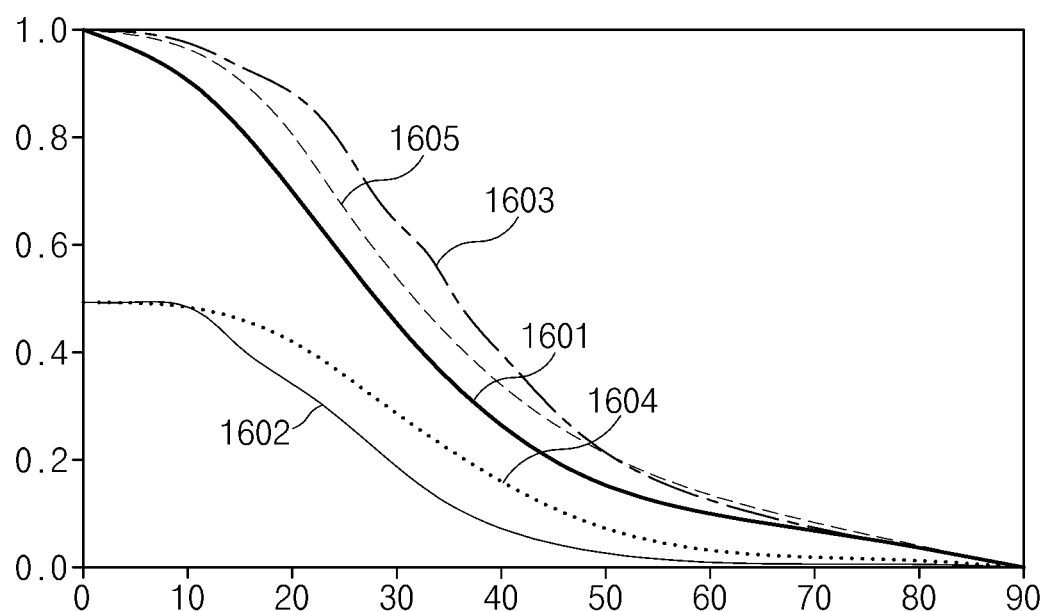
FIG. 16 is a view illustrating luminance characteristics for viewing angles of pixel structures according to an embodiment of the disclosure.

FIG. 16 is a view illustrating luminance characteristics for viewing angles of pixel structures according to an embodiment of the disclosure.

Referring to FIGS. 2A, 2B, and 16, curve 1601 shows luminance characteristics of the general mode of the display 160 including the first type pixel 160a or the modified first type pixels 160c and the second type pixel 160b, which have been described above in FIGS. 2A and 2B. In the drawings, the transverse axis relates to an angle, at which the display 160 is viewed, and 0 may mean a direction that is perpendicular to the front surface of the display 160 and 90 may mean a direction that is parallel to the front surface of the display 160. When the front surface of the display 160 is viewed perpendicularly, the luminance may be observed to be 0.0 when the display 160 is viewed in parallel from the side surface with respect to the front surface when the luminance in a state, in which both of the first type pixels 160c and the second type pixels 160b are turned on.

Curve 1602 shows luminance characteristics when only the second type pixels 160b are turned on according to execution of the private mode described in FIG. 2A or 2B. The luminance characteristics may be observed to be 0.5 when the first type pixels 160a are turned off and the second type pixels 160b are turned on according to execution of the private mode in a state, in which the first type pixels 160 and the second type pixels 160b are disposed in the display 160 at a ratio of 50:50. As illustrated, in the private mode, it becomes difficult to observe the screen of the display 160 from a lateral side as the luminance is rapidly decreased from 30 degrees or more with respect to the direction that is perpendicular to the front surface of the display whereby a lateral field of view become narrower and the screen of the display 160 may be prevented from being viewed.

Curve 1603 is a view illustrating luminance characteristics in an environment, in which the display 160, in which the first type pixels 160a, the second type pixels 160b, and the fourth type pixels 160e described in FIG. 15A are disposed, supports the general mode. For example, curve 1603 illustrates luminance characteristics of the display 160 in a state, in which all of the first type pixels 160a, the second type pixels 160b, and the fourth type pixels 160e are turned on. It may be seen that relatively improved luminance characteristics are shown as they go laterally with respect to a direction that is perpendicular to the front surface of the display 160 as compared with curve 1601.

Curve 1604 is a view illustrating luminance characteristics in the private mode in the display 160, in which the first type pixels 160a, the second type pixels 160b, and the fourth type pixels 160e described in FIG. 15A are disposed. It may be seen that relatively improved luminance characteristics are shown as compared with curve 1602 from an angle of 10 degrees or more in a lateral direction with respect to the perpendicular direction that faces the front surface of the display 160 when the first type pixels 160a are turned off and the second type pixels 160b and the fourth pixels 160e are turned on in the display, in which the first type pixels 160a, the second type pixels 160b, and the fourth type pixels 160e are disposed.

Curve 1605 is a view illustrating luminance characteristics in a modified private mode in the display 160, in which the first type pixels 160a, the second type pixels 160b, and the fourth type pixels 160e described in FIG. 15A are disposed. The modified general mode illustrates luminance characteristics for angles between a perpendicular direction that faces the front surface of the display 160 and the lateral direction when the first type pixels 160 and the second type pixels 160b are turned on and the fourth type pixels 160e are turned off. As illustrated, it may be seen that curve 1605 illustrates improved luminance characteristics between 0 degrees and 65 degrees as compared with curve 1601 whereas relatively low luminance characteristics as compared with curve 1603. As described above, the display 160 including the first type pixels 160a, the second type pixels 160b, and the fourth type pixels 160e described in FIG. 15A may set a mode of relatively excellent luminance characteristics if necessary or according to setting of the user as in the general mode, the private mode, and the modified general mode or set a mode that uses a relatively narrow viewing angle, through control of various pixels. The above-described display 160 of the disclosure may support improvement of a life span, improvement of lateral luminance, an increase of visibility, and compensation of luminance and life span in the private mode.

Figure 17:
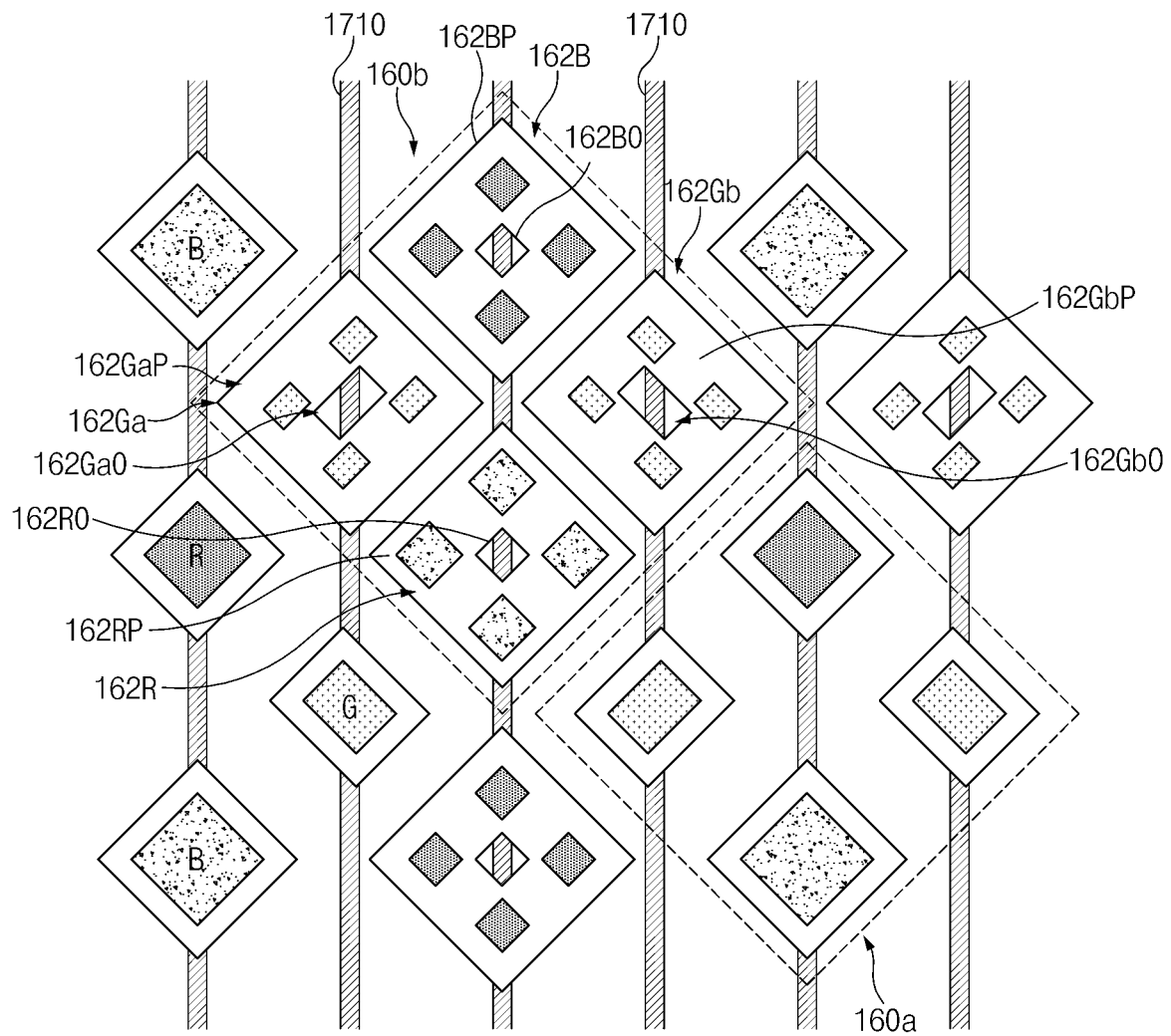
FIG. 17 is a view illustrating an example of a pixel structure of a display related to a parasite capacitance according to an embodiment of the disclosure.

FIG. 17 is a view illustrating an example of the pixel structure of the display related to a parasitic capacitance according to an embodiment of the disclosure.

Referring to FIG. 17, the display 160, as described above with reference to FIG. 2A, may include the first type pixels 160a and the second type pixels 160b. The anode electrodes disposed in the pixels in the display 160 may overlap the signal lines 1710 (e.g., data lines) related to driving of the pixels in the upward/downward direction. Accordingly, an unintended parasite capacitance may be caused between the signal lines and the electrodes (e.g., the anodes) disposed in the pixels. An opening may be formed at least a portion of the electrode included in the second type pixel 160b to reduce the above-described parasite capacitance. The second type blue sub pixels 162B of the second type pixel 160b may correspond to the first type blue sub pixels 161B of the first type pixel 160a in an aspect of implementation of the screen.

The second type blue sub pixels 162B may include four micro pixels, and the second type blue sub pixels 162B may be the same as areas of the first type blue sub pixels 161B or larger than that by a specific size. In consideration of areas of the shield members between the four micro pixels, the second type blue sub pixel electrode 162BP for emitting light in the pixel structure of the second type blue sub pixel 162B may have an area that is larger than a size of the electrode of the first type blue sub pixel 161B.

A first opening 162BO may be formed on one side of the second type blue sub pixel electrode 162BP to reduce an area that overlaps the signal lines 1710. The first opening 162BO, for example, may be filled with an insulation material that is used in a process of manufacturing the display 160. A second opening 162RO also may be formed on one side of the second type red sub pixel electrode 162RP. The second opening 162RO, for example, may be filled with an insulation material that is used in a process of manufacturing the display 160. A third opening 162GaO and a fourth opening 162GbO may be formed on one side of the second type green sub pixel electrodes 162GaP and 162GbP. The third opening 162GaO and the fourth opening 162GbO, for example, may be filled with an insulation material that is used in a process of manufacturing the display 160. The first opening 162BO, the second opening 162RO, the third opening 162GaO, and the fourth opening 162GbO may be formed in an area that does not overlap the light emitting area of the corresponding sub pixel. Although it is illustrated that the first opening 162BO and the second opening 162RO have a first shape and the third opening 162GaO and the fourth opening 162GbO have a second shape that is different from the first shape, the disclosure is not limited thereto. The first to fourth openings may have the same shape or may have different shapes. The structure, in which the openings are formed in the above-described pixel electrodes also may be applied to the above-described other pixel structures, for example, the third type pixels 160d and the fourth type pixels 160e in the same or similar manner. For example, the openings may be formed in at least some spaces between the micro pixels, and may include a section, in which signal lines overlap each other, at least a portion thereof.

Figure 18:
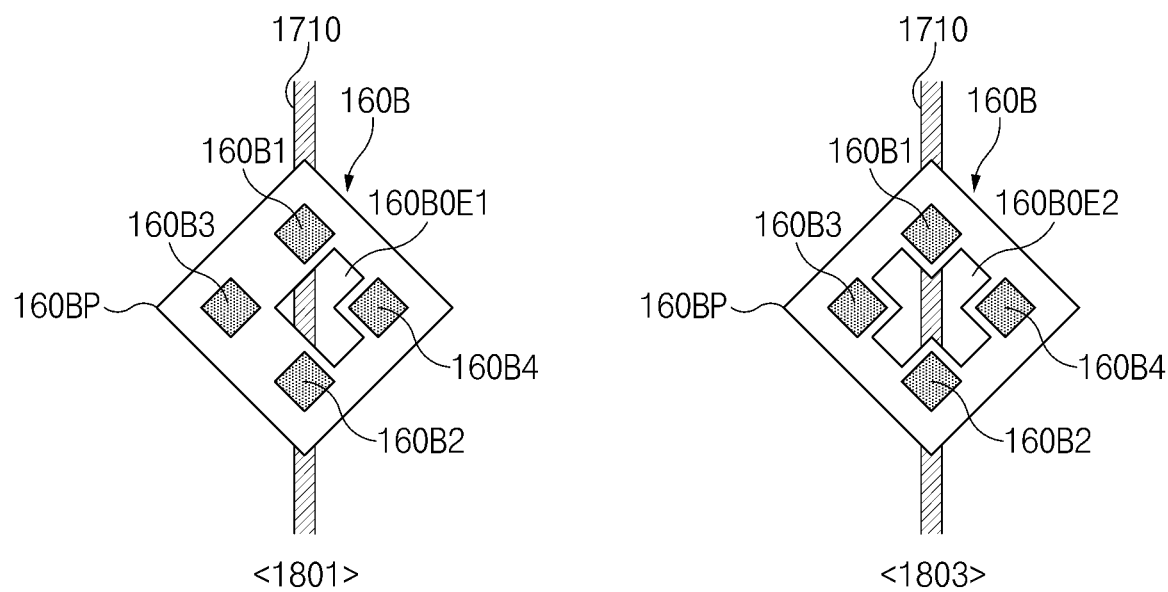
FIG. 18 is a view illustrating an example of a pixel structure of a display related to a parasite capacitance according to an embodiment of the disclosure.

FIG. 18 is a view illustrating an example of the pixel structure of the display related to a parasite capacitance according to an embodiment of the disclosure.

Referring to FIG. 18, as shown in 1801, the second type blue sub pixels 162B may include fourth blue micro pixels 162B1, 162B2, 162B3, and 162B4, and the second type blue sub pixels 162B may include the second type blue sub pixel electrodes 162BP related to driving of the blue micro pixels 162B1, 162B2, 162B3, and 162B4. At least some of the signal lines 1710 (e.g., data lines), as described above, may be disposed under the second type blue sub pixel electrodes 162BP. A fifth opening 162BOE1 may be formed inside the second type blue sub pixel electrode 162BP. The fifth opening 162BOE1, for example, may include at least a partial area between the first blue micro pixel 162B1 and the fourth blue micro pixel 162B4, at least a partial area between the second blue micro pixel 162B2 and the fourth blue micro pixel 162B4, and at least a partial area between the first blue micro pixel 162B1 and the second blue micro pixel 162B2. An insulation material may be filled in the fifth opening 162BOE1. In 1801, it is illustrated that the signal lines 1710 overlap each other at a central area of the pixel electrode 160B, but the signal lines 1710 at least partially overlap the pixel electrode (e.g., the anode electrode) in the vertical direction but may be disposed to deviate from a center of the pixel electrode.

As shown in 1803, the second type blue sub pixels 162B may include a sixth opening 162BOE2 inside the second type blue sub pixel electrode 162BP. The sixth opening 162BOE2 may include at least a partial area that does not overlap the four blue micro pixels 162B1, 162B2, 162B3, and 162B4. The second opening 162BOE2 may include at least a partial area between the first blue micro pixel 162B1 and the fourth blue micro pixel 162B4, at least a partial area between the second blue micro pixel 162B2 and the fourth blue micro pixel 162B4, at least a partial area between the first blue micro pixel 162B1 and the second blue micro pixel 162B2, at least a partial area between the first blue micro pixel 162B1 and the third blue micro pixel 162B3, at least a partial area between the second blue micro pixel 162B2 and the third blue micro pixel 162B3, and at least a partial area between the third blue micro pixel 162B3 and the fourth blue micro pixel 162B4. For example, the sixth opening 62BOE2 may have a cross shape. An insulation material may be filled in the sixth opening 162BOE2. The sixth opening 162BOE2 may be filled with a PDL. The above-described structures of the fifth opening 162BOE1 and the sixth opening 162BOE2 may be applied to other sub pixels (e.g., at least one of the second type red sub pixels and the second type green sub pixels) of the second type pixels 160b described. Furthermore, the structures of the fifth opening 162BOE1 and the sixth opening 162BOE2 may be applied to at least one sub pixel included in the fourth type pixel 160e in the same or similar manner. The display 160 of the disclosure may reduce an influence of parasite capacitances and reduce cross-talks accordingly as the above-described openings are applied.

FIGS. 19A to 19M exemplify pen tile structures according to various dispositions of a first type sub pixel and a second type sub pixel according to various embodiments of the disclosure.

Figure 19A:
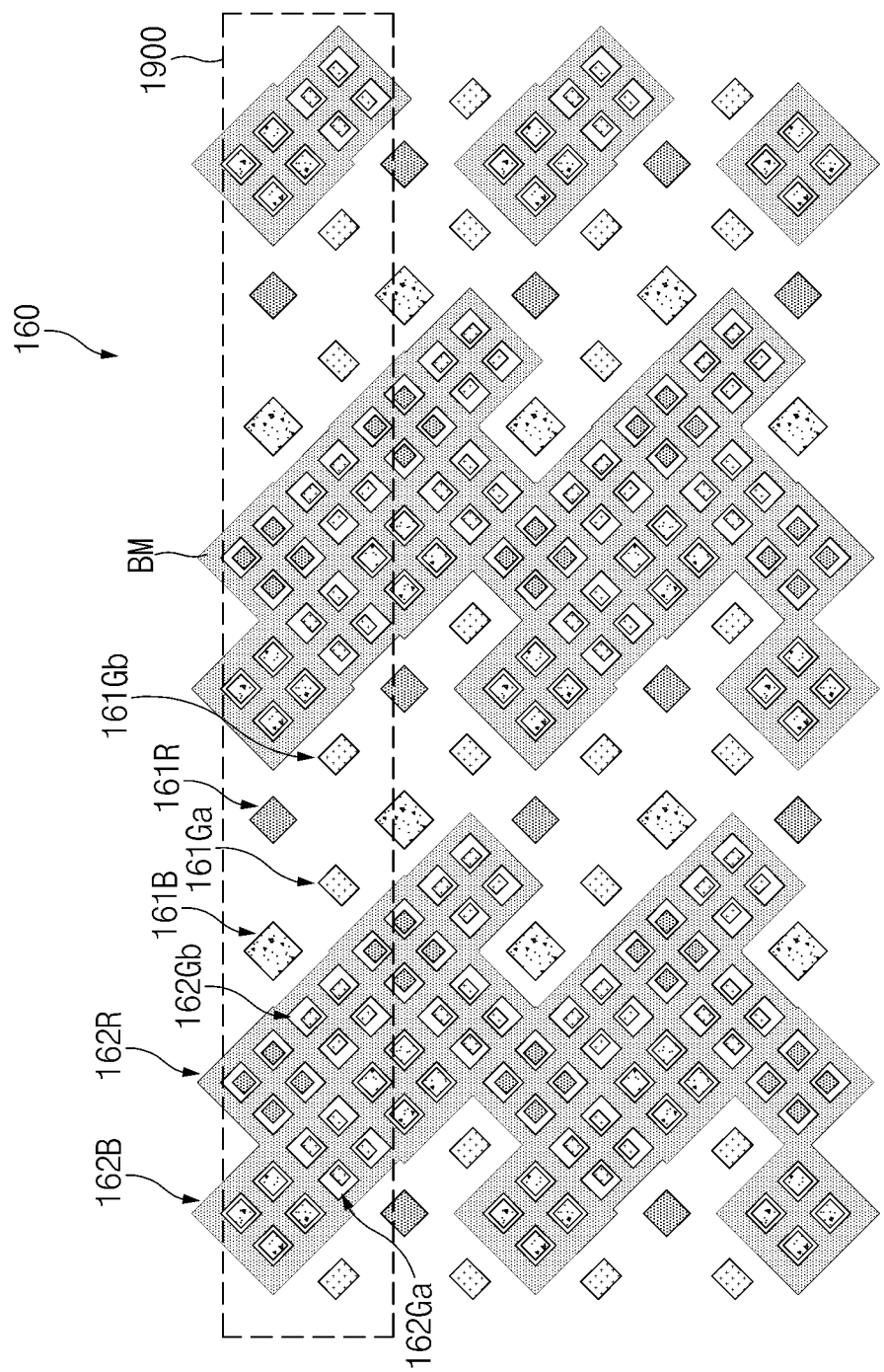

Referring to FIG. 19A, in the sub pixels disposed in the display 160, with respect to a transverse axis 1900 (e.g., a gate line or a scan line disposition area), the second type blue sub pixels 162B, the second type red sub pixels 162R, the first type blue sub pixels 161B, and the first type red sub pixels 161R may be disposed repeatedly, and in parallel, the second type green sub pixels 162Ga and the first type green sub pixels 161Ga and 161Gb may be disposed repeatedly. At least some of the shield members BM may be disposed to surround the second type sub pixels, and may be disposed between the micro pixels that constitute the second type sub pixels.

Figure 19B:
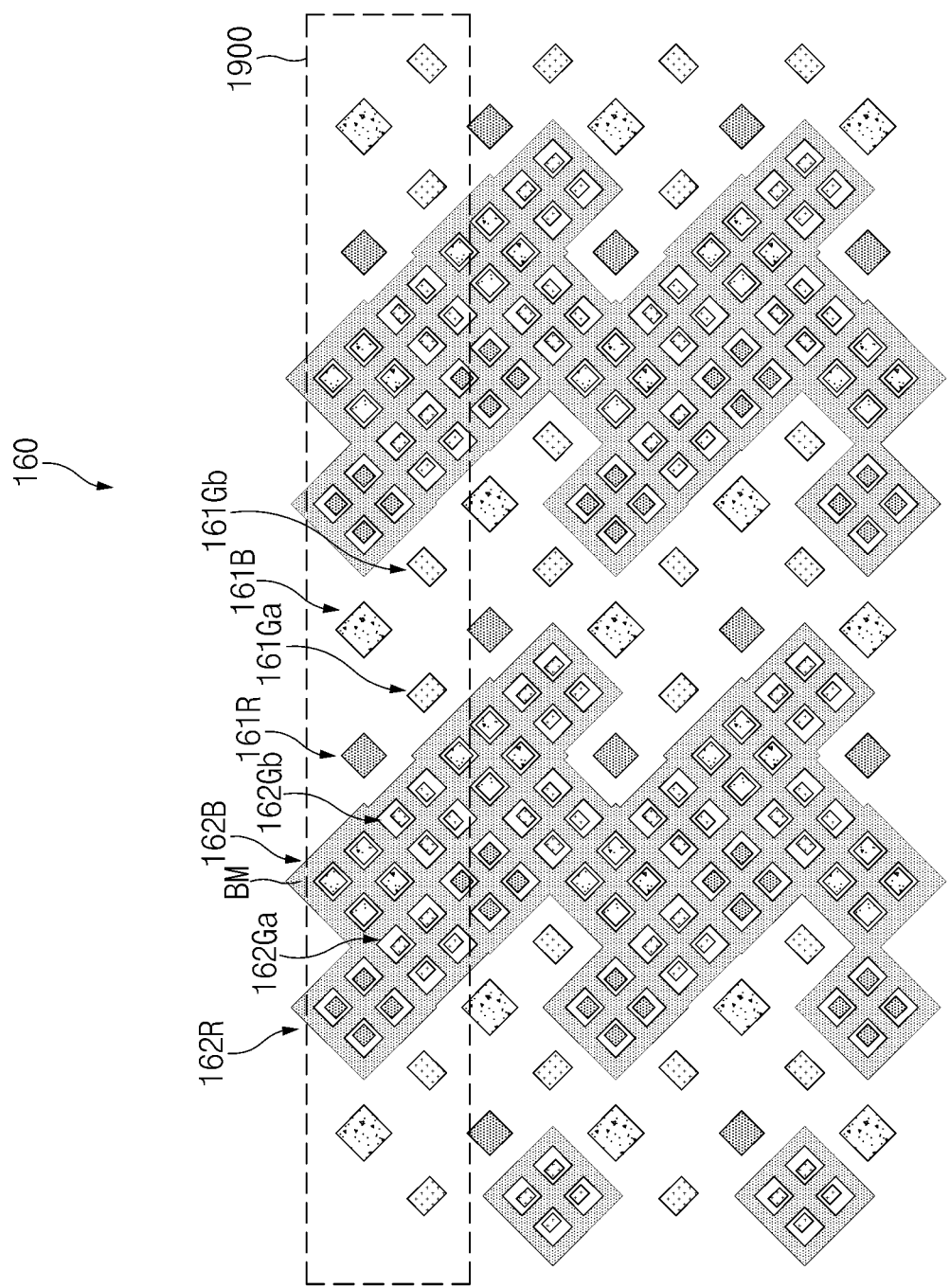

Referring to FIG. 19B, in the sub pixels disposed in the display 160, with respect to the transverse axis 1900 (e.g., the gate line or the scan line disposition area), the second type red sub pixels 162R, the second type blue sub pixels 162B, the first type red sub pixels 161R, and the first type blue sub pixels 161B may be disposed repeatedly, and in parallel, the first type green sub pixels 161Ga and 161Gb and the second type green sub pixels 162Ga and 162Gb may be disposed repeatedly. At least some of the shield members BM may be disposed to surround the second type sub pixels, and may be disposed between the micro pixels that constitute the second type sub pixels.

Figure 19C:
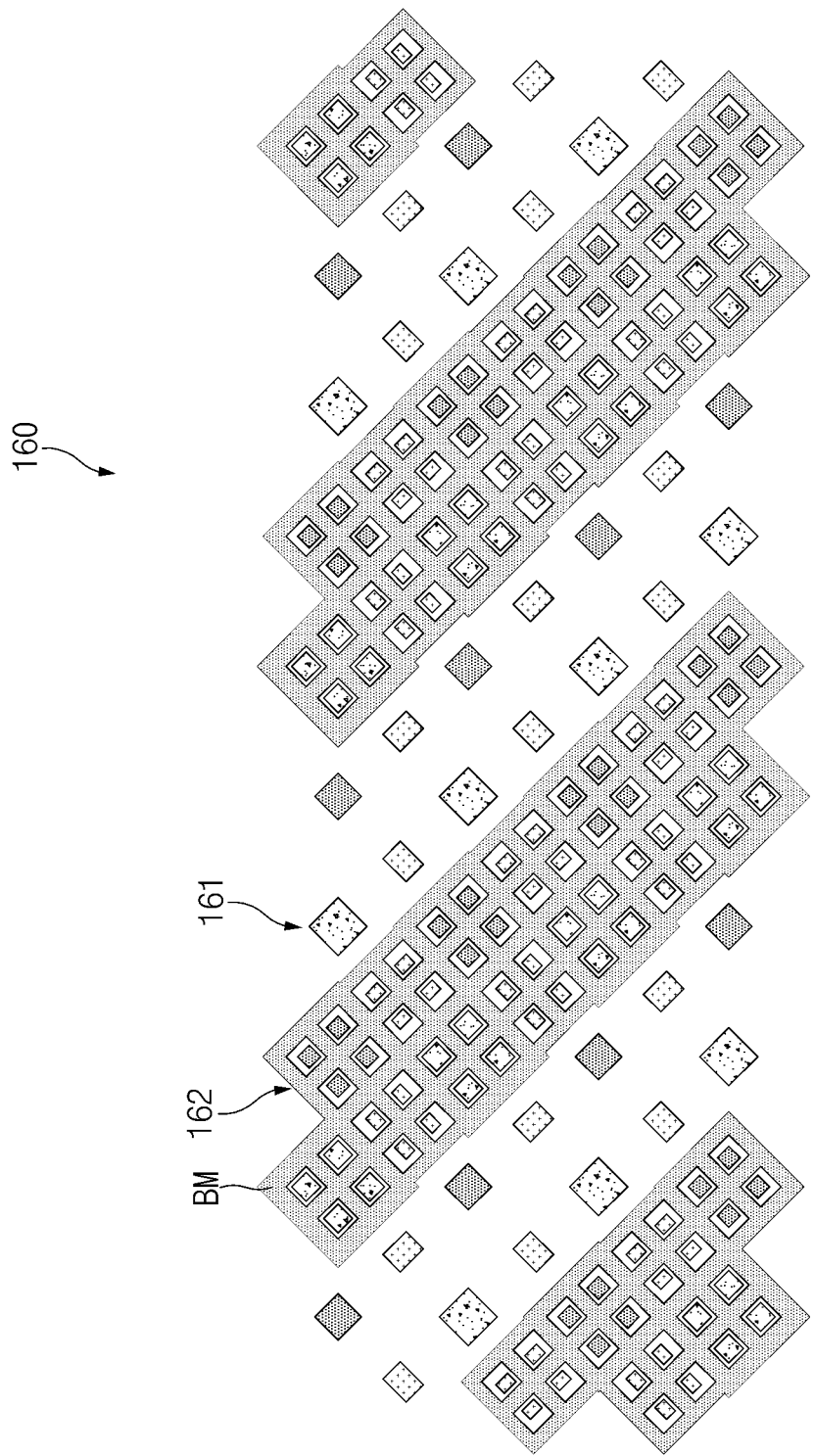

Referring to FIG. 19C, at least a portion of the display 160, the second type sub pixels 162, in which the shield members BM are disposed, and the first type sub pixels 161, in which no shield member is present, are disposed repeatedly, and the sub pixels for the types may be disposed while having a specific directionality in a right diagonal direction with respect to the illustrated drawings.

Figure 19D:
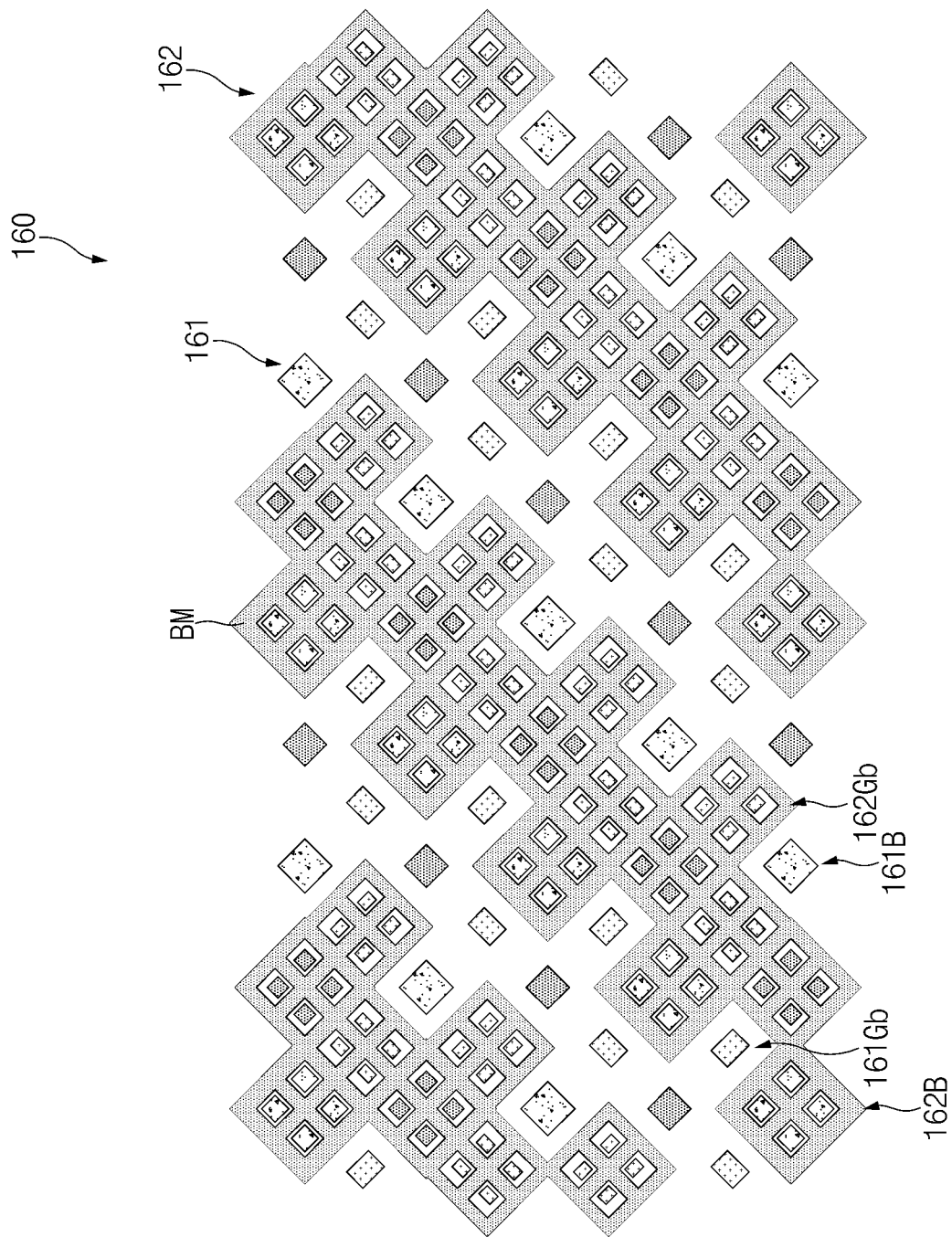

Referring to FIG. 19D, at least a portion of the display 160, the second type sub pixels 162, in which the shield members BM are disposed, and the first type sub pixels 161, in which no shield member is present, are disposed repeatedly, and the sub pixels for the types may be disposed while having a specific directionality in a left diagonal direction with respect to the illustrated drawings. The sub pixels for the types having directionalities in the left diagonal direction may be disposed in zigzags with other type sub pixels. For example, the first type green sub pixels 161B and the second type green sub pixels 162Gb may be alternately disposed in the left diagonal direction. Furthermore, the second type blue sub pixels 162B and the first type green sub pixels 162Gb may be alternately disposed in the left diagonal direction.

Figure 19E:
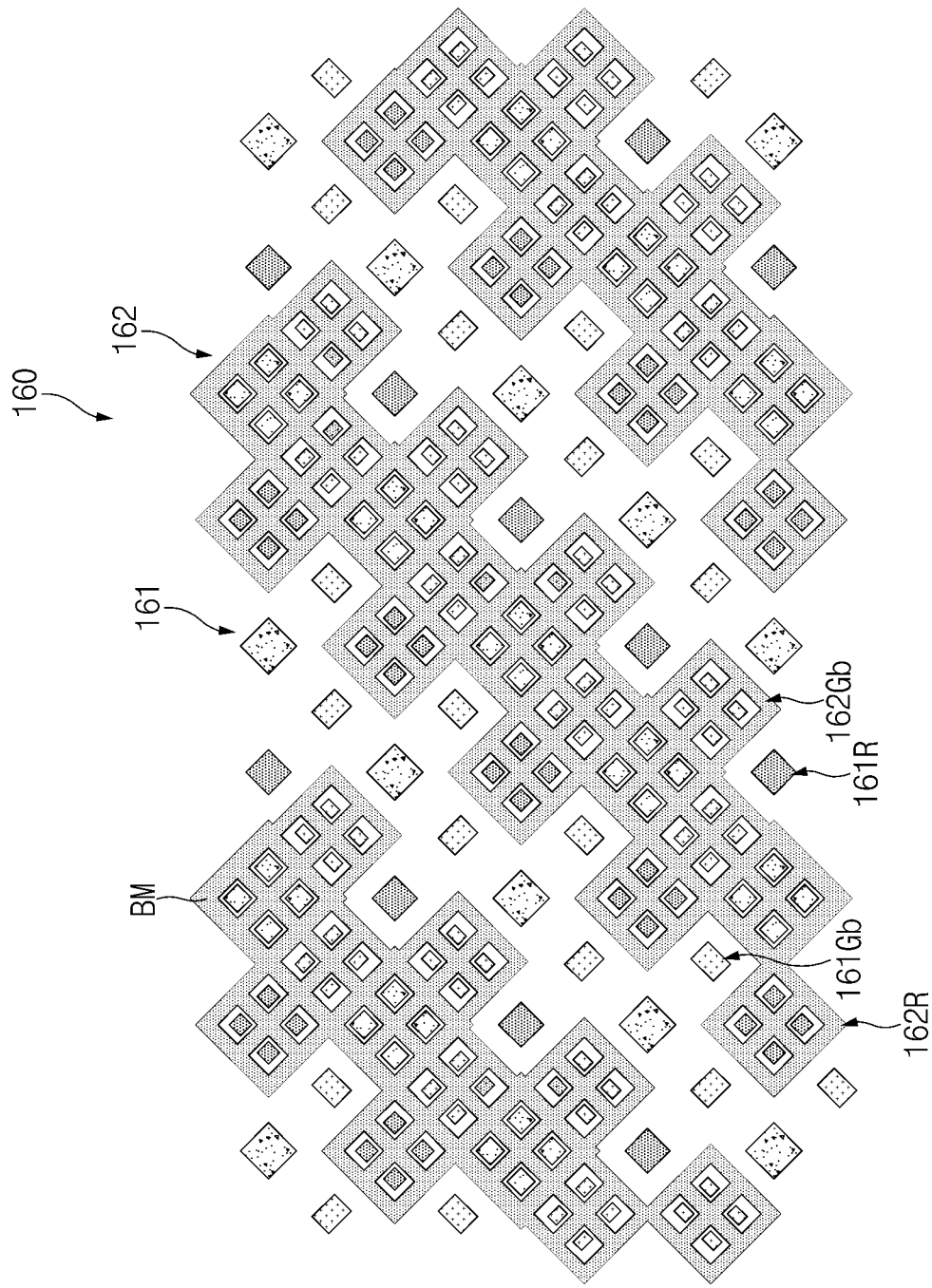

Referring to FIG. 19E, at least a portion of the display 160, the second type sub pixels 162, in which the shield members BM are disposed, and the first type sub pixels 161, in which no shield member is present, are disposed repeatedly, and the sub pixels for the types may be disposed while having a specific directionality in a left diagonal direction with respect to the illustrated drawings. The sub pixels for the types having directionalities in the left diagonal direction may be disposed in zigzags with other type sub pixels. For example, the first type red sub pixels 161R and the second type green sub pixels 162Gb may be alternately disposed in the left diagonal direction. Furthermore, the second type red sub pixels 162R and the first type green sub pixels 161Gb may be alternately disposed in the left diagonal direction.

Figure 19F:
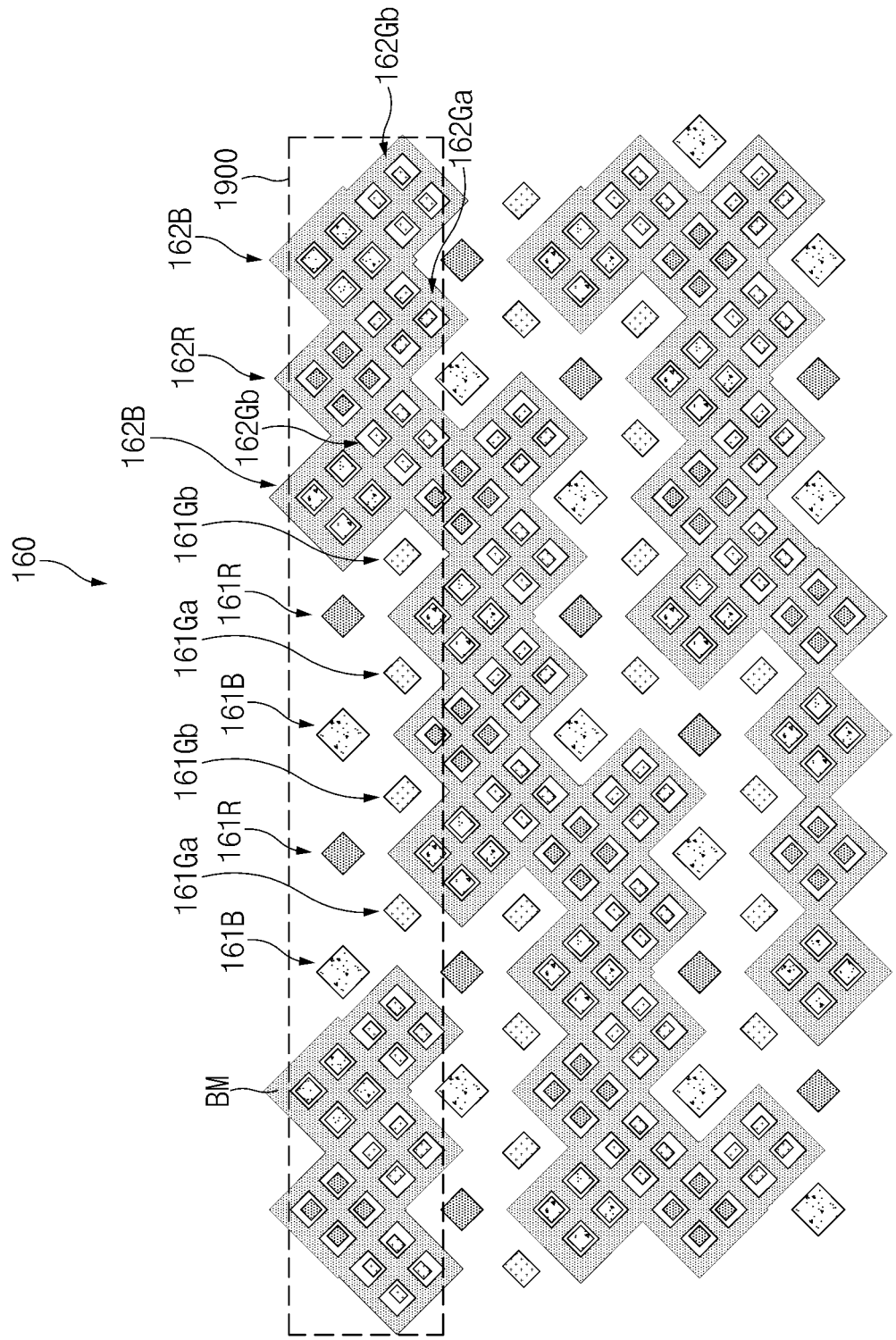

Referring to FIG. 19F, at least a portion of the display 160 may include a pixel disposition structure, in which with respect to the transverse axis 190 (or the gate line or the scan line disposition area), the first type green sub pixels 161B, the first type red sub pixels 161R, the first type blue sub pixels 161B, the first type red sub pixels 161R, the second type blue sub pixels 162B, the second type sub pixels 162R, and the second type blue sub pixels 162B are repeatedly disposed in a sequence thereof, and under that, the first type first green sub pixels 161Ga, the first type second green sub pixels 161Gb, the first type first green sub pixels 161Ga, the first type second green sub pixels 161Gb, the second type second green sub pixels 162Gb, the second type first green sub pixels 162Ga, and the second type second green sub pixels 162Gb are repeatedly disposed in a sequence thereof.

Figure 19G:
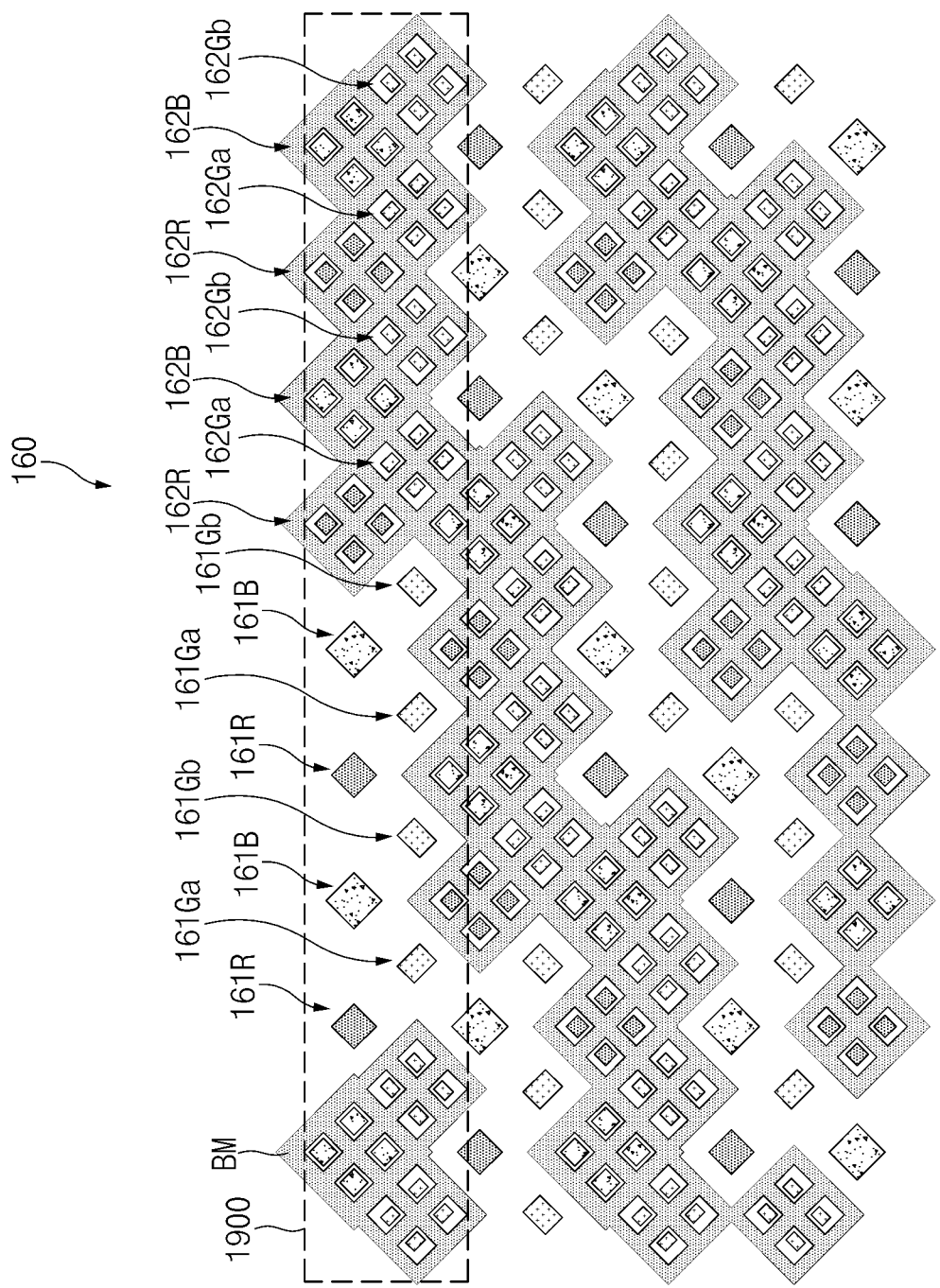

Referring to FIG. 19G, at least a portion of the display 160 may include a pixel disposition structure, in which with respect to the transverse axis 190 (or the gate line or the scan line disposition area), the first type red sub pixels 161R, the first type blue sub pixels 161B, the first type red sub pixels 161R, the first type blue sub pixels 161B, the first type red sub pixels 162R, the second type blue sub pixels 162B, the second type red sub pixels 162R, and the second type blue sub pixels 162B are repeatedly disposed in a sequence thereof, and under that, the first type first green sub pixels 161Ga, the first type second green sub pixels 161Gb, the first type first green sub pixels 161Ga, the first type second green sub pixels 161Gb, the second type first green sub pixels 162Ga, the second type second green sub pixels 162Gb, the second type first green sub pixels 162Ga, and the second type second green sub pixels 162Gb are repeatedly disposed in a sequence thereof.

Referring to FIG. 19H, at least a portion of the display 160 may include a pixel disposition structure, in which with respect to the transverse axis 190 (or the gate line or the scan line disposition area), the second type blue sub pixels 162B, the second type red sub pixels 162R, the second type blue sub pixels 162B, the second type red sub pixels 162R, the first type blue sub pixels 161B, the first type red sub pixels 161R, the first type blue sub pixels 161B, and the first type red sub pixels 161R are repeatedly disposed in a sequence thereof, and under that, the second type first green sub pixels 162Ga, the second type second green sub pixels 162Gb, the second type first green sub pixels 162Ga, the second type second green sub pixels 162Gb, the first type first green sub pixels 161Ga, the first type second green sub pixels 161Gb, the first type first green sub pixels 161Ga, and the first type second green sub pixels 161Gb are repeatedly disposed in a sequence thereof.

Figure 19I:
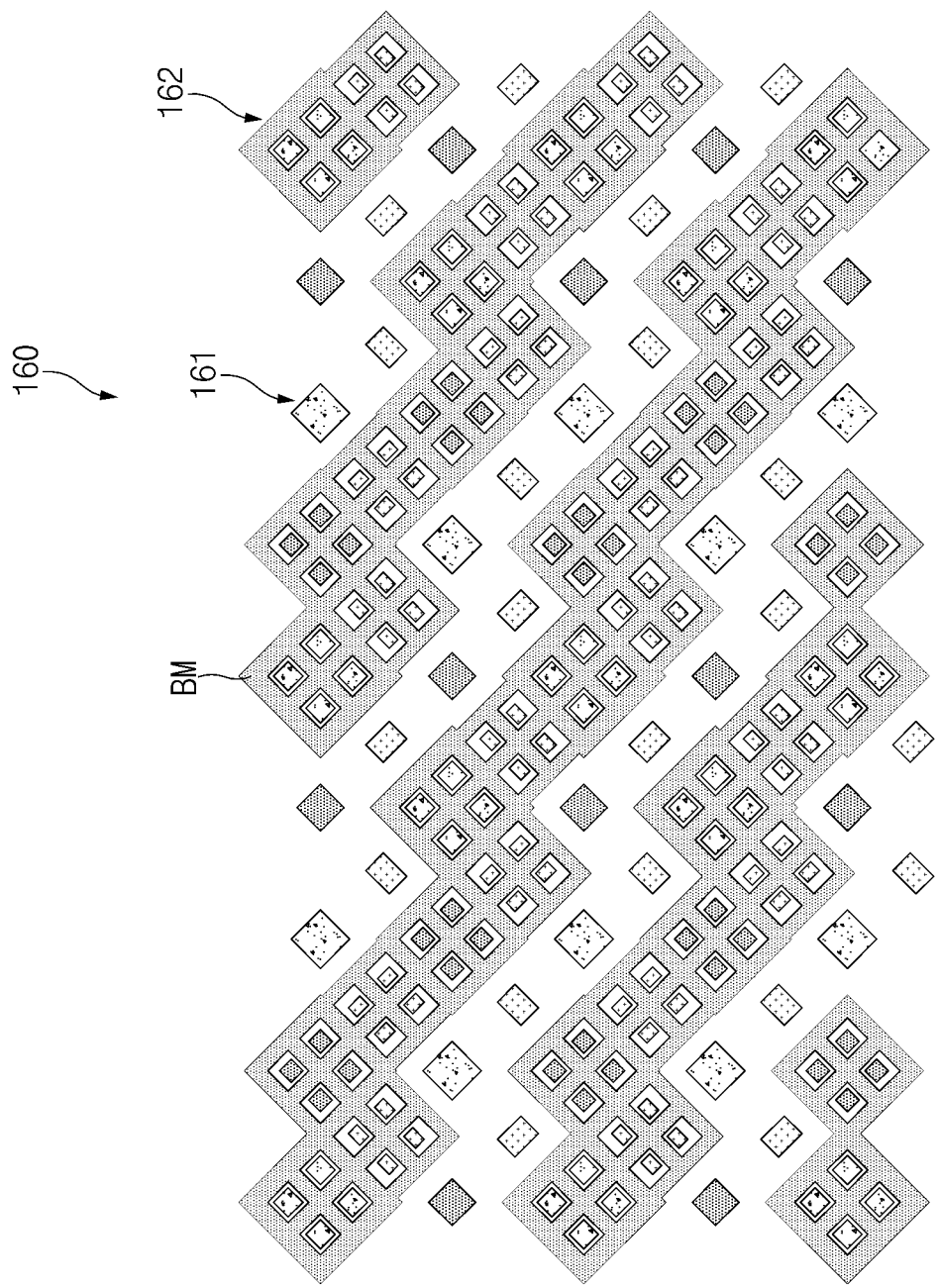

Referring to FIG. 19I, in at least a portion of the display 160, the second type sub pixels 162, in which the shield members BM are disposed, and the first type sub pixels 161, in which no shield member is present, are disposed repeatedly with respect to the transverse axis by two, and the sub pixels for the types may be disposed while having a specific directionality in a right diagonal direction in a stepped manner with respect to the illustrated drawings.

Figure 19J:
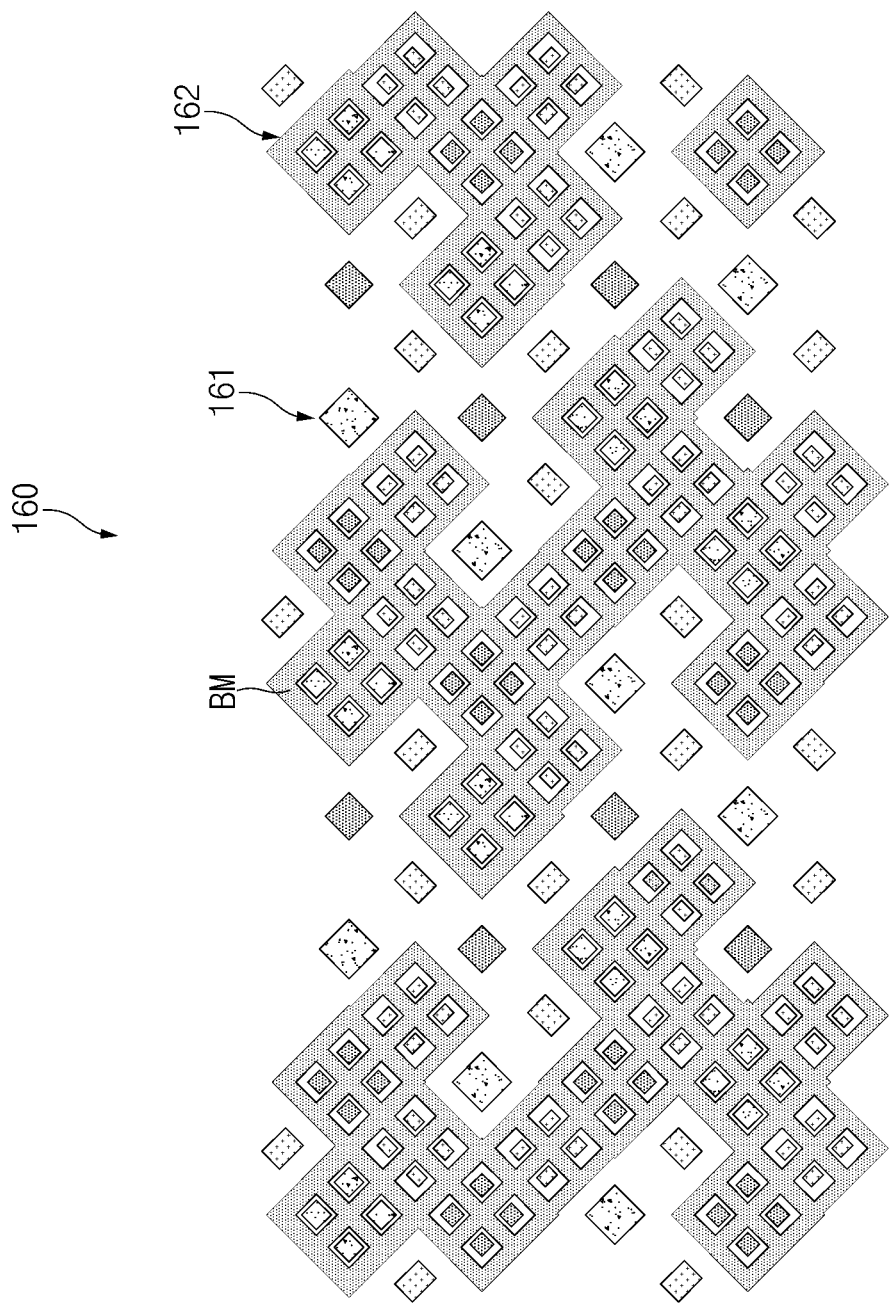

Referring to FIG. 19J, in at least a portion of the display 160, the second type sub pixels 162, in which the shield members BM are disposed, and the first type sub pixels 161, in which no shield member is present, are disposed repeatedly with respect to the transverse axis by two, and the sub pixels for the types may be disposed while having the same disposition shape in a right diagonal direction with respect to the illustrated drawings.

Figure 19K:
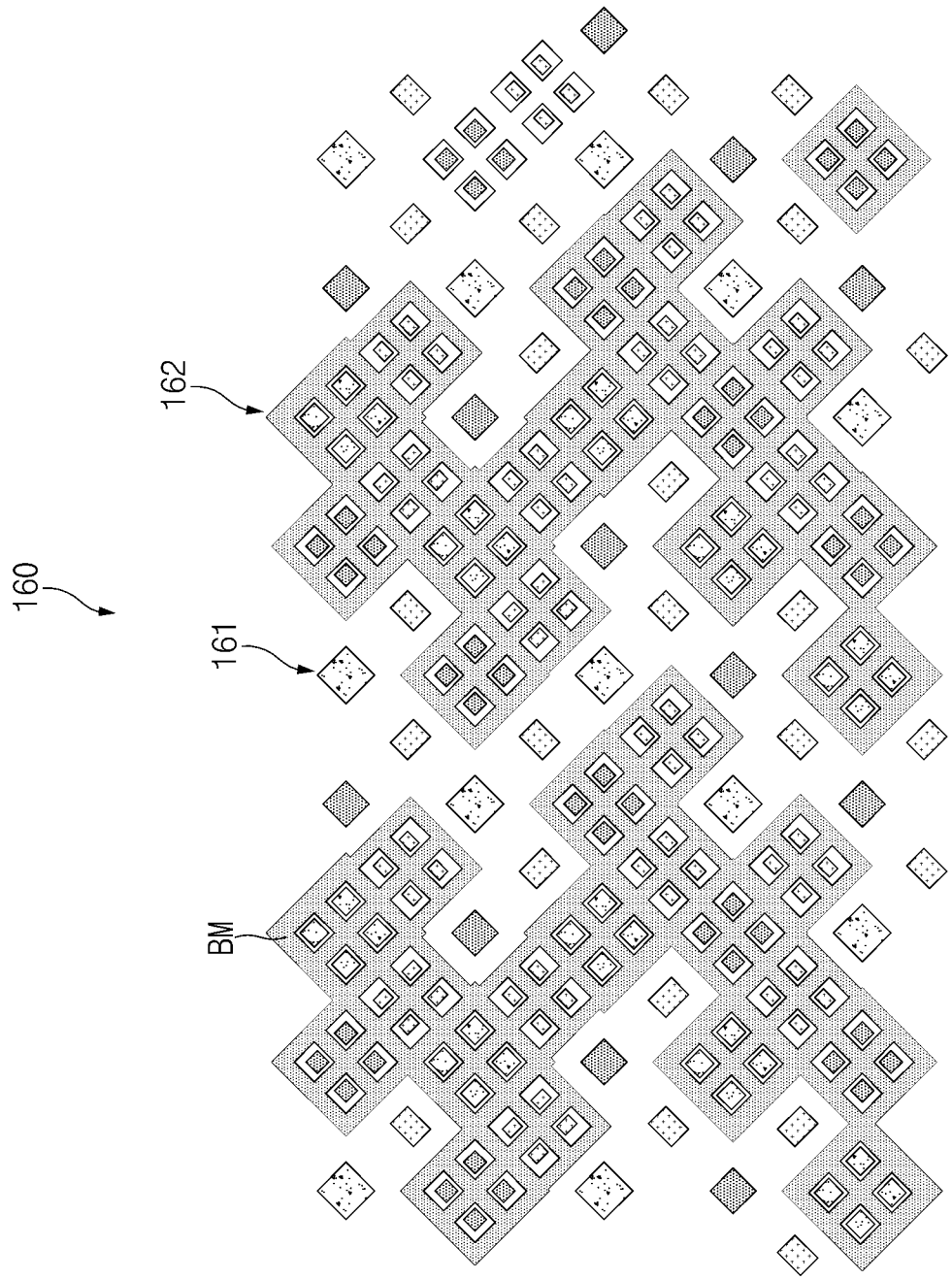

Referring to FIG. 19K, in at least a portion of the display 160, the second type sub pixels 162, in which the shield members BM are disposed, and the first type sub pixels 161, in which no shield member is present, are disposed repeatedly with respect to the transverse axis by two, and the sub pixels for the types may be disposed while having the same disposition shape in a perpendicular direction in zigzags with respect to the illustrated drawings.

Figure 19L:
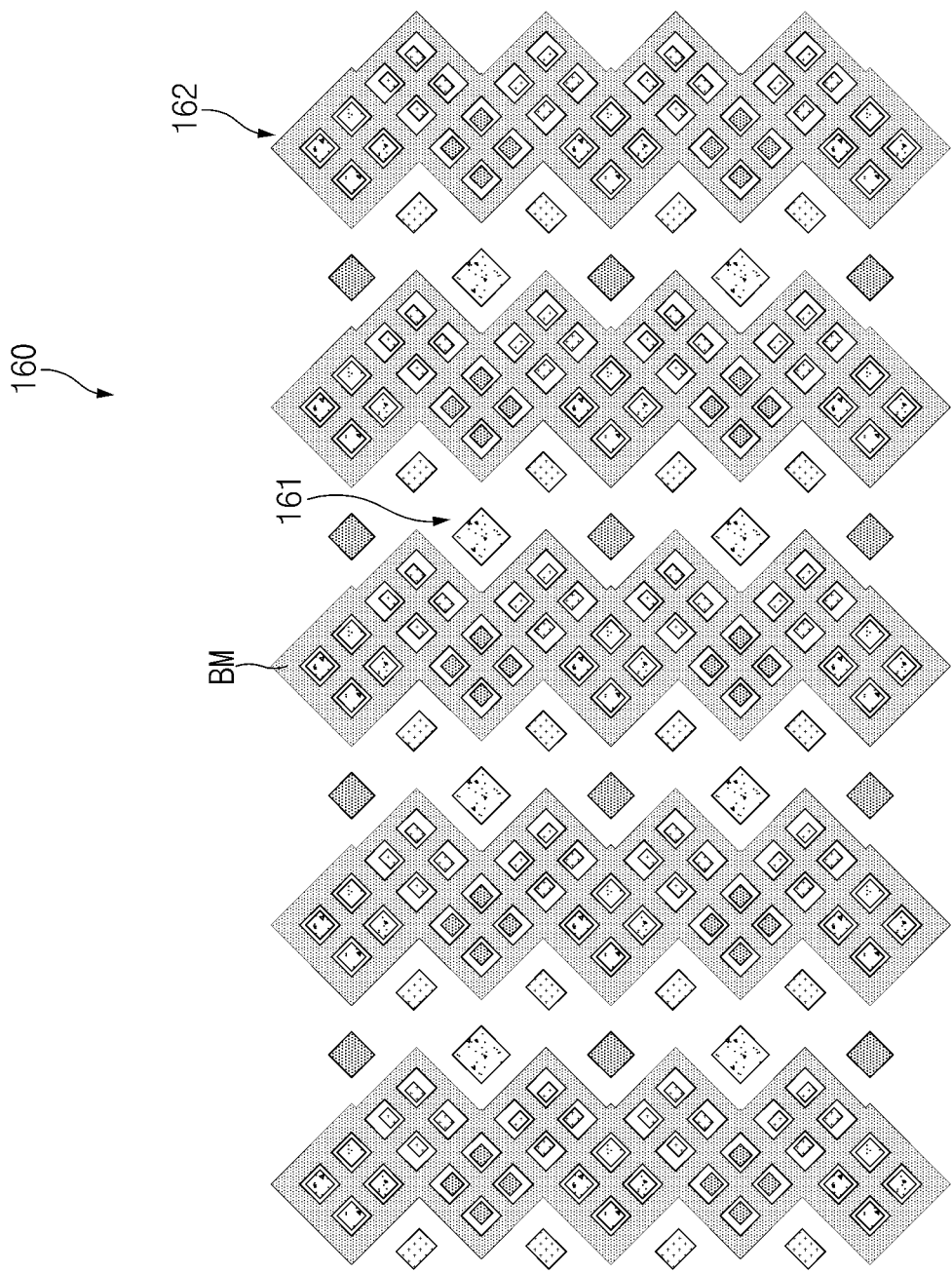

Referring to FIG. 19L, in at least a portion of the display 160, the second type sub pixels 162, in which the shield members BM are disposed, and the first type sub pixels 161, in which no shield member is present, are disposed repeatedly with respect to the transverse axis by one, and the sub pixels for the types may be disposed while having a wave pattern in a perpendicular direction with respect to the illustrated drawings.

Figure 19M:
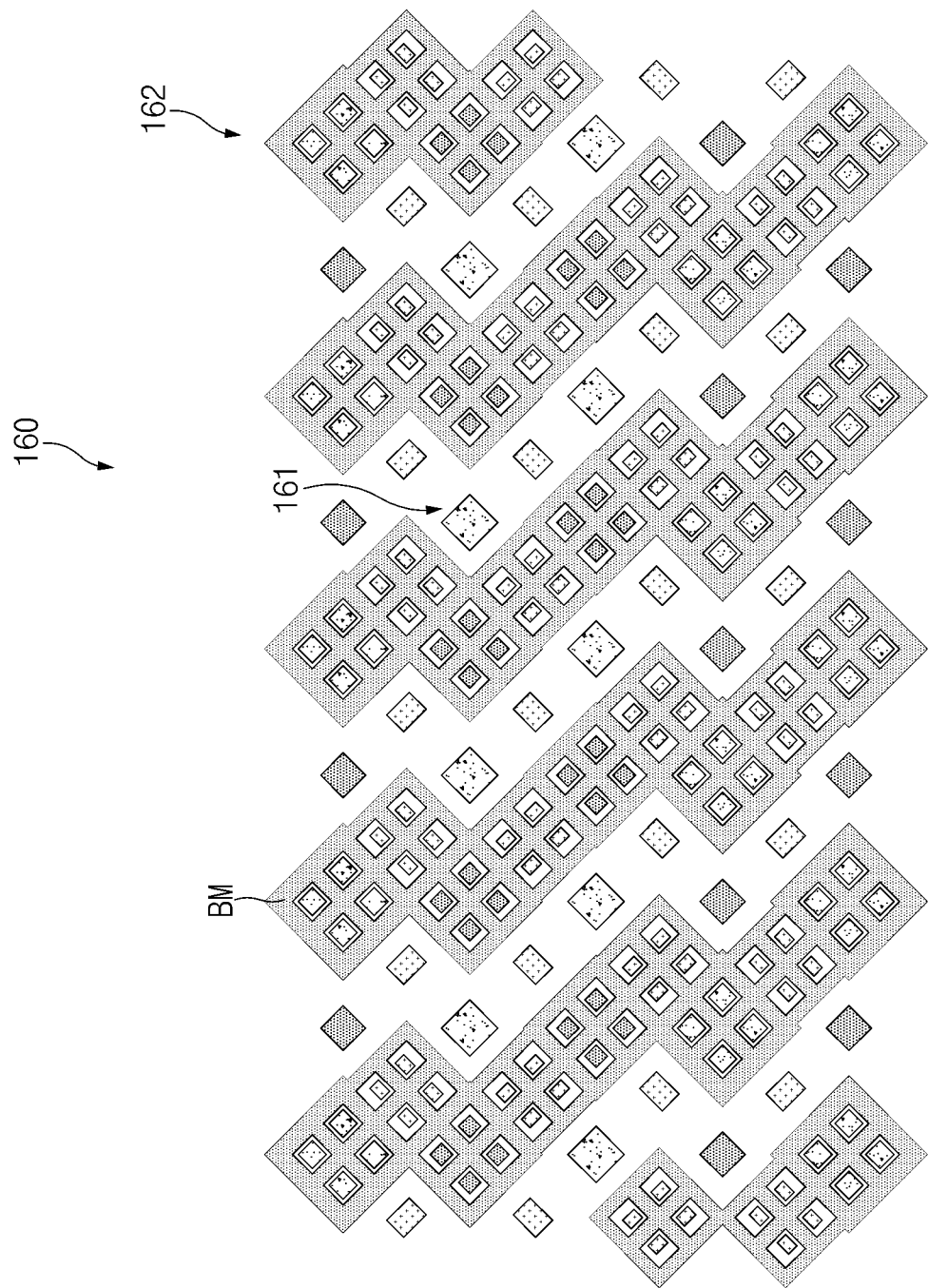

Referring to FIG. 19M, in at least a portion of the display 160, the second type sub pixels 162, in which the shield members BM are disposed, and the first type sub pixels 161, in which no shield member is present, are disposed repeatedly with respect to the transverse axis by one, and the sub pixels for the types may be disposed while having a wave pattern in a right diagonal direction with respect to the illustrated drawings.

Figure 20:
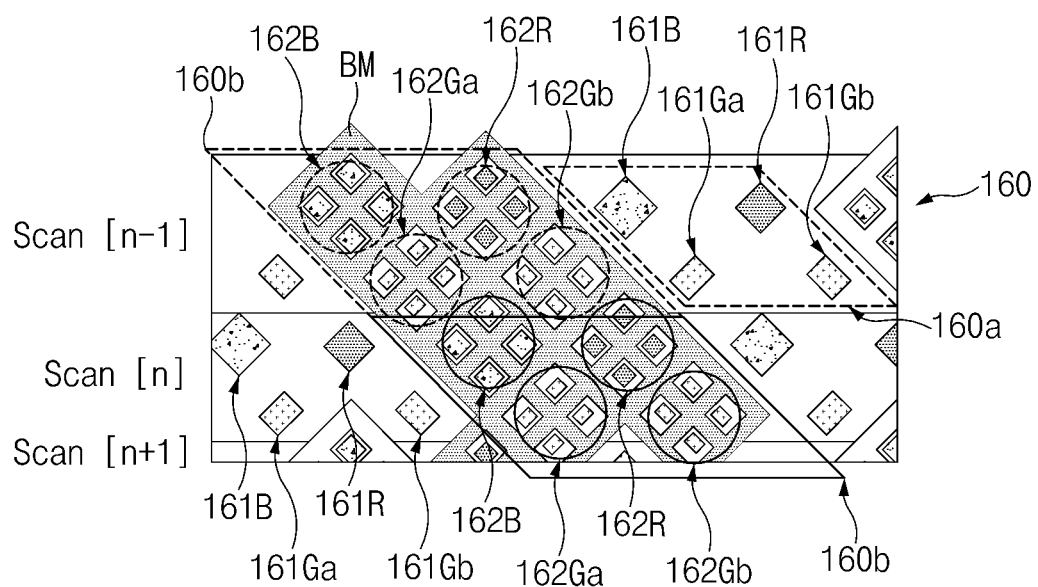
FIG. 20 is a view illustrating an example of a scan line and a pixel disposition form of a display according to an embodiment of the disclosure.

FIG. 20 is a view illustrating an example of a scan line and a pixel disposition form of a display according to an embodiment of the disclosure.

Referring to FIG. 20, the display 160 may be operated such that a plurality of sub pixels are disposed for colors in one scan line (or one gate line). For example, a first scan line Scan(n−1) may supply scan signals to the pixels, in which the second type pixels 160b including the second type blue sub pixels 162B, the second type red sub pixels 162R, the second type first green sub pixels 162Ga, and the second type second green sub pixels 162Ga, and the first type pixels 160a including the first type blue sub pixels 161B, the first type red sub pixels 161R, the first type first green sub pixels 161Ga, and the first type second green sub pixels 161Gb are repeatedly disposed.

The second scan line Scan(n) may supply scan signals to the pixels, in which the first type pixels 160a including the first type blue sub pixels 161B, the first type red sub pixels 161R, the first type first green sub pixels 161Ga, and the first type second green sub pixels 161Gb, and the second type pixels 160b including the second type blue sub pixels 162B, the second type red sub pixels 162R, the second type first green sub pixels 162Ga, and the second type second green sub pixels 162Gb are repeatedly disposed. As described above, pixels (e.g., 160a and 160b) of different types, in which one scan line is disposed, may receive the same scan signal.

In addition to the above-described disposition of the sub pixels disclosed in FIGS. 19A to 19M, the display of the electronic device according to various embodiments may include various forms of dispositions of sub pixels, in which the second type blue sub pixels 162B, the second type red sub pixels 162R, and the second type green sub pixels 162Ga and 162Gb corresponding to one pixel are controlled by the same scan line.

The above display 160 described in FIGS. 19A to 20 may be configured such that the pixels of different types disposed for the transverse axes (or the scan lines or the gate lines) are operated based on the same scan signal. In the display 160, because R-G or B-G pixels are disposed repeatedly for different types in a pen tile structure, in which the pixels are repeatedly disposed according to a specific rule, a color shifting phenomenon is alleviated, and the display 160 may be driven in a simpler scheme.

An electronic device according to various embodiments of the disclosure may include devices of various forms. The electronic devices, for example, may include a portable communication device (e.g., a smart phone), a computer device, a portable multimedia device, a portable medical device, a camera, a wearable device, or a home appliance. An electronic device according to various embodiments of the disclosure is not limited to the above-mentioned devices.

Various embodiments of the disclosure and the terms used herein do not limit the technical features described in the disclosure to specific embodiments, and should be construed to include various modifications, equivalents, or replacements of the embodiments. With regard to the description of the drawings, similar reference numerals may be used to refer to similar or related components. It is to be understood that a singular form of a noun corresponding to an item may include one or more of the things, unless the relevant context clearly indicates otherwise. In the disclosure, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. Such terms as "1st" and "2nd" or "first" and "second" may be used to simply distinguish a corresponding component from another, and does not limit the components in other aspects (e.g., an importance or an order). Such terms as "1st" and "2nd" or "first" and "second" may be used to simply distinguish a corresponding component from another, and does not limit the components in other aspects (e.g., an importance or an order).

The term "module" used in various embodiments of the disclosure may include a unit configured in hardware, software, or firmware way, and for example, may be used interchangeably with the terms such as logic, a logic block, a component, or a circuit. The module may be an integral part, or a minimum unit or a portion which performs one or more functions. For example, according to an embodiment, the module may be implemented in a form of an application-specific integrated circuit (ASIC).

Various embodiments of the disclosure may be implemented by software (e.g., a program 1440) including one or more instructions stored in a storage medium (e.g., an internal memory 1436 or an external memory 1438) that may be read by the electronic device 1401. For example, the processor (e.g., the processor 1402) of the device (e.g., the electronic device 1401) may call at least one of one or more instructions stored in the storage medium, and may execute it. This allows at least one function to be performed according to the called at least one instruction. The one or more instructions may include a code that is made by a compiler or a code that may be executed by an interpreter. The storage medium that may be read by a device may be provided in a form of a non-transitory storage medium. Here, the 'non-transitory storage medium' means that the storage medium is a tangible device and does not include a signal (e.g., an electromagnetic wave), and with regard to the term, a case, in which data are semi-permanently stored in the storage medium, and a case, in which data are temporarily stored in the storage medium, are not distinguished.

The methods according to various embodiments of the disclosure may be included in a computer program product. The computer program product may be traded between a seller and a purchaser. The computer program product may be distributed in a form of a storage medium that may be read by a device (e.g., a compact disk read only memory (CD-ROM) or may be distributed (e.g., downloaded or uploaded) through an application store (e.g., Play Store™) or directly or online between two user devices (e.g., smartphones). In the online distribution, at least a portion of the computer program product may be at least temporarily stored in a storage medium, such as a server of a manufacturer, a server of an application store, or a memory of a relay server, which may be read by a device, or temporarily generated.

According to various embodiments, components (e.g., modules or programs) of the above-described components may include one or a plurality of entities, and some of the plurality of entities may be disposed to be separated from the other components. According to various embodiments, among the above-described components, one or more components or operations may be omitted or one or more other components or operations may be added. Alternatively or additionally, the plurality of components (e.g., modules or programs) may be integrated into one component. In this case, the integrated components may perform one or more functions of the plurality of components in a way that is the same as or similar to that performed by the corresponding ones of the plurality of components before the integration. According to various embodiments, the operations performed by modules, programs, or other components may be executed sequentially, in parallel, repeatedly, or heuristically, one or more operations may be executed in another sequence or omitted, or one or more other operations may be added.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:
1. A display device including an organic light emitting display (OLED) panel, the display device comprising:

a pixel layer, in which OLED pixels corresponding to a plurality of pixels are disposed; and
an encapsulation layer configured to encapsulate the pixel layer with no air gap,
wherein the plurality of pixels includes sub pixels of three colors of red (R), green (G), and blue (B),
wherein the pixel layer includes a first pixel group and a second pixel group having a viewing angle that is smaller than a viewing angle of the first pixel group,
wherein a shield member disposed on at least one surface of the encapsulation layer forms a plurality of openings,
wherein at least one sub pixel included in the second pixel group is divided by at least two of the plurality of openings,
wherein the pixels of the first pixel group and the second pixel group are driven in a general mode, and
wherein the pixels of the second pixel group are driven in a narrow viewing angle mode whereby a screen is displayed at a narrow viewing angle that is narrower than that in the general mode.

2. The display device of claim 1, wherein the plurality of openings of the shield member has substantially the same width.

3. The display device of claim 1, wherein partial areas of the sub pixels of the second pixel group, which are covered by the shield member between two or more openings include an area, in which at least two of the sub pixels do not emit light due to disposition of a pixel definition member.

4. The display device of claim 3,
wherein the pixel definition member is aligned with the shield member, and
wherein a width of the pixel definition member is formed to be larger than a width of the shield member between the two or more openings whereby at least two of the sub pixels that do not emit light are included in the plurality of openings.

5. The display device of claim 4, further comprising:
at least one processor related to driving of the pixel layer,
wherein the at least one processor is configured to control such that the pixels of the first pixel group is turned off or is displayed with a color of a specific gradation value in the narrow viewing angle mode.

6. The display device of claim 5, wherein the processor is further configured to:
control to adjust the specific gradation value according to adjustment of brightness, or
set a shadow rate of the first pixel group in the narrow viewing angle mode to a shadow rate of the first pixel group in the general mode.

7. A display device comprising:
a display including a plurality of first type pixels and a plurality of second type pixels,
wherein each of the first type pixels includes a plurality of first type sub pixels observable at a first viewing angle,
wherein each of the second type pixels includes a plurality of second type sub pixels observable at a second viewing angle that is narrower than the first viewing angle,
wherein an area of the first type pixel and an area of the second type pixel are alternately disposed,
wherein the first type sub pixels include:
first pixel definition members surrounding at least portions of peripheries of the first type sub pixels, and
wherein the second type sub pixels include:
second pixel definition members dividing areas of the second type sub pixels into a plurality of light emitting areas.

8. The display device of claim 7, further comprising:
an encapsulation layer covering the plurality of light emitting areas; and
a light transmission protecting layer covering at least a portion of the encapsulation layer,
wherein a shield member is disposed between the encapsulation layer and the light transmission protecting layer, and
wherein the shield member includes:
a first shield member arranged in correspondence to the first pixel definition members of the first type sub pixels,
a second shield member arranged in correspondence to peripheries of the second type sub pixels, and
a third shield member arranged in correspondence to the second pixel definition members.

9. The display device of claim 8,
wherein a plurality of openings is formed by the second shield member and the third shield member.

10. The display device of claim 9,
wherein, among the light emitting areas observed through the plurality of openings, sizes of blue light emitting areas are larger than sizes of red light emitting areas,
wherein the sizes of the red light emitting areas are larger than sizes of green light emitting areas, and
wherein a sum of sizes of the light emitting areas observed through the plurality of openings is the same as or similar to sizes of light emitting areas for colors of the first type sub pixels.

11. The display device of claim 9,
wherein sizes of the second pixel definition members observed through the plurality of openings are different sizes for colors, and
wherein the sizes of the second pixel definition members observed through the openings corresponding to green light emitting areas from among the plurality of openings are larger than the sizes of the second pixel definition members observed through the openings corresponding to red light emitting areas from among the plurality of openings.

12. The display device of claim 7,
wherein the light emitting areas for colors are driven by one anode electrode, and
wherein the anode electrode includes an opening formed at least a partial area overlapping a signal line in an upward/downward direction.

13. The display device of claim 8, further comprising:
a third type sub pixel having an observation viewing angle that is narrower than that of the first type sub pixels and is wider than that of the second type sub pixels,
wherein a width of the shield member disposed around the third type sub pixels is smaller than a width of the shield member disposed around the second type sub pixels.

14. The display device of claim 7,
wherein a sum of sizes of the light emitting areas of the second type sub pixels for colors is larger than the sizes of the first type sub pixels for colors, and
wherein a number of the light emitting areas included in the second type sub pixels is two or four.

15. The display device of claim 7, further comprising at least one processor configured to drive the display device in one of a general mode and a narrow viewing angle mode.

16. The display device of claim 7, wherein at least two of the first type sub pixels have different sizes.

* * * * *